United States Patent [19]
Carlstedt

[11] Patent Number: 5,241,491
[45] Date of Patent: Aug. 31, 1993

[54] METHOD FOR PERFORMING ARITHMETIC, LOGICAL AND RELATED OPERATIONS AND A NUMERICAL ARITHMETIC UNIT

[75] Inventor: Lars C. Carlstedt, Partille, Sweden

[73] Assignee: Carlstedt Elektronik AB, Gothenburg, Sweden

[21] Appl. No.: 739,535

[22] Filed: Aug. 2, 1991

[30] Foreign Application Priority Data

Aug. 2, 1990 [SE] Sweden .............................. 9002558

[51] Int. Cl.$^5$ .............................................. G06F 7/38
[52] U.S. Cl. ................................................. 364/716
[58] Field of Search ...................... 364/716, 736, 748

[56] References Cited

U.S. PATENT DOCUMENTS

| | | |
|---|---|---|
| 4,502,118 | 2/1985 | Hagenmaier, Jr. et al. . |
| 4,503,511 | 3/1985 | Vandierendonck ................ 364/716 |
| 4,615,003 | 9/1986 | Logsdon et al. . |
| 4,734,848 | 3/1988 | Yamano et al. . |
| 4,785,393 | 11/1988 | Chu et al. ........................ 364/716 X |

FOREIGN PATENT DOCUMENTS 2227583 8/1990 United Kingdom .

*Primary Examiner*—Tan V. Mai
*Attorney, Agent, or Firm*—Young & Thompson

[57] ABSTRACT

A method and a device to perform arithmetic, arithmetical, logical and related operations on numerical value elements is characterized by providing an input list including the numerical value elements to be processes, and instruction information on a predetermined number of inputs/output buses. The operation on the numerical value elements on the input list is directly controlled and performed using the instruction information. Various computing circuits adapted to perform a specific operation on the numerical value representations are connected on the input buses, thereby providing the results of their computations in parallel. The calculation in the arithmetic logical unit is performed by rewriting the elements in the input list. The result is presented as an output list. The result is then recycled, if needed, to the input list until an eventual result is obtained, each cycle of a multi-cycle operation being influenced only by the output of the result of the next preceding cycle presented on the output bus. The output list then becomes, through this recycling operation, the input list to be further processed.

42 Claims, 13 Drawing Sheets

| ORDINARY BINARY REPR | DECIMAL REPR OF BIN REPR | | ssh | se seh | c ch | e | eh | e,eh | m, md | mh | val h |
|---|---|---|---|---|---|---|---|---|---|---|---|
| 0000000 | 0 | -> | 0 | 0,1 | 0,1 | 0, | 9 | 000,1001 | 0,000 | -2 | -1024 |
| 0000001 | 1 | -> | 0 | 0,1 | 0,1 | 0, | 9 | 000,1001 | 1,001 | -1.5 | -768 |
| 0000010 | 2 | -> | 0 | 0,1 | 0,1 | 1, | 8 | 001,1000 | 0,000 | -2 | -512 |
| 0000011 | 3 | -> | 0 | 0,1 | 0,1 | 1, | 8 | 001,1000 | 1,001 | -1.5 | -384 |
| 0000100 | 4 | -> | 0 | 0,1 | 0,1 | 2, | 7 | 010,0111 | 0,000 | -2 | -256 |
| 0000101 | 5 | -> | 0 | 0,1 | 0,1 | 2, | 7 | 010,0111 | 1,001 | -1.5 | -192 |
| 0000110 | 6 | -> | 0 | 0,1 | 0,1 | 3, | 6 | 011,0110 | 0,000 | -2 | -128 |
| 0000111 | 7 | -> | 0 | 0,1 | 0,1 | 3, | 6 | 011,0110 | 1,001 | -1.5 | -96 |
| 0001000 | 8 | -> | 0 | 0,1 | 0,1 | 4, | 5 | 100,0101 | 0,000 | -2 | -64 |
| 0001001 | 9 | -> | 0 | 0,1 | 0,1 | 4, | 5 | 100,0101 | 1,001 | -1.5 | -48 |
| 0001010 | 10 | -> | 0 | 0,1 | 0,1 | 5, | 4 | 101,0100 | 0,000 | -2 | -32 |
| 0001011 | 11 | -> | 0 | 0,1 | 0,1 | 5, | 4 | 101,0100 | 1,001 | -1.5 | -24 |
| 0001100 | 12 | -> | 0 | 0,1 | 0,1 | 6, | 3 | 110,0011 | 0,000 | -2 | -16 |
| 0001101 | 13 | -> | 0 | 0,1 | 0,1 | 6, | 3 | 110,0011 | 1,001 | -1.5 | -12 |
| 0001110 | 14 | -> | 0 | 0,1 | 0,1 | 7, | 2 | 111,0010 | 0,000 | -2 | -8 |
| 0001111 | 15 | -> | 0 | 0,1 | 0,1 | 7, | 2 | 111,0010 | 1,001 | -1.5 | -6 |
| 0010000 | 16 | -> | 0 | 0,1 | 1,0 | 0, | 1 | 000,0001 | 0,000 | -2 | -4 |
| 0010001 | 17 | -> | 0 | 0,1 | 1,0 | 0, | 1 | 000,0001 | 1,001 | -1.875 | -3.75 |
| 0010010 | 18 | -> | 0 | 0,1 | 1,0 | 0, | 1 | 000,0001 | 2,010 | -1.75 | -3.5 |
| 0010011 | 19 | -> | 0 | 0,1 | 1,0 | 0, | 1 | 000,0001 | 3,011 | -1.625 | -3.25 |
| 0010100 | 20 | -> | 0 | 0,1 | 1,0 | 0, | 1 | 000,0001 | 4,100 | -1.5 | -3 |
| 0010101 | 21 | -> | 0 | 0,1 | 1,0 | 0, | 1 | 000,0001 | 5,101 | -1.375 | -2.75 |
| 0010110 | 22 | -> | 0 | 0,1 | 1,0 | 0, | 1 | 000,0001 | 6,110 | -1.25 | -2.5 |
| 0010111 | 23 | -> | 0 | 0,1 | 1,0 | 0, | 1 | 000,0001 | 7,111 | -1.125 | -2.25 |
| 0011000 | 24 | -> | 0 | 0,1 | 1,0 | 1, | 0 | 001,0000 | 0,000 | -2 | -2 |
| 0011001 | 25 | -> | 0 | 0,1 | 1,0 | 1, | 0 | 001,0000 | 1,001 | -1.875 | -1.875 |
| 0011010 | 26 | -> | 0 | 0,1 | 1,0 | 1, | 0 | 001,0000 | 2,010 | -1.75 | -1.75 |
| 0011011 | 27 | -> | 0 | 0,1 | 1,0 | 1, | 0 | 001,0000 | 3,011 | -1.625 | -1.625 |
| 0011100 | 28 | -> | 0 | 0,1 | 1,0 | 1, | 0 | 001,0000 | 4,100 | -1.5 | -1.5 |
| 0011101 | 29 | -> | 0 | 0,1 | 1,0 | 1, | 0 | 001,0000 | 5,101 | -1.375 | -1.375 |
| 0011110 | 30 | -> | 0 | 0,1 | 1,0 | 1, | 0 | 001,0000 | 6,110 | -1.25 | -1.25 |
| 0011111 | 31 | -> | 0 | 0,1 | 1,0 | 1, | 0 | 001,0000 | 7,111 | -1.125 | -1.125 |
| 0100000 | 32 | -> | 0 | 1,0 | 0,0 | 0, | -1 | 000,0000 | 0,000 | -2 | -1 |
| 0100001 | 33 | -> | 0 | 1,0 | 0,0 | 0, | -1 | 000,0000 | 1,001 | -1.875 | -.9375 |
| 0100010 | 34 | -> | 0 | 1,0 | 0,0 | 0, | -1 | 000,0000 | 2,010 | -1.75 | -.875 |
| 0100011 | 35 | -> | 0 | 1,0 | 0,0 | 0, | -1 | 000,0000 | 3,011 | -1.625 | -.8125 |
| 0100100 | 36 | -> | 0 | 1,0 | 0,0 | 0, | -1 | 000,0000 | 4,100 | -1.5 | -.75 |
| 0100101 | 37 | -> | 0 | 1,0 | 0,0 | 0, | -1 | 000,0000 | 5,101 | -1.375 | -.6875 |
| 0100110 | 38 | -> | 0 | 1,0 | 0,0 | 0, | -1 | 000,0000 | 6,110 | -1.25 | -.625 |
| 0100111 | 39 | -> | 0 | 1,0 | 0,0 | 0, | -1 | 000,0000 | 7,111 | -1.125 | -.5625 |
| 0101000 | 40 | -> | 0 | 1,0 | 0,0 | 1, | -2 | 001,0000 | 0,000 | -2 | -.5 |
| 0101001 | 41 | -> | 0 | 1,0 | 0,0 | 1, | -2 | 001,0000 | 1,001 | -1.875 | -.46875 |
| 0101010 | 42 | -> | 0 | 1,0 | 0,0 | 1, | -2 | 001,0000 | 2,010 | -1.75 | -.4375 |
| 0101011 | 43 | -> | 0 | 1,0 | 0,0 | 1, | -2 | 001,0000 | 3,011 | -1.625 | -.40625 |
| 0101100 | 44 | -> | 0 | 1,0 | 0,0 | 1, | -2 | 001,0000 | 4,100 | -1.5 | -.375 |
| 0101101 | 45 | -> | 0 | 1,0 | 0,0 | 1, | -2 | 001,0000 | 5,101 | -1.375 | -.34375 |
| 0101110 | 46 | -> | 0 | 1,0 | 0,0 | 1, | -2 | 001,0000 | 6,110 | -1.25 | -.3125 |
| 0101111 | 47 | -> | 0 | 1,0 | 0,0 | 1, | -2 | 001,0000 | 7,111 | -1.125 | -.28125 |
| 0110000 | 48 | -> | 0 | 1,0 | 1,1 | 0, | -3 | 000,0000 | 0,000 | -2 | -.25 |
| 0110001 | 49 | -> | 0 | 1,0 | 1,1 | 0, | -3 | 000,0000 | 1,001 | -1.5 | -.1875 |
| 0110010 | 50 | -> | 0 | 1,0 | 1,1 | 1, | -4 | 001,0000 | 0,000 | -2 | -.125 |
| 0110011 | 51 | -> | 0 | 1,0 | 1,1 | 1, | -4 | 001,0000 | 1,001 | -1.5 | -0.09375 |
| 0110100 | 52 | -> | 0 | 1,0 | 1,1 | 2, | -5 | 010,0000 | 0,000 | -2 | -0.0625 |
| 0110101 | 53 | -> | 0 | 1,0 | 1,1 | 2, | -5 | 010,0000 | 1,001 | -1.5 | -0.046875 |
| 0110110 | 54 | -> | 0 | 1,0 | 1,1 | 3, | -6 | 011,0000 | 0,000 | -2 | -0.03125 |
| 0110111 | 55 | -> | 0 | 1,0 | 1,1 | 3, | -6 | 011,0000 | 1,001 | -1.5 | -0.0234375 |
| 0111000 | 56 | -> | 0 | 1,0 | 1,1 | 4, | -7 | 100,0000 | 0,000 | -2 | -0.015625 |
| 0111001 | 57 | -> | 0 | 1,0 | 1,1 | 4, | -7 | 100,0000 | 1,001 | -1.5 | -0.0117188 |
| 0111010 | 58 | -> | 0 | 1,0 | 1,1 | 5, | -8 | 101,0000 | 0,000 | -2 | -0.0078125 |
| 0111011 | 59 | -> | 0 | 1,0 | 1,1 | 5, | -8 | 101,0000 | 1,001 | -1.5 | -0.00585938 |
| 0111100 | 60 | -> | 0 | 1,0 | 1,1 | 6, | -9 | 110,0000 | 0,000 | -2 | -0.00390625 |
| 0111101 | 61 | -> | 0 | 1,0 | 1,1 | 6, | -9 | 110,0000 | 1,001 | -1.5 | -0.00292969 |
| 0111110 | 62 | -> | 0 | 1,0 | 1,1 | 7, | -10 | 111,0000 | 0,000 | -2 | -0.00195312 |
| 0111111 | 63 | -> | 0 | 1,0 | 1,1 | 7, | -10 | 111,0000 | 1,001 | -1.5 | -0.00146484 |

FIG. 5A

| BINARY REPR. | DECIMAL REPR OF BIN REPR | | s,sh | se seh | c ch | e | e, eh | m, md | mh | val h |
|---|---|---|---|---|---|---|---|---|---|---|
| 1000000 | 64 | -> | 1 | 0,0 | 0,1 | 0,-10 | 000,0000 | 0,000 | 1 | 0 |
| 1000001 | 65 | -> | 1 | 0,0 | 0,1 | 0,-10 | 000,0000 | 1,001 | 1.5 | 0.00146484 |
| 1000010 | 66 | -> | 1 | 0,0 | 0,1 | 1, -9 | 001,0000 | 0,000 | 1 | 0.00195312 |
| 1000011 | 67 | -> | 1 | 0,0 | 0,1 | 1, -9 | 001,0000 | 1,001 | 1.5 | 0.00292969 |
| 1000100 | 68 | -> | 1 | 0,0 | 0,1 | 2, -8 | 010,0000 | 0,000 | 1 | 0.00390625 |
| 1000101 | 69 | -> | 1 | 0,0 | 0,1 | 2, -8 | 010,0000 | 1,001 | 1.5 | 0.00585938 |
| 1000110 | 70 | -> | 1 | 0,0 | 0,1 | 3, -7 | 011,0000 | 0,000 | 1 | 0.0078125 |
| 1000111 | 71 | -> | 1 | 0,0 | 0,1 | 3, -7 | 011,0000 | 1,001 | 1.5 | 0.0117188 |
| 1001000 | 72 | -> | 1 | 0,0 | 0,1 | 4, -6 | 100,0000 | 0,000 | 1 | 0.015625 |
| 1001001 | 73 | -> | 1 | 0,0 | 0,1 | 4, -6 | 100,0000 | 1,001 | 1.5 | 0.0234375 |
| 1001010 | 74 | -> | 1 | 0,0 | 0,1 | 5, -5 | 101,0000 | 0,000 | 1 | 0.03125 |
| 1001011 | 75 | -> | 1 | 0,0 | 0,1 | 5, -5 | 101,0000 | 1,001 | 1.5 | 0.046875 |
| 1001100 | 76 | -> | 1 | 0,0 | 0,1 | 6, -4 | 110,0000 | 0,000 | 1 | 0.0625 |
| 1001101 | 77 | -> | 1 | 0,0 | 0,1 | 6, -4 | 110,0000 | 1,001 | 1.5 | 0.09375 |
| 1001110 | 78 | -> | 1 | 0,0 | 0,1 | 7, -3 | 111,0000 | 0,000 | 1 | .125 |
| 1001111 | 79 | -> | 1 | 0,0 | 0,1 | 7, -3 | 111,0000 | 1,001 | 1.5 | .1875 |
| 1010000 | 80 | -> | 1 | 0,0 | 1,0 | 0, -2 | 000,0000 | 0,000 | 1 | .25 |
| 1010001 | 81 | -> | 1 | 0,0 | 1,0 | 0, -2 | 000,0000 | 1,001 | 1,125 | .28125 |
| 1010010 | 82 | -> | 1 | 0,0 | 1,0 | 0, -2 | 000,0000 | 2,010 | 1.25 | .3125 |
| 1010011 | 83 | -> | 1 | 0,0 | 1,0 | 0, -2 | 000,0000 | 3,011 | 1.375 | .34375 |
| 1010100 | 84 | -> | 1 | 0,0 | 1,0 | 0, -2 | 000,0000 | 4,100 | 1.5 | .375 |
| 1010101 | 85 | -> | 1 | 0,0 | 1,0 | 0, -2 | 000,0000 | 5,101 | 1.625 | .40625 |
| 1010110 | 86 | -> | 1 | 0,0 | 1,0 | 0, -2 | 000,0000 | 6,110 | 1.75 | .4375 |
| 1010111 | 87 | -> | 1 | 0,0 | 1,0 | 0, -2 | 000,0000 | 7,111 | 1.875 | .46875 |
| 1011000 | 88 | -> | 1 | 0,0 | 1,0 | 1, -1 | 001,0000 | 0,000 | 1 | .5 |
| 1011001 | 89 | -> | 1 | 0,0 | 1,0 | 1, -1 | 001,0000 | 1,001 | 1.125 | .5625 |
| 1011010 | 90 | -> | 1 | 0,0 | 1,0 | 1, -1 | 001,0000 | 2,010 | 1.25 | .625 |
| 1011011 | 91 | -> | 1 | 0,0 | 1,0 | 1, -1 | 001,0000 | 3,011 | 1.375 | .6875 |
| 1011100 | 92 | -> | 1 | 0,0 | 1,0 | 1, -1 | 001,0000 | 4,100 | 1.5 | .75 |
| 1011101 | 93 | -> | 1 | 0,0 | 1,0 | 1, -1 | 001,0000 | 5,101 | 1.625 | .8125 |
| 1011110 | 94 | -> | 1 | 0,0 | 1,0 | 1, -1 | 001,0000 | 6,110 | 1.75 | .875 |
| 1011111 | 95 | -> | 1 | 0,0 | 1,0 | 1, -1 | 001,0000 | 7,111 | 1.875 | .9375 |
| 1100000 | 96 | -> | 1 | 1,1 | 0,0 | 0, 0 | 000,0000 | 0,000 | 1 | 1 |
| 1100001 | 97 | -> | 1 | 1,1 | 0,0 | 0, 0 | 000,0000 | 1,001 | 1.125 | 1.125 |
| 1100010 | 98 | -> | 1 | 1,1 | 0,0 | 0, 0 | 000,0000 | 2,010 | 1.25 | 1.25 |
| 1100011 | 99 | -> | 1 | 1,1 | 0,0 | 0, 0 | 000,0000 | 3,011 | 1.375 | 1.375 |
| 1100100 | 100 | -> | 1 | 1,1 | 0,0 | 0, 0 | 000,0000 | 4,100 | 1.5 | 1.5 |
| 1100101 | 101 | -> | 1 | 1,1 | 0,0 | 0, 0 | 000,0000 | 5,101 | 1.625 | 1.625 |
| 1100110 | 102 | -> | 1 | 1,1 | 0,0 | 0, 0 | 000,0000 | 6,110 | 1.75 | 1.75 |
| 1100111 | 103 | -> | 1 | 1,1 | 0,0 | 0, 0 | 000,0000 | 7,111 | 1.875 | 1.875 |
| 1101000 | 104 | -> | 1 | 1,1 | 0,0 | 1, 1 | 001,0001 | 0,000 | 1 | 2 |
| 1101001 | 105 | -> | 1 | 1,1 | 0,0 | 1, 1 | 001,0001 | 1,001 | 1.125 | 2.25 |
| 1101010 | 106 | -> | 1 | 1,1 | 0,0 | 1, 1 | 001,0001 | 2,010 | 1.25 | 2.5 |
| 1101011 | 107 | -> | 1 | 1,1 | 0,0 | 1, 1 | 001,0001 | 3,011 | 1.375 | 2.75 |
| 1101100 | 108 | -> | 1 | 1,1 | 0,0 | 1, 1 | 001,0001 | 4,100 | 1.5 | 3 |
| 1101101 | 109 | -> | 1 | 1,1 | 0,0 | 1, 1 | 001,0001 | 5,101 | 1.625 | 3.25 |
| 1101110 | 110 | -> | 1 | 1,1 | 0,0 | 1, 1 | 001,0001 | 6,110 | 1.75 | 3.5 |
| 1101111 | 111 | -> | 1 | 1,1 | 0,0 | 1, 1 | 001,0001 | 7,111 | 1.875 | 3.75 |
| 1110000 | 112 | -> | 1 | 1,1 | 1,1 | 0, 2 | 000,0010 | 0,000 | 1 | 4 |
| 1110001 | 113 | -> | 1 | 1,1 | 1,1 | 0, 2 | 000,0010 | 1,001 | 1.5 | 6 |
| 1110010 | 114 | -> | 1 | 1,1 | 1,1 | 1, 3 | 001,0011 | 0,000 | 1 | 8 |
| 1110011 | 115 | -> | 1 | 1,1 | 1,1 | 1, 3 | 001,0011 | 1,001 | 1.5 | 12 |
| 1110100 | 116 | -> | 1 | 1,1 | 1,1 | 2, 4 | 010,0100 | 0,000 | 1 | 16 |
| 1110101 | 117 | -> | 1 | 1,1 | 1,1 | 2, 4 | 010,0100 | 1,001 | 1.5 | 24 |
| 1110110 | 118 | -> | 1 | 1,1 | 1,1 | 3, 5 | 011,0101 | 0,000 | 1 | 32 |
| 1110111 | 119 | -> | 1 | 1,1 | 1,1 | 3, 5 | 011,0101 | 1,001 | 1.5 | 48 |
| 1111000 | 120 | -> | 1 | 1,1 | 1,1 | 4, 6 | 100,0110 | 0,000 | 1 | 64 |
| 1111001 | 121 | -> | 1 | 1,1 | 1,1 | 4, 6 | 100,0110 | 1,001 | 1.5 | 96 |
| 1111010 | 122 | -> | 1 | 1,1 | 1,1 | 5, 7 | 101,0111 | 0,000 | 1 | 128 |
| 1111011 | 123 | -> | 1 | 1,1 | 1,1 | 5, 7 | 101,0111 | 1,001 | 1.5 | 192 |
| 1111100 | 124 | -> | 1 | 1,1 | 1,1 | 6, 8 | 110,1000 | 0,000 | 1 | 256 |
| 1111101 | 125 | -> | 1 | 1,1 | 1,1 | 6, 8 | 110,1000 | 1,001 | 1.5 | 384 |
| 1111110 | 126 | -> | 1 | 1,1 | 1,1 | 7, 9 | 111,1001 | 0,000 | 1 | 512 |
| 1111111 | 127 | -> | 1 | 1,1 | 1,1 | 7, 9 | 111,1001 | 1,001 | 1.5 | 768 |

FIG. 5B

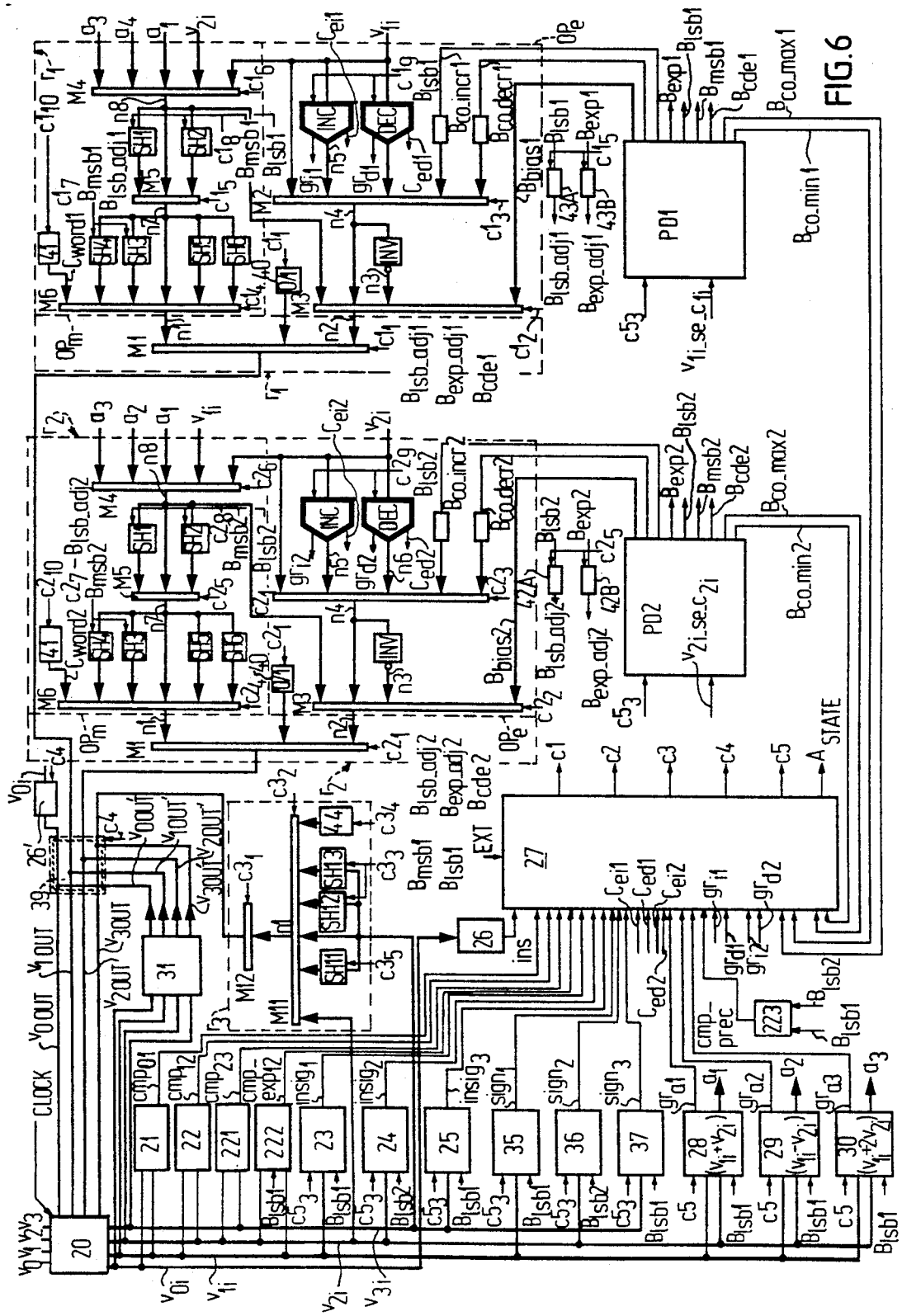

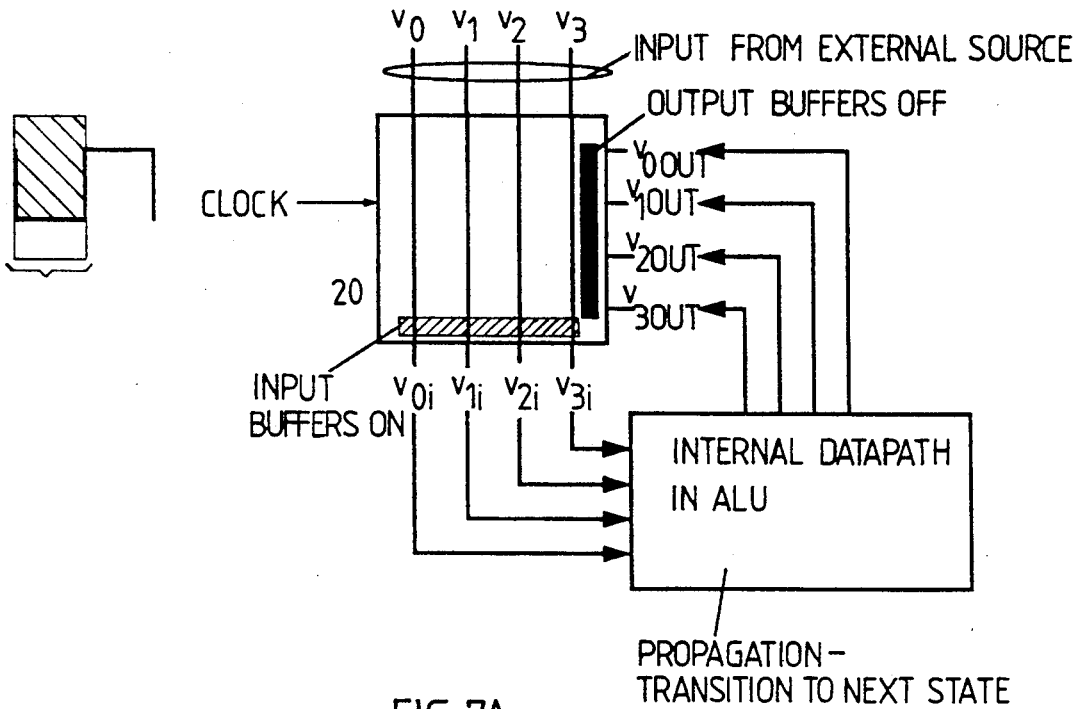
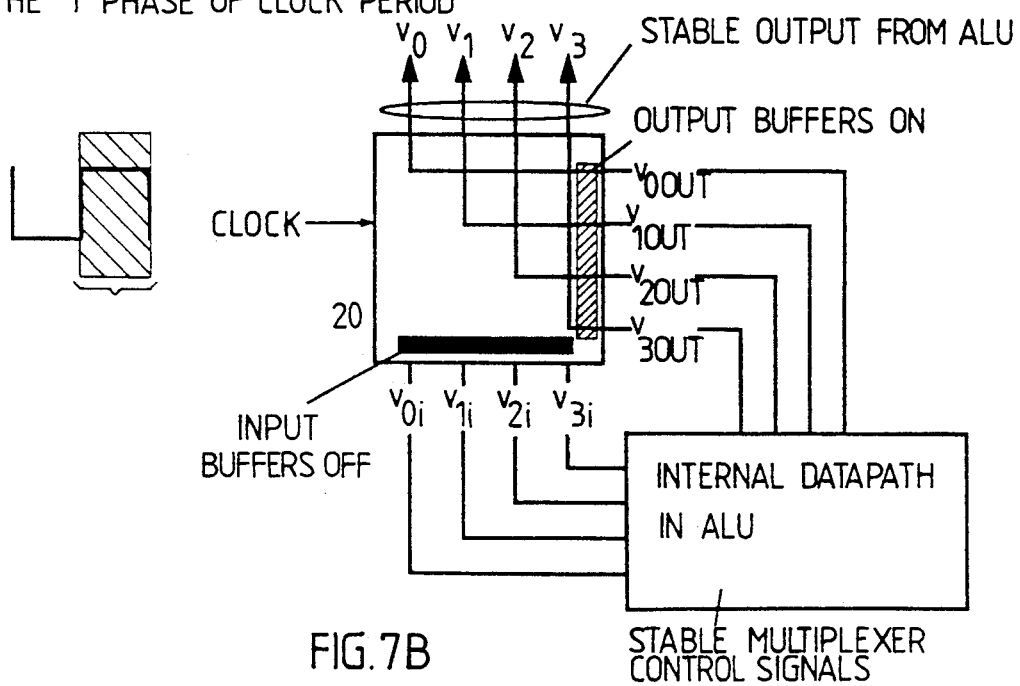

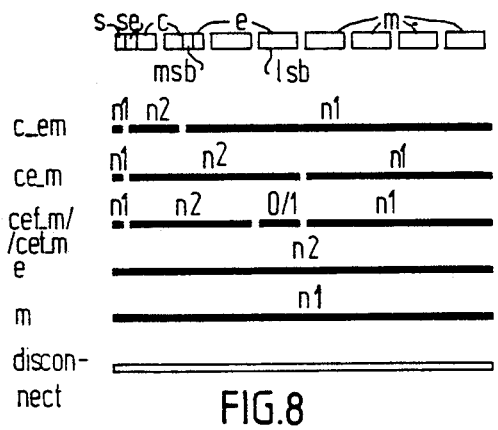
FIG.8
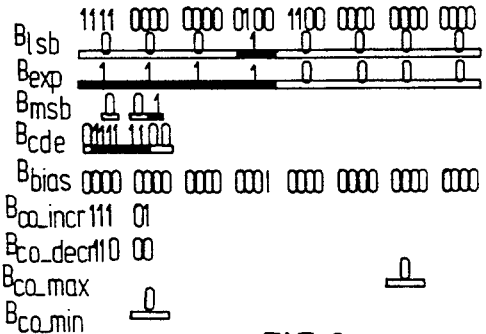
FIG.9
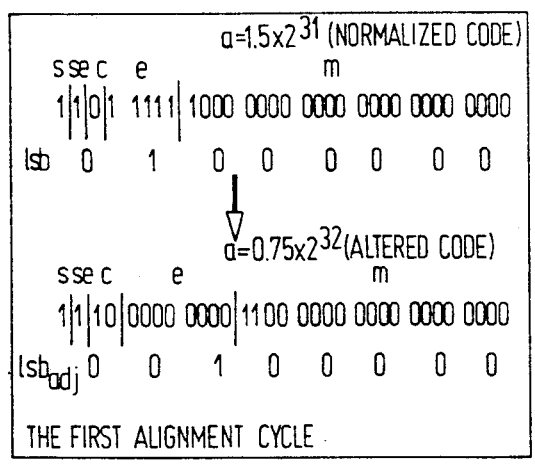
FIG.10 CODING OF REALS
FIG.11 THE FIRST ALIGNMENT CYCLE
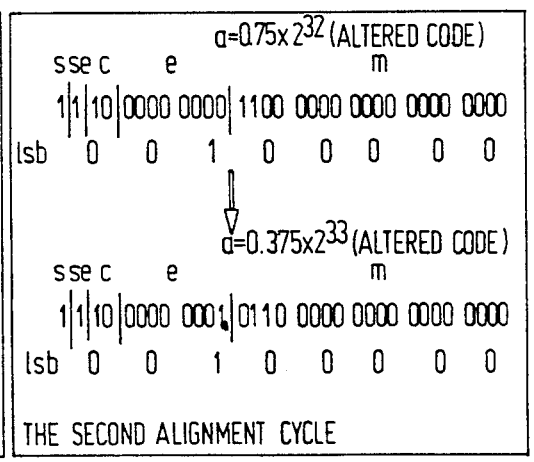
FIG.12 THE SECOND ALIGNMENT CYCLE

METHOD FOR PERFORMING ARITHMETIC, LOGICAL AND RELATED OPERATIONS AND A NUMERICAL ARITHMETIC UNIT

This invention relates to a method for performing arithmetic, logical and related operations on numerical value elements and a numerical arithmetic unit (ALU) in a processor.

BACKGROUND OF THE INVENTION

The arithmetic logic unit in a computer is the unit in which arithmetical, logical, and related operations are performed on elements of information. The operations are provided in accordance with arithmetic instructions given to the ALU. Most conventional ALUs cooperate with accumulators and/or buffer registers or other kinds of registers for temporary storing of values.

OBJECTS OF THE INVENTION

The main objects of the invention is to provide a method or an ALU which reduces numerical expressions in an easy way.

Another object of the invention is to provide an ALU that functions without cooperation with a temporary storage during its operation.

Still another object of the invention is to provide an ALU which uses arithmetic instructions in the information given to it for its operation.

A further object of the invention to provide an ALU being able to handle floating-point values as operands having a controllably variable partition between mantissa and exponent.

A further object of the invention is to provide an ALU being able to handle bit information on buses having floating-point values as operands and a code field giving information on partition between mantissa and exponent.

A still further object of the invention is to provide an ALU being able to handle arithmetic instructions given for its operands on buses which instructions are provided in a code field of variable code length.

A further object of the invention is to provide an ALU having co-variation between interpretation as floating-point number and as integer. A density of the code is also wanted.

SUMMARY OF THE INVENTION

In order to implement at least the main object mentioned above the invention contemplates generally a method to perform arithmetical, logical and related operations on numerical value elements, including the following steps:

a) providing an input list including the numerical value elements to be processed, and instruction information, b) directly controlling and performing an operation on the numerical value elements on the input list using the instruction information, c) each numerical value element providing a work having a predetermined bit length, the maximum number of words being the same as the maximum providable number of elements in the input list, d) the processing device performing a calculation by rewriting the elements in the input list, e) presenting the result output list from the processing device.

Preferably the maximum number of elements in the input list and output list are four. One list element could then be provided with an instruction word representation, two list elements could be provided with each one of two numerical representations and one could be used to be provided with an intermediate calculation result during a calculation made by recycling the rewriting of the input elements several times.

The list preferably includes a function application in which one of its elements is an instruction code and the rest are arguments to the instruction. An instruction is performed by rewriting and recycling the instruction code from the result output list to the input list until an eventual result is reached. At each rewriting, the list could be rewritten to include a revised instruction code word, if appropriate for the actual calculation, followed by value words if appropriate.

It is appropriate to have the numerical value words provided in a coded form before actual processing. Preferably, the words representing numerical value words are provided with a coding setting the numerical values into a dense representation, i.e. every coded representation of a value corresponds to only one interpreted value. A first coding could be provided on a binary word representing an integer value. A second coding could be provided on a binary word representing a floating-point value. The codings are preferably such that after coding floating-point value representations are provided in the same order as integer value representations. In this way neither of the representations need be in binary digit form. A hardware could be provided to make computation on the transformed bit patterns just implicitly by following given rules, i.e. without knowing how the interpretation has been made.

An easy way to accomplish a floating-point value representation having a variable exponent width is to let the binary coded floating-point value representation include a code field, an exponent field and a mantissa field, the code field having an indication on a division position between the exponent field and the mantissa field, such that the exponent and mantissa fields have variable lengths. The dense representation could be provided by including a virtual "1", i.e. a "1" not provided physically in the representation, in front of a field of the word for the mantissa part of the floating-point value representation.

Below follows a list on expressions used in this specification and their reserved meanings:

closure: a hierarchically structure entity which defines a process. All closures have a root which uniquely defines the closure. The reduction work in a reduction machine is made on closures. The whole state of the machine is transformed by the reductions.

goal: a closure to be executed, i.e. reduced.

group: a group consists of four binary digits. Each word consists of a number of groups.

slice: a piece of one or of several words. A slice containing two bits can for example consist of the least significant bit from two words.

align: to make sure that the bits to be used are positioned correctly in a word.

redundancy: data or bits that are added for error detection purposes.

normalized code: a floating point value that is represented in such a way that the most significant bit of the mantissa is a virtual "1" for positive values and a virtual "0" for negative values.

binary representation: a combination of "0" and/or "1" representing a number in any numerical system or code.

binary digit form: the numerical system with base 2.

H-code: a specific code, used in the ALU according to the invention, for representing numbers. Also called H-value.

integer H-value: a specific code for representing integer values.

floating point H-value: a specific code for representing floating point values.

dense representation: every binary combination (bit pattern) corresponds to one unique numerical value.

BRIEF DESCRIPTION OF THE DRAWINGS

For a more complete understanding of the present invention and for further objects and advantages thereof, reference is now made to the following description taken in conjunction with the accompanying drawings, in which:

FIGS. 5A and 5B shows data list provided in accordance with FIG. 4, FIG. 6 is a circuit diagram of an embodiment of the ALU according to the invention, FIGS. 7A to C show an embodiment of an input/output buffer of the numerical ALU according to the invention in different clocking sequences, FIG. 8 shows exemplifying diagrams of output combinations from an operand unit included in the circuit shown in FIG. 6 together with mnemonics used for the control of an element included in the operand unit for providing the different output combinations, FIG. 9 shows the outputs from a precision decoder included in the circuit shown in FIG. 6 for a word on one of the input buses given as an example, FIG. 10 shows an example of different interpretations of a binary mantissa bit combination given as an example, FIGS. 11 and 12 show diagrams supporting the description of an example of an addition of two floating-point numbers.

DETAILED DESCRIPTION OF THE INVENTION

FIG. 1A

Figure 1A:
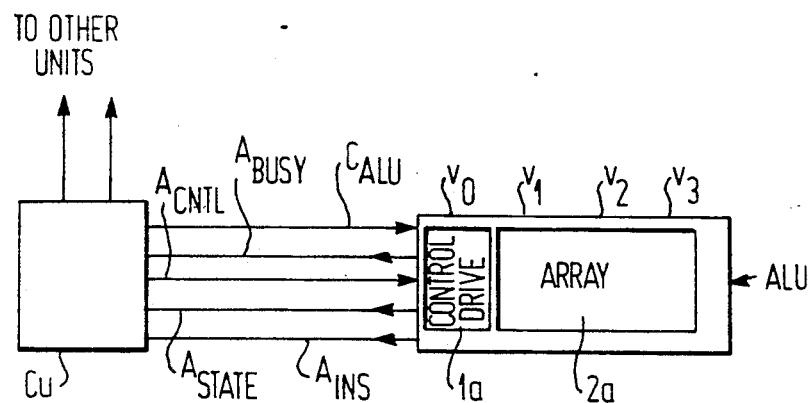
FIG. 1A is a schematic diagram of the ALU according to the invention.

The numerical arithmetic logic unit ALU, schematically shown in FIG. 1A, includes a control drive unit $1a$ and an arithmetic unit array $2a$ performing the arithmetic on particular in/outputs $v_0$, $v_1$, $v_2$ and $v_3$, each being a bus having multiple (M) transmission lines, transmitting a M bit value, M being for instance 32. The ALU is preferably a part of a central processing unit (CPU) and is externally controlled by a control unit CU. The ALU communicates with the external control unit CU with the following signals: a clock signal input $C_{ALU}$, a busy output $A_{BUSY}$, a control input $A_{CNTL}$, a state output $A_{STATE}$, and a decoded instruction output $A_{INS}$.

The bus in/outputs $v_0$, $v_1$, $v_2$, $v_3$ could be connected to particular registers, called goal registers or G-registers, in a structural arithmetic unit (not shown), below called core processor, in which instructions of reduction type are processed. However, the bus in/output signals could also be provided by means of another kind of arrangement cooperating with a computing device, preferably of reduction type, but other types of computing devices are also quite possible. Also, even though the number of in/output busses $v_0$, $v_1$, $v_2$, $v_3$ is shown to be four in FIG. 1A the number could be chosen arbitrarily. However, the complexity of the ALU increases substantially with the number of in/output buses $v_0$, $v_1$, $v_2$, $v_3$.

The in/output buses $v_0$, $v_1$, $v_2$, $v_3$ transport a list of words. A word is a numerical value or an instruction. All buses might not be in use everytime. A work on a bus not in use may be disregarded. The input and/or output list has a maximal length, i.e. includes a maximum number of words, for instance four, i.e. one list element per in/output bus. A numerical value is a word which is transported on several wires. Also, an instruction on a bus is a word. It is the input list on the in/outputs $v_0$, $v_1$, $v_2$, $v_3$ that is used for controlling and performing a computation, i.e. the list includes an information about the kind of computation to be provided and features of the value to be computed, and the control drive $1a$ derives this information from the list while controlling the different components in the array $2a$. A list in a bit or bit group wise way, i.e. for the bits having the same position in a word separately or for groups of bits provided "slice wise" in a word, and to provide the result as an output list. It is to be noted that it is possible to have a recycling of the values several times through the internal circuits before a final output list is presented on the output. During recycling a momentary output list is presented at the output but only to be inserted as a momentary input list.

The list may include a function application together with values to be processed or other type of list, such as a list only including at least one integer value, or floating-point value. When it includes a function application the first list element provided on the in/output $v_0$ includes the instruction code, i.e. information of the kind of processing that should be made, and the rest of the list elements are arguments to the instruction, as will be described in further detail below.

An instruction is performed by rewriting the instruction in one or several steps in order to obtain the result eventually. Microinstructions and state signals are used inside the ALU. These are used by the separate control drive 1a inside the ALU to control the array 2a. When a rewriting directly leads to the result, the value is placed in the output list. When a stepwise rewriting is made, the list is rewritten to keep the same instruction code, or to have a new or slightly changed instruction code, and to have the instruction code in most cases followed by a value or values. It is to be noted that the best mode of making the rewriting operation in several cycles is to keep the instruction code intact during the whole operation, because the control unit will be less complicated in such a case. However, it could also be convenient to have one kind of instruction code at the start of a multi cycle operation and to have this instruction code slightly changed during the rest of the cycles or the like.

Returning to FIG. 1A, the clock signal $C_{ALU}$ is used to give clock pulses to the arithmetic logic unit ALU, and the ALU specifies when it is ready to accept clock pulses with a signal ready on the output $A_{BUSY}$.

The bus in/outputs $v_0$, $v_1$, $v_2$, $v_3$ are connected to the main register cells in a goal register, the in/outputs having instruction or numerical content. The numerical content is preferably given to the ALU in a coded form, being different depending upon if the numerical content represents a floating-point value or an integer. Each goal register cell contains as many bits as each in/output (i.e. 32 bits in the example shown) of numerical value, but also several bits, for instance 6, in which tags are set. These stages are not included in the information provided on the bus in/outputs in the embodiment to be regarded as the best mode of invention. Instead, the stage information is fed to the external control unit CU, and the unit CU controls in turn the ALU control unit 1a.

However, it is within the scope of invention to have the tags included in the information provided on the in/output such that the tag information if fed directly to the control drive unit or ALU control. This could also be the best way to drive the ALU according to the invention when it is used as a unit cooperating with a processor of conventional type.

The control input $A_{CNTL}$ is used to control the numerical operation of the ALU. The operation may take several clock cycles.

An output $A_{STATE}$ is returned to the control unit CU after each operation. The instruction code on the output $A_{INS}$ is a compaction of the instruction code in the goal core cell to which the bus $v_0$ is connected.

FIG. 1B

Figure 1B:
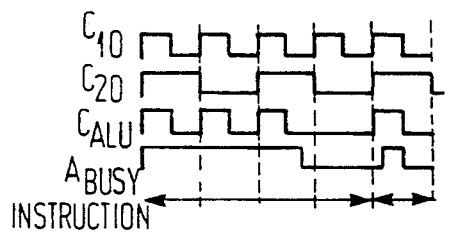
FIG. 1B is a diagram of clock signals and some basic control signals for the ALU shown in FIG. 1A.

Referring to FIG. 1B, the basic block provided by the control unit CU for the processor is $C_{10}$, for instance having a period of 10 ns. An ALU operation is performed in one or several such clock cycles. The core processor that is connected to the ALU could be controlled with a period which is longer than, for instance twice, the period for the ALU, i.e. with the clock signal $C_{20}$ having a period 20 ns if $C_{10}$ has the period 10 ns. However, instead it is also possible to have it controlled with a period which is shorter. The basic control signal $C_{ALU}$ for the device having the shorter period (i.e. the ALU in the embodiment shown, or otherwise the core processor) is therefore stretched at the end of an instruction in order to synchronise with the clock signal $C_{20}$ having the longer period. The ALU returns a high signal $A_{BUSY}$ as long as it needs more clock cycles of the type $C_{10}$ to perform an instruction. The stretching is provided after the signal $A_{BUSY}$ has become low, as apparent from FIG. 1B.

FIG. 2

Figure 2:
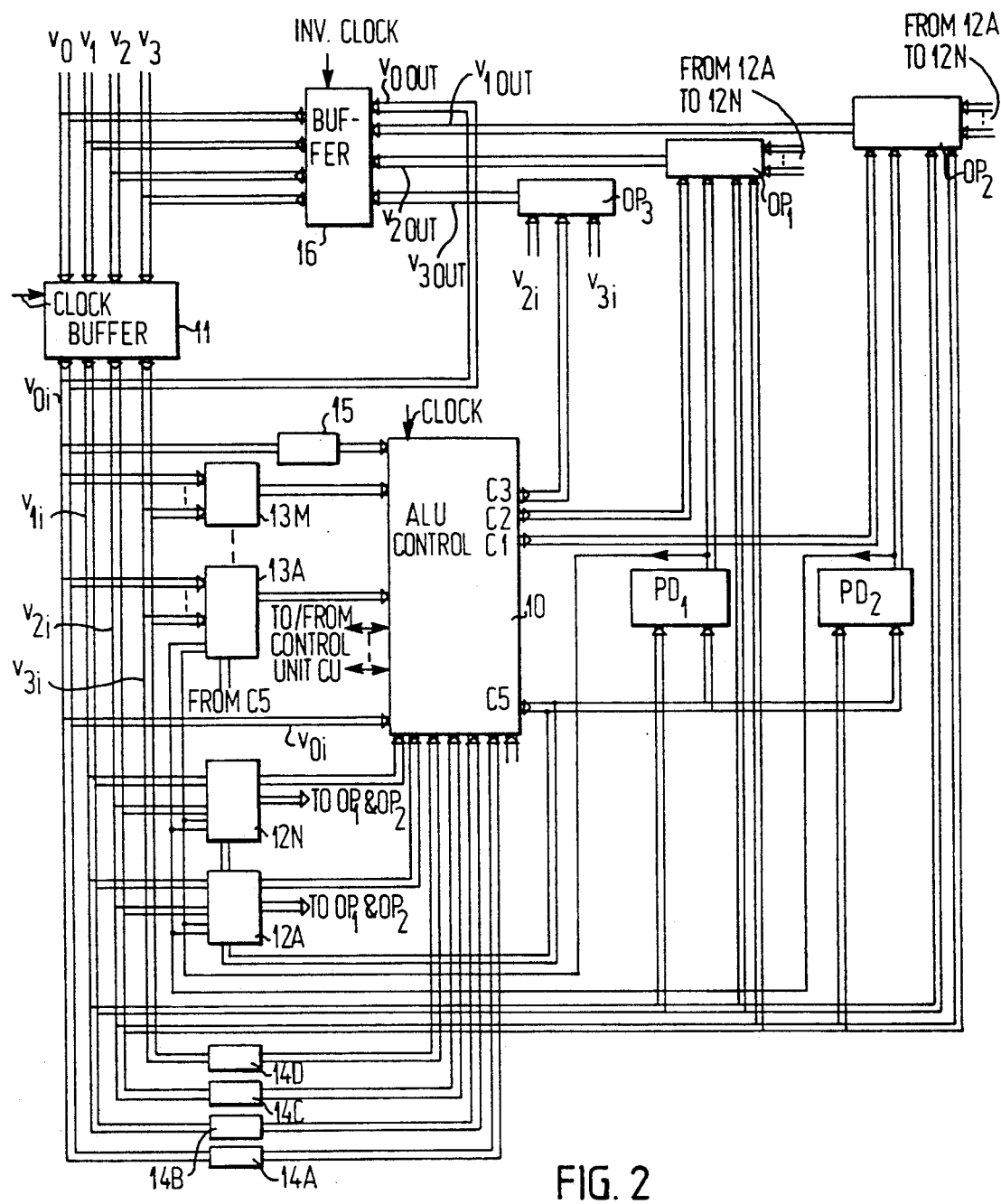
FIG. 2 is a schematic block diagram of an embodiment of the ALU according to this invention.

The embodiment of the invention shown in FIG. 2 includes an ALU control circuit 10 as a central element making conversions and combinations of signals at its inputs suitable for circuits to provide the output list elements. The ALU control circuit 10 includes a kind of boolean gate array. FIG. 2 corresponds to the right hand side of FIG. 1A.

The in/output buses $v_0$, $v_1$, $v_2$, $v_3$, each being a multiwire bus having for instance 32 wires, are connected to the inputs of an input buffer circuit 11. The buffer circuit 11 is clocked by a clock signal on its clock input to transmit its input signals to the internal input buses $v_{0i}$, $v_{1i}$, $v_{2i}$, $v_{3i}$. An output buffer 16 is clocked by an inverse clock signal on its clock input for transmitting the information on output buses $v_{0out}$, $v_{1out}$, $v_{2out}$, $v_{3out}$ to the in/output buses $v_0$, $v_1$, $v_2$, $v_3$. Even though the buffer arrangement 11 and 16 is shown to include two separate buffers in FIG. 2 the buffer arrangement 11 and 16 is preferably a combined input/output buffer circuit.

A number of computing circuits 12A to 12N, N being the number of circuits, are connected to at least two of the internal input buses $v_{0i}$, $v_{1i}$, $v_{2i}$, $v_{3i}$, each making an individual kind of simple computing, such as addition or subtraction in different constellations, of the information on the internal input buses $v_{0i}$, $v_{1i}$, $v_{2i}$, $v_{3i}$ to which they are connected. The computing circuits 12A to 12N are quite time saving, because they could be chosen such that every possible simple computing to be needed for the application in which the ALU according to the invention is a part could be provided stand by at once. The ALU control circuit 10 could then just choose to directly take the output from the suitable one(s) among the computing circuits for each particular kind of operation for further processing purposes. The size of each computing circuit is small and it is not particularly power consuming. Thus, it does not matter the have several circuits making parallel computing even though the output of the computing circuits are fed to operand units $OP_1$ and $OP_2$ as will be described below.

Also, the signals from the units 12A to 12N could in some cases be used for control. Each computing circuit 12A to 12N has a second output, on which a carry signal is provided which is used to indicate overflow. This second output is fed to an individual input of the ALU control circuit 10. The units 12A to 12N are controlled by the ALU control circuit 10 and by other circuits in the ALU giving information of the kind of word which is represented on its inputs, i.e. for example if the word represents a number, and if so, if the number is an integer or a floating-point number, and, if it is a floating-point value, information regarding the properties of this number, as will be described further below.

A number of monitoring circuits 13A to 13M being the number of circuits, are each connected to at least one individual among the input buses $v_{0i}$, $v_{1i}$, $v_{2i}$, $v_{3i}$. The monitoring circuits could for instance monitor the significance of the information of the buses or compare the information of the buses. Some of the monitoring circuits could be provided with the same controlling information as the circuits 12A to 12N, as illustrated only for the circuit 13A. The outputs of the monitoring circuits 13A to 13M are fed to inputs of the ALU control circuit 10.

Three to four property giving circuits 14A to 14D are connected to at least the buses $v_{1i}$, $v_{2i}$, and $v_{3i}$ and derives information from a part of the buses giving information regarding the properties of the rest of the information on the buses. The property giving circuit 14D connected to the bus $v_{3i}$ derives at lesat the least significant beinary digit on the bus $v_{3i}$ for the multiplication case, as will be described further below. A property giving circuit 14A could be connected also to the bus $v_{0i}$ to derive some predetermined information in the case an information on an external control bus EXT to the ALU control drive circuit indicates that the information on the bus $v_{0i}$ represents a number.

For instance, if the information on a bus is a floating-point value, the property giving circuit connected to the bus gives the information regarding the sign of the value, the sign of the exponent and some mantissa bits, for example the most significant. It is to be noted that, when a property giving circuit 14D is provided, the kind of properties delivered from $v_{3i}$ and fed to one input of the circuit ALU control circuit 10 need not be the same as from $v_{1i}$ and $v_{2i}$, it could for instance be less complicated. The same reasoning could also be due for the property giving circuit 14A for the bus $v_{0i}$.

The ALU control circuit 10 provides an output $A_{STATE}$ to the external control unit CU (see FIG. 1A) essentially of its inputs from the units 12A to 12N and 13A to 13M.

An instruction circuit 15 is provided for monitoring the total information on the bus $v_{0i}$ in order to give decoded instructions regarding operations to be made to the ALU control drive circuit 10.

As shown in FIG. 2, the information on the bus $v_{0i}$ could be fed directly to an output bus $v_{0out}$ connected to the output buffer 16, preferably in the form of a bus connection in a combined input/output buffer 11, 16, inversely clocked by the clock signal, as mentioned above. It is convenient to let this bus have the instruction list element and not to change this instruction list element. Other output buses $v_{1out}$, $v_{2out}$, $v_{3out}$ from the ALU are also connected to the buffer 16, and the information on all the output buses are clocked out to the in/output buses $v_0$, $v_1$, $v_2$, $v_3$ simultaneously. The ALU control circuit 10 provides control signals c1, c2, c3, c5 to the other circuits in the ALU.

However, it is also possible to have at least a port of the bus $v_{0i}$ connected to the ALU control 10, which could make some changes in the dependence of the actual cycle in a multiple cycle operation and to feed the changed instruction list element to the bus $v_{0out}$ (not shown).

Two operand units $OP_1$ and $OP_2$ of essentially the same kind provide the outputs $v_{1out}$ and $v_{2out}$, respectively. It is not necessary, but practical, to have two operand units as in the embodiment shown in FIG. 2. Different numbers of operand units, from only one to several, could be used for different applications of the ALU according to the invention. However, only one operand unit is needed in order to make an addition or a subtraction, because this kind of operation is accomplished in one of the circuits 12A to 12N and is provided on one of the inputs of the operand unit and can be provided on the output of the operand unit at control from the ALU control circuit 10. Several operand units could be used in order to make several different kinds of addition and subtraction operations simultaneously. It is to be noted that each operand unit has an output bus $v_{outi}$, where i stands for an arbitrary number, and that therefore the number of in/output, input and output buses is dependent of the number of operand units in the ALU.

An operand unit $OP_3$ of another kind could be provided to be used in connection with multiplication or division operations and feeds it output on the output bus $v_{3out}$. The multiplication and division operations are executed in several cyclic steps. The output of the operand unit $OP_3$ is $v_{3out}$. It is to be noted that there could be a different number of operand units $OP_3$ than one as well.

Regarding floating-point arithmetic, as mentioned above and will be discussed further in detail below, the length of the exponent is chosable, at least in steps, at least in one embodiment of the invention. Therefore, a precision decoder $PD_1$ and $PD_2$, respectively, is provided for each one of the operand units $OP_1$ and $OP_2$. The precision decoder provides control signals to the operand unit to which it belongs regarding the length of the exponent part. This may be derived from a particular code field in the binary word as will be explained further below. It may also provide control signals to other parts of the ALU circuit, as mentioned above.

The information to the ALU regarding if a value is an integer or a floating-point value is preferably provided on a control input EXT of the ALU control circuit 10 by the external control unit CU (see FIG. 1A), but could alternatively be derived from the buses $v_{0i}$ to $v_{3i}$.

As apparent from the above it is convenient to let the input buses have different but well defined tasks in arithmetic computation. Therefore, either the input buses are provided with information having the stated defined tasks directly from the feeding arrangement, such as the goal register mentioned above, which is to be preferred, or the ALU will itself change the information on the input buses to be the appropriate by an internal cycle and then using information on the bus $v_{0i}$ regarding the information on the other buses. The bus $v_{0i}$ could have a data field having the information regarding the kind of information on the list provided on the in/output buses $v_0$, $v_1$, $v_2$, $v_3$. However, this information could also be provided from the external control unit CU.

As apparent from the above the ALU according to the invention has no internal memory. This leads to that the result of each cycle of a multicycle operation is influenced only by the output of the result of the next preceding cycle, which is the input adapted to be processed.

As mentioned above one purpose to be desired for the ALU according to the invention is to have a varying division between the exponent and the mantissa in a floating-point representing system. Then, on the first hand it is possible to have many bits in the mantissa for small numbers, which gives the advantage of having a high precision. On the other hand extremely high numbers could be handled.

EXAMPLE REGARDING MULTIPLICATION OF INTEGERS

In order to give briefly an understanding of the operation of the ALU according the invention an example is given here regarding a multiplication of two integers. Further on examples will be given regarding the operation of the ALU when calculating floating-point values.

A multiplication of integers could for instance be provided in the following way. During the first cycle the two figures to be multiplied are provided the one on the input bus $v_2$ and the other on the bus $v_3$. The bus $v_1$ has the information "0". One of the operand units of the first kind, for instance $OP_1$, is controlled to transfer the information on $v_2$ directly to its output. The other of the operand units, $OP_2$, is controlled to displace the information on $v_2$ one step to the left and present the displaced result on its output. During the next cycle the first mentioned of the operand units, $OP_1$, is controlled to transfer the information from the one of its inputs connected to one of the circuits 12A to 12N making an addition of the figures on the buses $v_{1i}$ and $v_{2i}$. The other operand unit, $OP_2$, is controlled to take the information on the bus $v_{2i}$ and displace it one step to the left, and present it to its output.

For each cycle thereafter, the first mentioned operand unit, $OP_1$, is controlled to transfer the output of the circuit making addition of the information on the buses $v_1$ and $v_2$ if the last binary figure on the information on the bus $v_{3i}$ is a "1" or else take the information on the bus $v_{1i}$. This information for the ALU control circuit 10 is provided on the output of the circuit 14D. The figure information on the bus $v_{3i}$ provided at the input of the operand unit $OP_3$ is controlled to displace it one step to the right such that the least significant binary digit is taken away.

At least the operand circuits $OP_1$ and $OP_2$ may have the ability to provide a return signal (not shown in FIG. 2) back to the ALU control circuit 10 indicating that an internal shift may have caused a carry. Each cycle is executed in two steps, of which the first is made during the first half period of the clock signal and the other during the second.

FIG. 3

Figure 3:
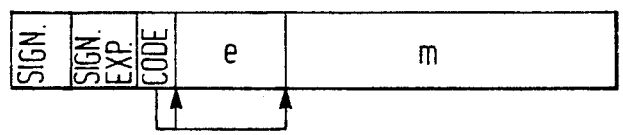
FIG. 3 is a schematic representation of the bit field partition in an arithmetic representation.

As shown schematically in FIG. 3, each bit pattern on a bus having a numerical value is therefore preferably provided with a short bitfield in the most significant bits of the bit string having an information of the sign of the value, the sign of the exponent and a code regarding the dividing position (see the right arrow in FIG. 3) between the exponent and the mantissa parts of the numerical value. It is to be noted that also the length of the code part of the bitfield could vary, and that the place of the dividing position between the code field and the exponent field is determined by the code field, as illustrated by the left arrow in FIG. 3.

Three ways of representing decimal numbers will be discussed in the following:

I Binary digit form: The numerical system with base 2.

II Integer H-value: A binary code for representing integers.

III Floating-point H-value: A binary code for representing floating-point values.

Another purpose to be desired for the ALU according to the invention is to provide the floating-point representation of the number in the same order as the integer interpretation of the same number. Thus the floating-point value and the integer value of the same bit pattern are totally different.

However, this purpose could be fulfilled by having a first interpretation formula for the bitstring if the representation is to be interpreted as a floating-point value and a second interpretation formula for the bitstring if the representation is to be interpreted as an integer value. Thus neither of the representations need to be in binary digit form, instead at least one of them, preferably both, is in a coded form. The bit pattern transformation is made automatically, and the hardware in the machine makes the computation on the transformed bit patterns just implicitly by following given rules, i.e. without knowing how the interpretation has been made.

According to a preferable embodiment of the invention an effort is made to provide a dense representation of the floating-point values, i.e. there shall not be two bit patterns which could be interpreted as the same number. The term "close representation" means that every decimal number corresponds to a unique binary combination.

FIG. 4A, INTEGER REPRESENTATION

Figure 4A:
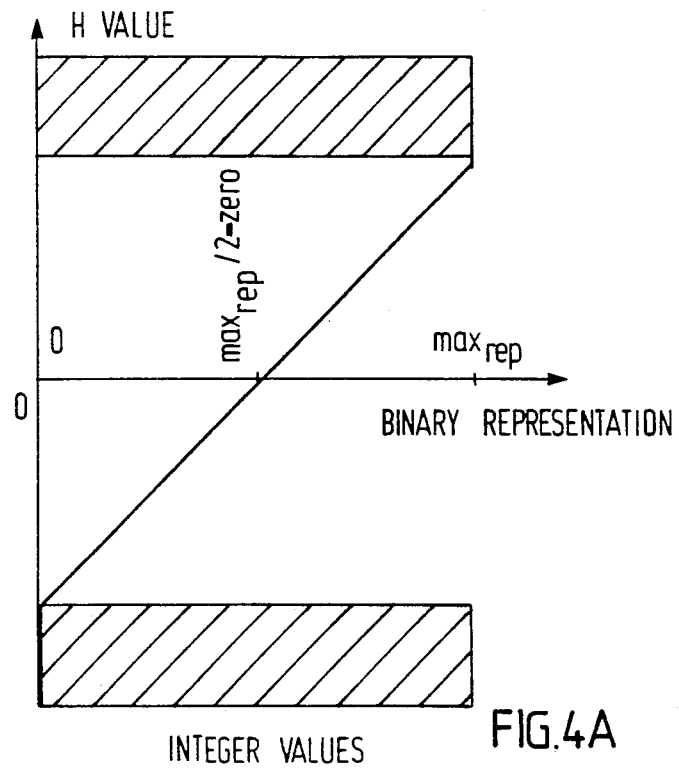
FIG. 4A is a graphical representation of a code for integers.

FIG. 4A shows a graphical representation of the code for integer values according to the invention, called integer H values. The binary representation is provided along the horizontal axis, and the H values along the vertical axis. The most significant bit represents the sign of the value, whether it is negative or positive. As apparent from FIG. 4A the H value has its most negative value when the binary representation is all "0", has its zero at the middle of the binary representation, i.e. when the most significant bit changes from "0" to "1", and has its most positive value when the binary representation is all "1". Thus, the value of a binary combination in H-code increases the same way as it does in binary digit form. When the binary combination of a word in binary digit form is "1" it also has its maximum value. The integer code is a straight line.

FIG. 4B, FLOATING POINT VALUE REPRESENTATION

Figure 4B:
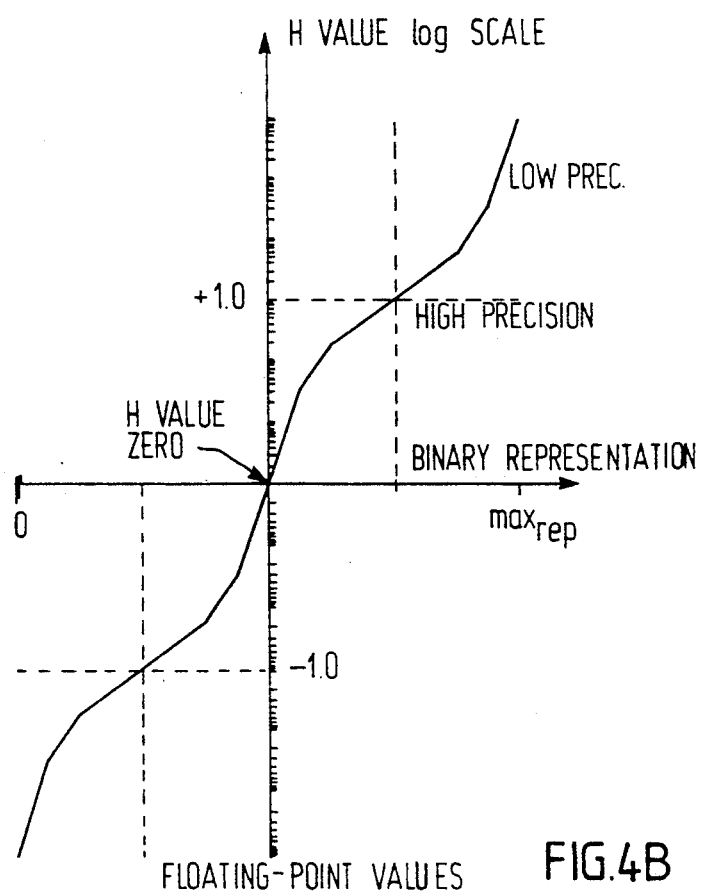
FIG. 4B is a graphical representation of a code for floatingpoint values.

FIG. 4B shows a graphical representation of the code for floating-point values according to the invention, called floating-point H values. The binary representation is provided along the horizontal axis, and the H values along the vertical axis, which here is drawn through the point in which the floating-point H values are changing their sign. Also in this representation the most significant bit represents the sign of the value. The floating-point value representation must fulfill the requirement to be universal. For a certain precision the magnitude of the value must be arbitrary variable. Thus extremely small and large values should be representable. The floating-point H value scale is logarithmic. The logarithmic H value could be simplified by using straight line approximations between each factor of 2. The result is a typical floating point code. As seen in FIG. 4B the binary representation for representing H values between $-1$ and $+1$ is provided in the middle of the binary representation field and includes half the field.

The relative precision of a value is constant over the entire range of values. The logarithmic values have a certain precision and range. If the magnitude should be arbitrary large it must be possible to adjust the range of the logarithm.

The logarithmic value could be applied to the logarithm function still one time or even further times. Thus, it is possible to represent very large values. However, the precision decreases at large magnitudes, but the precision at small levels could be kept or even slightly increased.

Since the two bit patterns of the two representations appear in the same manner, an integer size comparator could be used also for floating-point value representations. This means that a particular floating-point value comparator could be avoided. This in turn means that the integer size comparator, which makes the comparing operation in only one cycle, can be used for the floating-point values, which is a great advantage. A floating-point value comparator of conventional type must use many cycles for its operation.

In conventional arithmetical logic units several bit patterns could be interpreted as the same number and a normalization is made such that one of these bit patterns is chosen. According to the invention no normalisation need be made, at least not at the actual calculation. Normalization could be made before and after a calculation operation. By having a dense representation similarity between floating-point values, a floating-point value calculation, such as comparison, can be determined in one cycle only. An advantage of having a dense representation is also that a maximum number of floating-point values are available, i.e. no rejected and unusable values are provided in a sequence of values.

The reason why there are several bit patterns which could be interpreted as the same number in conventional applications is that the exponent part and the mantissa part of a value are multiplied with each other in order to create the value. For instance the value 1.0 could be $2^1 * \frac{1}{2}$, i.e. having the exponent bit pattern 01 and the mantissa bit pattern 100, or $2^2 * \frac{1}{4}$, i.e. having the exponent bit pattern 10 and the mantissa bit pattern 010, the exponent bit pattern and the mantissa bit pattern following after each other.

In accordance with an embodiment according to the invention the dense representation is created by providing a "1" implicitly, i.e. without actually being there, in front of the mantissa bit pattern for positive values and a "0" implicitly for negative values. Traditionally, the mantissa is specified as a value between $-1$ and $+1$. In accordance with the invention the binary coded mantissa is specified as a value in the range (1.0 to 2.0) or ($-2.0$ to $-1$) depending on the sign.

The integer patterns are exactly determined, and the floating-point representations shall have the same consecutive order as the integer interpretation, which is a very hard constraint.

FIGS. 4C, 5A AND 5B, FURTHER INFORMATION ON FLOATING-POINT VALUE REPRESENTATION

Figure 4C:
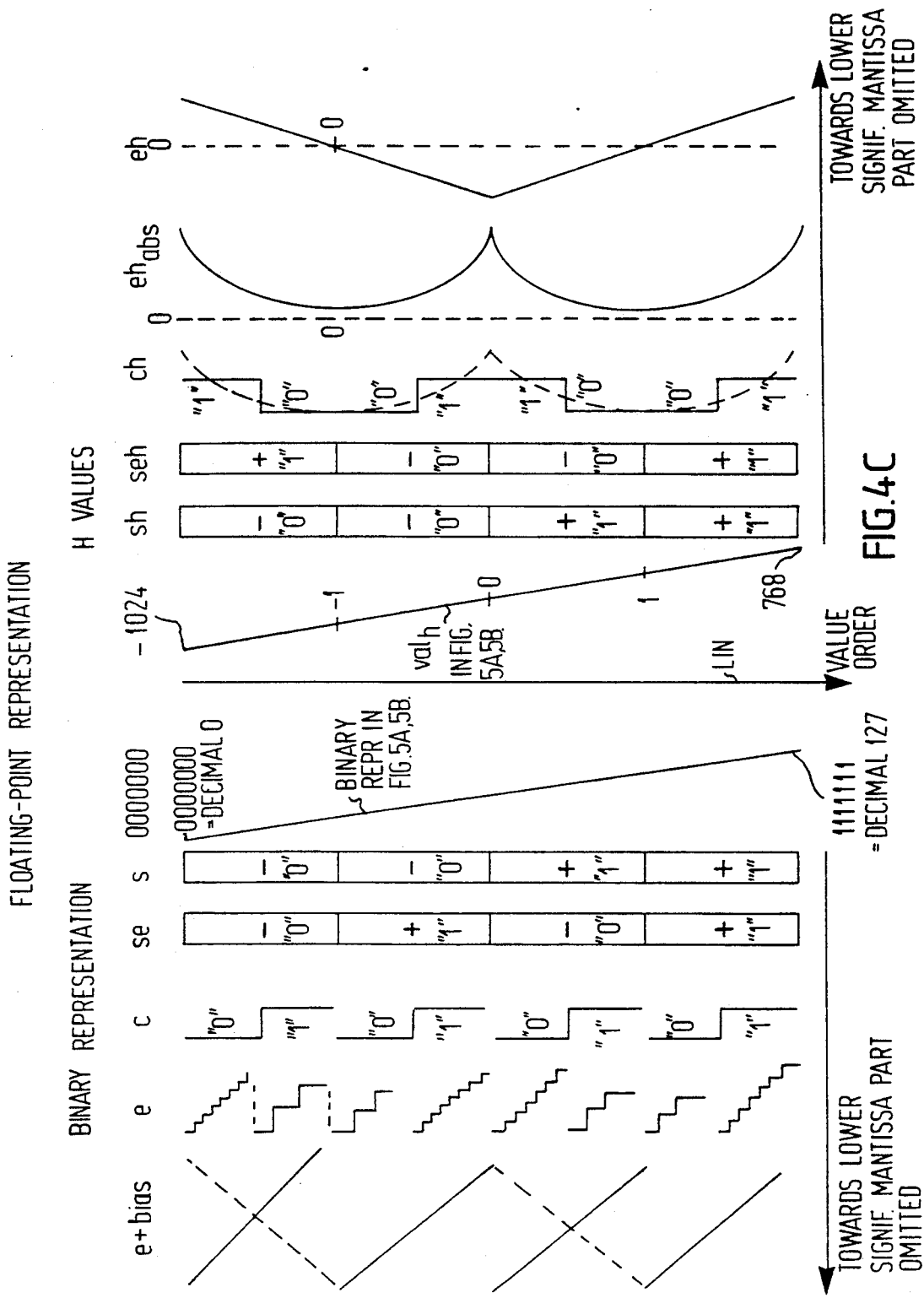
FIG. 4C is a schematic representation for explaining the set up of an arithmetic representation provided on a 7 bit bus.

An advantageous solution to this problem is shown schematically in FIG. 4C. FIGS. 5A and 5B show a data list of words provided according to the principles shown in FIG. 4C. The column most to the right in FIGS. 5A and 5B shows the decimal floating-point value corresponding to the binary combination in the column most to the left. FIG. 4C shows a schematical graphical exposition of the floating-point code, the binary representation is illustrated on the left hand side of a vertical dividing line LIN, and the floating-point H-values are illustrated on the right hand side of the line LIN. The line LIN is illustrated as an axis pointing toward higher values. This is due both for the binary representation and for the H value representation.

The representations and the H-values are illustrated to propagate outward from both sides of the line LIN. Nearest to the line LIN is an illustration of the axes in the diagram in FIG. 4B. The H-value axis to the right and the binary representation axis to the left.

The first field outside the axis representation, sh to the right and s to the left, represents the most significant bit. It is "0" for negative values, "1" for positive.

The second field outside that, seh and se, respectively, represents the next most significant bit. It is the exponent sign bit. A negative sign is represented by "0" and a positive sign is represented by "1".

The third field at least one bit having lower significance than the next most significant bit, one bit if the binary field is low, as in the illustrated case having only seven bits, and more than one bit if the binary field is high, as will be explained below for a case having 32 bits.

In the example shown in FIGS. 4C, 5A and 5B the coding for seven bit words is shown instead of the 32 bit words that probably will be more frequently used in practice. The binary representation immediately to the left of the center line in FIG. 4C will be interpreted to have the H-values $-1024$ to $+768$. It is to be noted that the H-values $-1$ and $+1$ are placed halfways between the value 0 and the extreme values $-1024$ and 768, respectively. The first binary bit s and sh, respectively, both for the representation and for the H-values is the sign of the value, whether it is a positive or a negative value.

The second binary bit is the sign of the exponent, i.e. whether the absolute value is above or below the number 1. The H-value exponent sign bit seh is thus positive between $-1024$ and $-1$, negative between $-1$ and $+1$, and then positive between $+1$ and $+768$. As apparent from the left side of FIG. 4C the binary representation exponent sign bit se instead is negative in the second, negative in the third, and positive in the fourth. The bit seh could be described such as if $s=1$ then $seh=se$ otherwise $seh=1-se$.

Thus, in the binary representation the most significant bit, representing the character sign, has the slowest variation, the next most significant bit, representing the exponent sign, has the next slowest variation, i.e. twice that of the character sign bit. The bit in the next place has twice the variation of the exponent bit and is the code bit c. The code includes only one bit in the example according to FIGS. 4C and 5A, 5B. In other examples the code field may include more than one bit. The code controls the exponent length and is to be regarded in view of the preceding sign bits.

The floating-point H-value, i.e. the floating-point notation, which is to be achieved, provides the code field ch in a more particular way. As apparent from the section eh in FIG. 4C, which gives the exponent H-values directly, the value eh goes from a large positive value down to a value 0, where the H-value is $-1$, from there to a large negative value, where the H-value is 0, from there to a value 0, where the H-value is $+1$, and from there to a large positive value, where the H-value is 768. The section $eh_{abs}$ shows the absolute exponent H-values and is represented by two curved lines, provided side by side each having both ends at a large positive value and its middle point placed at 0. The code field for the H-values ch is designed to reflect the H-values $eh_{abs}$ and thus is shown to have the same form in dashed lines and the form it will have if the code field includes only one bit in continuous lines. Thus the code $ch=c$ if $se=1$, and otherwise $ch=1-c$, when the code ch only includes 1 bit.

Up till now it has been easy to follow the disposition of the list provided in FIGS. 5A and 5B, because each one of the bit fields s, sh, se, seh, c and ch includes only one bit, and therefore the comparison between the representations in FIG. 4 and in FIGS. 5A and 5B is obvious. The first column in FIGS. 5A and 5B is a sequential binary list from 0000000 to 1111111 and its straightforward counterpart in the decimal numeration system is provided in the second column. To the right of the arrow column the transformed numbers for the representation code field in order to make it easy to make the comparison to the illustration in FIG. 4C.

The column to the right of ch includes a decimal representation of the exponent value e of the representation, and thereafter the decimal representation of the exponent value eh of the H-value. The next two columns show the binary representation of the values e and eh, respectively. The following next two columns show the decimal and the binary, respectively, representation of the mantissa value m for the representation. Thereafter the decimal representation of the mantissa value mh of the H-value is shown. It is to be noted that the mantissa varies between $-1$ and $-2$ in FIG. 5A, in which the value sh is "0", and between $+1$ and $+2$ in FIG. 5B, in which the value sh is "1". The column most to the right shows the decimal H-value provided by the binary combination in the column most to the left, when transformed.

As apparent from the upper part of FIG. 5B the representation having a "1" as its most significant bit followed by "0":s represents the particular floating-point value "0".

As apparent from the sequence of binary numbers in FIG. 4C, next to the left of the center line, the seven binary bits has its four least significant bits left to be shared by the exponent and the mantissa, since the three most significant bits are reserved to the sign bits and the code bit. From the digital columns e and m it is apparent that in the uppermost section, where the exponent sign se is negative, i.e. "0", and the code value c is "1", the value e includes three bits, and thus the value m one bit (the first two "0":s in the column may be omitted). This is illsutrated in FIG. 4C by having an e-representation in many steps in this section. In the next section, in which the exponent sign se still is negative but the code value c is "0", the value e does only include one bit (the first two "0":s in the column may be omitted), and the mantissa value may include three bits. This is illustrated in FIG. 4 by having an e-representation in few steps in this section. In the next section, the value e includes only one bit and the mantissa three bits, etc.

As shown in the representation part, the exponent e has many steps in the sections having $c=0$ and $se=0$ and few steps in the sections having $c=1$ and $se=1$. In the section e+bias to the left of the section e it is illustrated with continuous lines the values e provided in a line after each other within each quarter of a full section and with dashed lines how the values $eh_{abs}$ are constructed by inverting every second quarter of a section in e+bias. (eh represents the value of e with the exponent sign.)

Thus the code bit or bits is dependent upon the preceding exponent sign bits, and therefore one could say that the code in fact is including the sign bits and therefore could have a very limited strength, i.e. be shorter than if the length of the exponent should be dependent on what is provided only in the code field.

The mantissa length is dependent upon the exponent value in such a way that when the exponent is long then the mantissa is short and vice versa. Therefore, the mantissa is not shown in FIG. 4 but is apparent from the column m,m of the list in FIGS. 5A and 5B, where the first m illustrates the decimal numeration value and the second m illustrates its digital counterpart. If $s=1$ then $mh=1.0+m$ otherwise $mh=-2+m$ as mentioned above.

The example above was described for a seven bit word length in order to have it illustrative. As mentioned, the word length could be chosen to be quite long, for instance 32 bits. Then, it is practical to have a varying code length. It is also practical, in order to make the circuitry less complicated, to make the passing one from one division point between exponent and mantissa in steps of a group of bits, for instance of four bits. An advantage with this is that it is not necessary to have as many codes as must be had when the passing on is made bit wise. An example of such a precision decoder will be described further below.

FIG. 6

A detailed embodiment of the circuit in FIG. 2 is shown in FIG. 6. The in/output buses $v_0$, $v_1$, $v_2$, and $v_3$ are connected to an input/output buffer 20, which transmits the information on the input to the internal buses $v_{0i}$, $v_{1i}$, $v_{2i}$ and $v_{3i}$, respectively, for each inverted clocking interval of the external clock signal CLOCK provided on a clock control input of the buffer, and the output on the internal output buses $v_{0out}$, $v_{1out}$, $v_{2out}$, $v_{3out}$ to the in/output buses $v_0$, $v_1$, $v_2$, $v_3$ for each clock interval.

FIGS. 7A, 7B AND 7C

Figure 7C:
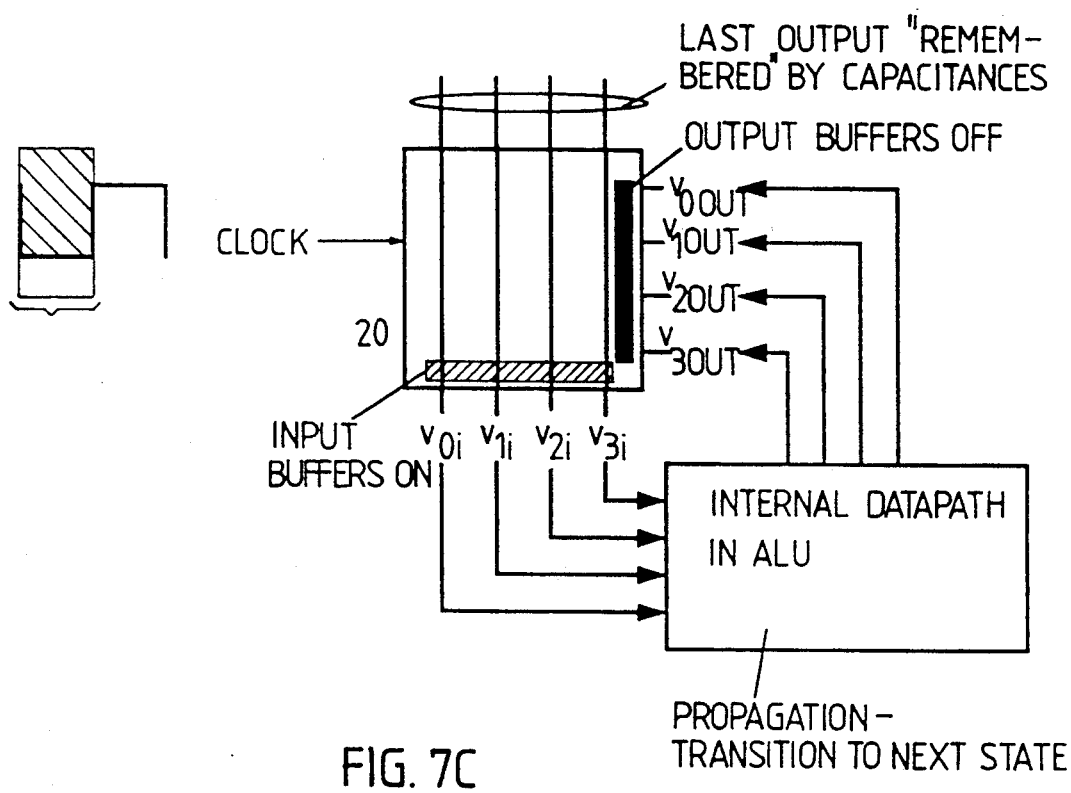

An embodiment of the circuit 20 and the clocking of it is shown in FIGS. 7A, 7B and 7C. The input/output buffer 20 includes in turn input buffers, one for each input/output bus $v_0$, $v_1$, $v_2$, $v_3$, and the same number of output buffers. In order not to create race problems the clock signals must not overlap. This is arranged by slightly cutting their leading edges.

During the first phase of the clock signal CLOCK shown in FIG. 7A, being inversed as marked at the left with a bracket, the input from an external source is provided to the internal datapath in the ALU through the input buffers being controlled to a transmitting state. The data is propagated through the internal datapath in the ALU while being transitioned to next state provided on the output buses. The output buffers are set in a blocking state.

As shown in FIG. 7B, during the phase 1 of the clock period of the clock signal CLOCK, marked with a bracket to the left in FIG. 7B the input buffers in the circuit 20 are controlled to a blocking state and the internal circuits in the ALU function as a stable multiplexor to control the signals to be provided on the input/output buses $v_0$, $v_1$, $v_2$, $v_3$. The output buffers in the circuit 20 are set in a transmitting state.

The condition at a multiple cycle instruction at the phase 0 is shown in FIG. 7C. The content at the input/output buses $v_0$, $v_1$, $v_2$, $v_3$ fed to them from the ALU during the preceding phase 1 is kept on them during the phase 0 because of capacitance effects and is thus able to be transmitted through the input buffers, which are controlled to a transmitting state while the output buffers are controlled to a blocking state, to the input buses $v_{0i}$, $v_{1i}$, $v_{2i}$, $v_{3i}$, and from there propagated through the internal datapath in the ALU while being transitioned to the next state.

According to a preferable application, only the input list is used to control and perform a computation, which is made by rewriting the content in the input list and to feed the result to the output. The list may include a stored function application or another type of list. The first element in a function application is an instruction code and the rest of the elements are arguments to the instruction. This preferable application is dependent upon that a functional hardware dependent upon the input data is provided. However, the information regarding the kind of information present on the buses $v_{1i}$, $v_{2i}$, $v_{3i}$ is preferably given on an input EXT from the control circuit CU (see FIG. 1A).

The control unit CU preferably has the information of whether the words on the input buses $v_{0i}$, $v_{1i}$, $v_{2i}$, $v_{3i}$ represent instructions and/or numbers, and if the numbers are floating-point values or integers, and gives this information to the ALU control circuit 27 through the bus EXT.

However, there could in fact be useful applications in practice, in which the functional behaviour is not wanted, and then external information to the ALU control drive circuit, for example on the input EXT from the control circuit CU, could be used for providing the control and performance of a computation.

An instruction is performed by rewriting the instruction till its eventual result in one step, or rewriting the value of the list in several steps in order to reach the result eventually.

When a stepwise rewriting is made the same instruction code could be used for each step or the list could be rewritten to a new instruction code, the list being followed by values.

FIG. 6

The following processing units are provided in the embodiment shown in FIG. 6 to perform the different instructions:

A first comparator 21 is connected to the buses $v_{0i}$ and $v_{1i}$ comparing all information of these buses, i.e. $v_{0i} > v_{1i}$, $v_{0i} = v_{1i}$, and provides the comparing results, i.e. a two bit value, on its output $cmp_{01}$ connected to an ALU control drive 27. A second comparator 22 is connected to the buses $v_{1i}$ and $v_{2i}$ comparing the whole information of those buses, i.e. $v_{1i} > v_{2i}$, $v_{1i} = v_{2i}$ and provides the comparing results on its output $cmp_{12}$ connected to the ALU control drive 27. A third comparator 221 is connected to the buses $v_{2i}$ and $v_{3i}$ comparing the whole information of those buses, i.e. $v_{2i} > v_{3i}$, $v_{2i} = v_{3i}$ and provides the comparing results on its output $cmp_{23}$ connected to the ALU control drive 27. A fourth exponent comparator 222 is connected to the buses $v_{1i}$ and $v_{2i}$, each being a 32-bit bus, and compares the most significant parts of the word on those buses, i.e. the parts se, c, e, i.e. all the information except the mantissa and the sign. The comparator takes notice of the coding of the parts se, c, e, described above. Therefore, the signal $B_{1sb1}$ from a precision decoder PD, is fed to a separate input of the comparator 222.

A fifth comparator 223 compares the signals $B_{1sb1}$ and $B_{1ab2}$ from the precision decoder. The resulting signal cmp-prc indicates if the signals $B_{1sb1}$ and $B_{1sb2}$ are identical.

The ALU control circuit 27 feeds the result of the comparisons from the comparators to its output $A_{STATE}$ connected to the control unit CU (see FIG. 1A). The result could also be used for control of some of the units to be described below so that prechosen words are provided on the output buses $v_{1out}$, $v_{2out}$ and $v_{3out}$ if appropriate.

An insignificance decoder 23 is connected to the wire $v_{1i}$ and is testing if the bits on $v_{1i}$ are all "0" or "1", if the word on the bus $v_{1i}$ represents and integer, and, if the word on the bus $v_{1i}$ represents a floating-point value, testing separately if the bits in the exponent part and in the mantissa part are all "0" or "1". The information regarding this is derived from a signal $B_{1sb1}$ indicating the least significant bit group of the input $v_{1i}$. This signal provides information whether the word on the input buses represent integers or floating-point values, and in the case of floating-point values the division between the exponent and mantissa part. The result of these tests is provided on the output $insig_1$ connected to an input of the ALU control circuit 27.

An insignificance decoder 24 is connected to the bus $v_{2i}$ and is testing if the bits on $v_{2i}$ are all "0" or "1", if the word on the bus $v_{2i}$ represents and integer, and, if the word on the bus $v_{2i}$ represents a floating-point value, testing separately if the bits in the exponent part and in the mantissa part are all "0" or "1". The information regarding this is derived from a signal $B_{1sb2}$ indicating the least significant bit group of the input $v_{2i}$ and providing the same type of information as the signal $B_{1ab1}$. The result of these tests is provided on the output $insig_2$ connected to an input of the ALU control circuit 27.

An insignificance decoder 25 is connected to the wire $v_{3i}$ and is testing if the bits on $v_{3i}$ are all "0" or "1", if the word on the bus $v_{3i}$ represents and integer, and, if the word on the bus $v_{3i}$ represents a floating-point value, testing separately if the bits in the exponent part and in the mantissa part are all "0" or "1". The information regarding this is derived from the signal $B_{1sb1}$. The result of these tests is provided on the output $insig_3$ connected to an input of the ALU control circuit 27.

Each insignficance decoder is also controlled by a control signal $c5_3$ to be described further below from the ALU control circuit 27.

The purpose of having the insignificance decoders is to detect if the information on one of the inputs to take part in a calculation to be made should be insignificant. This information is also provided on the bus $A_{STATE}$ to the control unit CU. A final condition that is at least one input from one of the insignificance units for instance indicate all zeros could be used by the ALU control circuit 27 for some types of operations including a number of iterations.

An instruction decoder 26 is connected to the bus $v_{0i}$. The bus $v_{0i}$ bears the instruction when the ALU is to perform an arithmetic operation. The result of the decoding of $v_{0i}$ is transmitted to the ALU control drive 27 through the output ins, if $v_{0i}$ bears the instruction or data value. The units 23 to 26 are also controlled by other signals $B_{1sb1}$, $B_{1sb2}$ and $c_5$ generated in the circuits PD1, PD2 and 27, respectively, and further described below.

THE ADDERS AND SUBSTRACTOR

A first adder 28 connected to the buses $v_{1i}$ and $v_{2i}$ makes the addition $v_{1i} + v_{2i}$ and feed the result to a separate output $a_1$. A possible carry signal of the result will be fed to an output $gr_{a1}$ connected to the ALU control drive 27. A substractor 29 connected to the buses $v_{1i}$ and $v_{2i}$ makes the subtraction $v_{1i} - v_{2i}$ and feeds the result to a separate output $a_2$. A possible carry signal of the result will be fed to an output $gr_{a2}$ connected to the ALU control drive. A second adder 30 connected to the buses $v_{1i}$ and $v_{2i}$ makes the addition $v_{1i} + 2*v_{2i}$ and feeds the result to a separate output $a_3$. A possible carry signal of the result will be fed to an output $gr_{a3}$ connected to the ALU control drive 27.

Each adder is also controlled by a control signal c5 from the SLU control circuit 27 to be described in further detail below and by the signal $B_{1sb1}$. This signal provides information whether the words on the input buses represent integers or floating-point values, and in the case of floating-point values and aligned values on the buses $v_{1i}$ and $v_{2i}$ the division between the exponent and mantissa part. This information is essential because discrete values, i.e. integers, are evaluated as one entity, but for continuous values, i.e. floating-point values, the mantissa and the exponent parts are evaluated separately.

A first sign and exponent sign circuit 35 is sorting out the sign, exponent sign, most significant mantissa bit and the two least significant mantissa bits of the word on the bus $v_{1i}$ and feeds its output $sign_1$ to an input of the ALU control drive circuit 27. A second sign and exponent sign circuit 36 is sorting out the sign, exponent sign, most significant mantissa bit and the two least significant mantissa bits part of the word on the bus $v_{2i}$ and feeds its output $sign_2$ to an input of the ALU control drive circuit 27. Also, a third sign and exponent sign circuit 37 could be connected to the bus $v_{3i}$ and feeds its output $sign_3$ to an input of the ALU control drive circuit 27. It is to be noted that the circuits 35 and 36 are absolutely needed when the sign, the exponent sign and the mantissa bits are provided as a part of the word provided on the buses $v_{1i}$ and $v_{2i}$. They are used by the ALU control circuit in case of floating-point value words on the input bases. The circuit 37 may be omitted in some applications of the ALU according to the invention. A sign and exponent sign circuit (not shown) could also in some applications of the ALU according to the invention be provided for the bus $v_{0i}$.

The ALU control drive 27 provides digital output signals on output bases c1, c2, c3, c4, c5 by processing its input signals. The ALU control drive 27 is preferably a boolean gate array. Examples of the control provided by the output signals will be described further below.

THE OPERAND UNITS

Two operand units r1 and r2, one for each of the operands on the buses $v_{1i}$ and $v_{2i}$, contain all arithmetic unique to one element. Each operand unit has several information inputs. Three of them are connected to the separate outputs $a_1$, $a_2$, and $a_3$ of the three units 28, 29 and 30, respectively, two of them to the input buses $v_{1i}$ and $v_{2i}$, respectively, and three of them are connected to some outputs of an individual precision decoder PD1 or PD2, respectively, to be described further below. In principle each information input is a bus including the same number of wires as each input bus $v_{0i}$, $v_{1i}$, $v_{2i}$, $v_{3i}$.

The output of the operand unit r1 is the output bus $v_{1out}$ and the output of the operand unit r2 is the output bus $v_{2out}$.

A first output c1 of the ALU control unit 27 is a composite control signal to control internal elements in the operand unit r1. Other control signals for the unit r1 are provided by the precision decoder PD1. A second output c2 of the ALU control unit 27 is a composite control signal to control internal elements in the operand unit r2. Other control signals for the unit r2 are provided by the precision decoder PD2. A third output c3 is a composite signal provided to a third operand unit r3, a fourth output c4 is provided to control a polynome providing circuit 31 to be described further below, a fifth output c5 is provided to control the precision decoders PD1 and PD2 and also the insignificance circuits 23 to 25, the adders 28, 30 and the subtractor 29, and the sign and exponent sign circuits 35 to 37.

Each of the operand units r1 or r2 has essentially the same configuration, and therefore only one of them r2 will be described in detail. The corresponding elements in the units r1 and r2 have been provided with the same references. The operand unit is divided into two groups, the exponent part $OP_e$ and the mantissa part $OP_m$. The mantissa part $OP_m$ has an output n1 and the exponent part has an output n2. The outputs n1 and n2 are connected to inputs of an output bus selector, also called bit group individual selector M1. A 0/1 generator 40 providing a precision group of four "0" or four "1" at choice, controlled by a control signal $c2_{11}$ to the generator, is also connected to an extra input of the selector M1.

The exponent part $OP_e$ has as inputs four of the inputs of the operand unit, i.e. $v_{2i}$, and $B_{Bias2}$, $B_{co\ incr2}$, $B_{co\ decr2}$ from the precision decoder PD2, and has also an input n8 from the mantissa part $OP_m$. The input $v_{2i}$ is connected to the input of an incrementer INC, the input of a decrementer DEC and to one of five inputs of a word selector M2. The outputs n5 and n6 of the components INC and DEC, respectively, are connected to two inputs of the word selector M2. $B_{co\ incr2}$, $B_{co\ decr2}$ are connected to the other two inputs of the word selector M2.

The component INC in the operand unit r2 also has carry outputs $gr_{i2}$ and $Ce_{i2}$, while the component DEC has carry outputs $gr_{d2}$ and $Ce_{d2}$ connected to the ALU control drive circuit 27. (Also the operand unit r1 has increment component carry output signals $Ce_{i1}$ and $gr_{i1}$ as well as decrement component carry output signals $Ce_{d1}$ and $gr_{d1}$ connected to the ALU control drive circuit 27.) The carry outputs are provided early during the first half of the clock cycle. The selectors are controlled late during the first half of the clock cycle, and then this selector control signal is provided in taking care of the fact if there was a carry in some of the increment or decrement circuits or not.

The normal maximum propagation delay to the first selector is more than a half cycle. Thus, there are not extra delays caused by this arrangement. However, the typical propagation delay is generally less than a half cycle. All signals are evaluated at the transition to the last half cycle. No unnecessary transitions occur in the software.

The output n4 of the word selector M2 in the operand unit is connected directly to a first input of a word selector M3 having four inputs and to a second input of it through an inverter INV. The output n2 is the output of the exponent part $OP_e$. The input $B_{bias2}$ is connected to a third input of the word selector M3.

The mantissa part $OP_m$ has five inputs, i.e. $v_{2i}$, $v_{1i}$, $a_1$, $a_2$ and $a_3$. All the inputs are connected to an input each of a word selector M4 having five inputs and an output n8. The output n8 is connected to the fourth input of the word selector M3 in the exponent part $OP_e$. The output n8 is also directly connected to one of three inputs of a word selector M5, to a second of the inputs of the word selector M5 through a negative shifter SH1, which is shifting the binary information on its input four steps towards the lower significant direction, i.e. dividing the binary information with 16, and to a third of the inputs through a positive shifter SH2, which is shifting the binary information on its input four steps towards the higher significant direction, i.e. multiplying the binary information on its input with 16.

The output n7 of the word selector M5 is directly connected to a first one out of six inputs of a word selector M6; through a negative shifter SH3, shifting the binary information on its input one step to the lower significant direction, to a second input; through a second negative shifter SH4, shifting to binary information on its input one step to the lower significant direction, to a third input; through a positive shifter SH5, shifting the binary information on its input one step to the higher significant direction, to a fourth input; and through a second positive shifter SH6, shifting the binary information on its input one step to the higher significant direction, to a fifth input. An internal constant word generator 41 generates a constant word $c_{word2}$ at control on its control input $c2_{10}$ and has its output connected to an individual input of the word selector M6. The constant word generator 41 can provide a group of predetermined combinations of zeros or ones, for instance all "0" or all "1" or a word indicating some particular information, controlled by a control signal $c2_{10}$ to the generator. The generator can store only a limited number of word combinations among which to chose with the control signal $c2_{10}$. The output of the word selector M6 is the output n1 of the mantissa part $OP_m$.

The mantissa part $OP_m$ implements the following function. The basic mantissa value on n8 is selected by the word selector M4 resulting in either $v_{2i}$, $v_{1i}$, $a_1$, $a_2$, or $a_3$. It could be used as it is or be shifted 1, 2, 3, 4, 5, 6 bits to the left (positive shifts) or 1, 2, 3, 4, 5, 6 bits to the right (negative shifts) or could be substituted by the word $c_{word2}$ provided by the constant word generator 41.

The exponent part $OP_e$ implements the following function. Its output could be either the unshifted mantissa value on n8, $v_{2i}+1$, inverted $v_{2i}+1$, $v_{2i}-1$, inverted $v_{2i}-1$, $B_{co-incr2}$, inverted $B_{co-incr2}$, $B_{co-decr2}$, inverted $B_{co-decr2}$, or $B_{bias2}$.

In the operand unit r2, the word selectors M2 to M6 are controlled individually by the control word c2 on the output c2 of the ALU control drive circuit 27. Thus, the word selector M2 is controlled by the part $c2_3$ of the control word c2, the word selector M3 by the part $c2_2$ of the control word c2, the word selector M4 by the part $c2_6$ of the control word, the word selector M5 by the part $c2_5$ of the control word, and the word selector M6 by the part $c2_4$ of the control word. Also, the shifters SH1 and SH2 connected to the output n8 of the selector M4 are controlled by the part signal $c2_8$, the shifters SH3 to SH6 by a part signal $c2_7$, the incrementer INC and the decrementer DEC by a part signal $c2_9$, the constant word generator 41 providing the output $c_{word2}$ by a part signal $c2_{10}$, and the 0/1 generator 40 by a part signal $c2_{11}$.

The bit group individual selector M1 is controlled by a combined multi bit signal including a part $c2_1$ of the control word, an output code signal $B_{cde2}$ from a precision decoder PD2, an output least significant bit signal $B_{1sb\,adj2}$, and an output exponent signal $B_{exp\,adj2}$, the two last-mentioned signals are derived in processing circuits 42A and 42B from outputs $B_{1sb2}$ and $B_{exp2}$, respectively, coming from the precision decoder PD2. The signals will be described and illustrated further below. The processing circuits 42A and 42B are controlled by the signal $c2_5$ being a part of the output c2 from the ALU control drive circuit 27. The precision decoder PD2 has the exp sign and code part of the information on the bus $v_{2i}$ as an input together with a binary control signal $c5_3$ from the ALU control drive circuit 27, indicating if the word on the bus $v_{2i}$ represents an integer or a floating-point value. The control signal $c5_3$ is a part of the output c5 from the ALU control circuit 27.

The precision decoder PD1 for the operand unit r1 works in an equivalent way. The signal $B_{1sb1}$, $B_{exp1}$ from the precision decoder PD1 are processed in processing circuits 43A and 43B providing the outputs $B_{1sb\,adj1}$ and $B_{exp\,adj1}$, respectively. The processing circuits 42A, 42B and 43A, 43B are mostly providing the same outputs as its inputs from the decoder to which it belongs. However, in some locations, when a carry has been provided from the incrementer INC or the decrementer DEC the output signals will be shifted, as will be described further below. This shift will be controlled by a part signal $c2_5$ or $c1_5$, respectively, of the output c2 or c1, respectively, from the ALU control circuit 27.

The precision decoder PD2 (or PD1) provides outputs which are all insignificant which for example is indicated by having the outputs to the processing circuits 42A, 42B (or 43A, 43B) provided with all zeros, if the word $v_{2i}$ represents an integer, and outputs of the kind described below as $B_{exp2}$, $B_{1sb2}$ and $B_{cde2}$ (or $B_{exp1}$, $B_{1sb1}$ and $B_{cde2}$, if the word $v_{2i}$ (or $v_{1i}$) represents a floating-point value.

FIG. 8

The bit group individual selector M1 is controlled to select parts of the information provided on the outputs n1 and n2 and from the generator 40, respectively. A word of the type shown in FIG. 3, i.e. representing a floating-point value, is illustrated in the upper part of FIG. 8 but in a split rectangular form showing how the bit groups can be formed. The references s, se, c, e, m, msb and lsb stands for sign, exponent sign, code, exponent, mantissa, most significant bit and least significant bit, respectively. Examples of split mosaic combination of the input information to the selector M1 is shown below the rod in rectangular form. The type of control is as usual in the data world expressed in mnemonics and examples of such mnemonics are shown to the left in FIG. 8.

Each mnemonic is naturally represented by a bit pattern including for instance 5 or 6 bits. The bit pattern is preferably provided on the control bus $c2_1$ to the selector M1 (an on the control bus $c1_1$ to the bus selector M1). The processing circuits 42A and 42B makes shifts of the signals $B_{1sb2}$ and $B_{exp2}$ coming from the precision decoder if appropriate to provide the signals $B_{1sb\,adj2}$ and $B_{exp\,adj2}$, respectively to the control input of the selector M1. The selector M1 is thus controlled by several signals provided on its input, but reacts to certain bit combinations of the incoming combined control signal going through a boolean gate array, each combination providing a particular combination of combined output from the inputs n1, n2 and output from the 1/0-circuit 40, as apparent from FIG. 8.

DIFFERENCES BETWEEN THE OPERAND UNITS r1 AND r2

As mentioned, the operand unit r1 has practically the same configuration as the operand unit r2. The differences between the two operand unit r1 and r2 are the following: the inputs $v_1$ and $v_2$ have changed place. The constant $c_{word1}$ is independent of the constant $c_{word2}$. The circuit r1 is controlled by the control output c1, divided into the individual control word parts $c1_2$ to $c1_{11}$, of the ALU control drive circuit (instead of by the control output c2) and is controlled by the precision decoder PD1 having $v_{1i\,se\,cli}$, that is the exp. sign and the code part of $v_{1i}$ as an input (instead of by the precision decoder DP2 having $v_{2i\,se\,cli}$, that is the exp. sign and the code part of $v_{2i}$ as an input).

The precision decoder PD1 provides the output signals $B_{co-decr1}$, $B_{co-incr1}$, $B_{bias1}$, $B_{exp1}$, $B_{1sb1}$, $B_{mab1}$, and $B_{cde1}$ to the operand unit 41 and a signal $B_{co\,max1}$ indicating if the code represents a maximum length of the exponent, and a signal $B_{co\,min1}$ indicating if the code represents a minimum length of the exponent to the ALU control drive circuit 27. The precision decoder PD2 provides the output signals $B_{co-decr2}$, $B_{co-incr2}$, $B_{bias2}$, $B_{exp2}$, $B_{1sb2}$, $B_{mab2}$, and $B_{cde2}$ to the operand unit 42, and a signal $B_{co-max1}$ indicating if the code represents a maximum length of the exponent, and a signal $B_{co-min1}$ indicating if the code represents a minimum length of the exponent to the ALU control drive circuit 27. The outputs $B_{1sb}$, $B_{exp}$ from the precision decoder PD1 or PD2, respectively, must be shifted in the same way as the mantissa is shifted in order to let the new precision be reflected on the outputs and during the normal shifts, which is made by the control of the circuits 42A and 42B or 43A and 43B under control of a part of the signal $c2_5$ or $c1_5$, respectively, as described above.

Each precision decoder is fed with a signal $c5_3$ on its input indicating if the word on the input bus $v_{1i}$ or $v_{2i}$, respectively, represents an integer or a floating-point value. The signal $c5_3$ is a part of the signal from the output c5 of the ALU control drive circuit 27 controlling the circuits 23 to 30.

The output signals from the precision decoder will be described in further detail below.

MULTIPLICATION AND DIVISION, OPERAND UNIT r3

The third operand unit r3, the multiplicand/quotient function unit, is of another kind than the units r1 and r2 and is provided mostly for multiplication and division operations. The unit r3 performs the shift and setting necessary during the multiply and divide functions. It is controlled by a control word provided on the output c3 of the ALU control unit 27.

The multiplicand/quotient unit r3 has several inputs, of which a first is provided with the information on the bus $v_{2i}$, a second with the information on the bus $v_{3i}$ and a third with an output from a constant word generator 44, providing a chosed bit combination among several stored in the generator at control of a part signal $c3_4$ of the output c3 from the circuit 27.

The unit r3 is used to evaluate one argument during complex numerical instructions. Its output is connected to the bus $v_{3out}$.

The input $v_{2i}$ is fed to a first input of a word selector M11. The input $v_{3i}$ is fed directly to a second input of the word selector M11, to a third input thereof through a positive one bit shifter SH11 controlled by a signal part $c3_5$, to a fourth input thereof through a first negative one bit shifter SH12, and to a fifth input thereof through a second negative one bit shifter SH13 the two last mentioned bit shifters being controlled by the signals $c3_3$, $B_{msb1}$, $N_{1ab1}$. The output of the generator 44 is connected to a sixth input of the word selector M11. The output of the word selector M11, to be provided to an input of a second word selector M12, is chosen by a control word part $c3_2$ of the control word c3 from the ALU control unit 27.

M12 is a bus connection providing the output of the selector M11 to the output bus $v_{3out}$ but which is able to be controlled to a switched off condition by a control word part $c3_1$, as will be described below.

A buffer circuit 26' is connected to the bus $v_{0i}$. The circuit 26' is a bus connection providing $v_{0i}$ to its output but which is able to be controlled to a switched off condition by a control word c4 from the ALU control circuit 27. Thus, the output $v_{0out}$ of the circuit 26' has normally the same information as the bus $v_{0i}$.

SELF TEST OF THE NUMERIC ALU

A so called polynome generator 31 could be provided. The polynome generator generates test codes for the ALU for self testing purposes. The generator 31 uses an entire closure including all informations on the buses $v_{0i}$, $v_{1i}$, $v_{2i}$, $v_{3i}$ as argument and provides values for the goal registers to buses $v_{0out}'$, $v_{1out}'$, $v_{2out}'$, $v_{3out}'$.

When a self test is made, the ALU control unit 27 controls the buffer circuit 26' with the signal c4 and the selector M1 in the operand unit r1 with the signal $c1_1$, the selector M1 in the operand unit r2 with the signal $c2_1$, the selector M12 in the operand unit r3 with the signal $c3_1$ to switch off the outputs on the buses ($v_{0out}$, $v_{1out}$, $v_{2out}$, and $v_{3out}$, respectively), and switches on the polynome generator outputs, which are normally switched off. In this way it is the polynome generator outputs $v_{0out}'$, $v_{1out}'$, $v_{2out}'$, $v_{3out}'$ which have switched on information to be provided to the in/output buses $v_0$, $v_1$, $v_2$, and $v_3$ instead of the outputs on the buses $v_{0out}$, $v_{1out}$, $v_{2out}$, and $v_{3out}$ from units 26', r1, r2 and r3.

THE TRISTATE DRIVER 39

The output buses from the internal circuits 26', r1, r2 and r3 and the output buses $v_{0out}'$, $v_{1out}'$, $v_{2out}'$, $v_{3out}'$ of the polynome circuit 31 are connected to different inputs of an output tristate driver 39. The tristate driver 39 has approximately the same configuration as the buffer 20 shown in FIGS. 7A to 7C and is controlled by the output c4 of the ALU control drive circuit to either have internal buffers from the internal circuits switched on, i.e. being transmissive, and the internal buffers for the output buses of the polynome circuit 31 switched off, i.e. being blocking, which is the normal condition, or the other way around in case of test cycles.

FIG. 9 AND THE PRECISION DECODERS PD1 AND PD2

FIG. 9 illustrates an embodiment of the output signals from a precision decoder for an example of a word representing a floating-point value on an input bus $v_{1i}$ or $v_{2i}$. The output of the precision decoder for floating-point values will be described in connection with this example.

The arguments of the precision decoder to be described further below are the exponent sign and the code part described by the floating-point value, and control signals indicating that the word represents a floating-point value are provided. It is a 1+4 bit wide.

Different codes in the code bit field correspond to different precisions (mantissa lengths and thus exponent lengths). The least significant group 1sb (see FIG. 8) of the exponent is varying with the precision. This group is the one having the bit pattern 0100 in the exemplifying word in FIG. 9. The binary signal $B_{1sb}$ has one bit per precision group, i.e. eight bits and has "0" for all groups except for the least significant precision group.

A code and its inverted form represents the same precision where corresponding exponent signs are comlementary, as illustrated in tabular form below.

| group for lsb | code, incl leading exponent sign | |
|---|---|---|
| 0 (incl. lsb of the word) | not used | not used |
| 1 | 1 1111 | +0 0000 |
| 2 | 1 1110 | +0 0001 |
| 3 | 1 1101 | +0 0010 |
| 4 | 1 1100 | +0 0011 |
| 5 | 1 10-- | +0 01-- |
| 6 | 1 0--- | +0 1 |
| 7 (incl. msb of the word) | not used | not used |

The code shown in the table above has the sign of the exponent as one element. When this element is true all other bits are used as such, but when it is false they are inverted.

As mentioned above, the precision decoder provides successions of booleans, i.e., several output words, which are fed to different units in the ALU, such as to the operand units, the ALU control drive circuit etc. For a word representing a floating-point value the signal $B_{lsb}$ could only provide a true bit for one of the groups 1 to 6, the rest of the bits being false bits. For group 0 and 7 a false bit is always provided.

A succession of eight booleans (one for each precision group) indicates with a true bit the precision groups which belong to the code/exponent part, as illustrated at the side of $B_{exp}$ in FIG. 9.

There are in the example shown three possible positions of the most significant exponent bit because of the varying code length. As shown in FIG. 9 $B_{msb}$ is here three booleans indicating which one of the positions having a true bit (the others being false bits). Thus, $B_{msb}$ is 001 in the shown example indicating that the code length is maximal, such as for the groups for lsb 1 to 4 (see the table above), 0.010 should indicate the group 5 and 100 the group 6.

In the example in FIG. 9 $B_{cde}$ is eight booleans corresponding to all bits in the two most significant precision groups. $B_{cde}$ is true ("1") from the least significant code bit to the exponent sign.

$B_{bias}$ is here a 32-bit word used for adjustment of the floating-point value representation. All bits are false ("0") except the least significant exponent bit.

The precision decoder also provides incremented and decremented codes $B_{co\ incr}$ and $B_{co\ decr}$, respectively, which are used in some operations when precision is altered. Only the first bits extended over the exponent sign and the code part of the word are shown for the signals $B_{co\ incr}$ and $B_{co\ decr}$. However, the word is preferably 32 bits long. The rest of the bits are preferably all "0".

Two booleans $B_{co\ max}$ and $B_{co\ min}$ indicate if the code represents a maximum or a minimum length of the exponent. In the example shown in FIG. 9 the least significant exponent bit is provided in the group 4. Then both booleans $B_{co\ max}$ and $B_{co-min}$ are "0". If the least significant exponent bit had been provided in the group 1, then $B_{co\ min}$ had been a "1", and if it had been provided in group 6, then $B_{co\ max}$ had been a "1".

The signals exemplified in FIG. 9 are signals provided in the case of a floating-point value. For an integer the signals $B_{lsb}$, $B_{exp}$, $B_{msb}$, and $B_{cde}$ are all false, i.d. have only "0":s. It is to be noted that it is, of course, possible to use another set of bit combinations to indicate an integer; the condition for it is that a quite particular bit combination for these signals represents an integer.

An embodiment of the precision decoder will be described in connection with FIG. 13.

EXAMPLE OF ADDITION OF FLOATING-POINT VALUES

Above an example of a multiplication operation for integers were given in connection with the description of FIG. 2. Here an example of an addition operation of two floating-point values will be given in order to illustrate the function of the ALU according to the invention.

As mentioned the continuous coding scheme has no redundancy, i.e. there is no data added for error detection purposes. Therefore the normal operations as alignment and precision adjustment are not possible in a direct way. Three state are included in the information on $v_{0i}$ in order to solve this problem. They define how the operands on the buses $v_{1i}$ and $v_{2i}$, below called the a-operand and the b-operand, are coded. The three states are:

N none of the a- or b-operands has an altered code, they are both normalized.

A the a-operand has an altered code, it is not normalized.

B the b-operand has an altered code, it is not normalized.

INTERPRETATION OF THE MANTISSA, FIG. 10

FIG. 10 illustrates an example of the interpretation of a bit series 1010 of the mantissa for a normalized code and for an altered code. A virtual 1 is provided for the normalized code, which gives the result 1.625, while no virtual bit is provided for the altered code, which gives the result 0.625.

FIGS. 11 AND 12, ALIGNMENT

The first step of a continuous addition, i.e. addition of two floating-point values, is to align the operands on the input buses, if the exponents are not equal. If the values a and b are to be added, and $a=1.5*2^{31}$ and $b=-1.125*2^{33}$, the value a has a smaller exponent than the value b and thus has to be aligned before the actual adding operation, as is illustrated in FIGS. 11 and 12 showing a first and a second alignment cycle for the exemplifying value a.

The illustrative example is chosen such that three cases are used for aligning the two operands. The exponent of the value a is increased by 1 and its mantissa is divided by two (shifted one step to lower significance). This is done twice in order to have the same exponent (33) as the value b.

The example is chosen such that three cases are used for aligning the two arguments:

1. The initial value in an alignment cycle is represented by a binary combination in which the exponent value is the highest possible for the code c and the exponent sign is negative. Note that there is no difference in the precision of a number whether the sign of the exponent is positive of negative. When stepping the exponent the precision must be increased. The exponent part is added by one then the mantissa is shifted left an appropriate number of steps.

2. The exponent value of the initial value in an alignment cycle is the highest possible for the code c in this cycle, and the exponent sign is positive. When stepping the exponent the precision must be decreased. The exponent part is added by one, then the mantissa is shifted right an appropriate number of steps.

3. The exponent value of the initial value of the alignment cycle is not the highest possible. The exponent is stepped and the mantissa is divided by 2.

In the first alignment cycle of the value a in the example, i.e. changing from the bit representation above to the bit representation below in FIG. 11, the precision code is incremented one bit to the right, due to the fact that when the exponent is incremented and it is maximal, i.e. including all "1":s, a carry is propagated into the precision code, which also is incremented. Thereafter the code is interpreted as being greater than one bit longer (see the code in group 5 in the table above). This means in practice that the exponent length is decreased one bit at its left hand side and increased one precision group (4 bits) at its right hand side. The exponent value is also incremented by one. The mantissa is first shifted four steps to the right (precision decreased) and then shifted one step to the right (divided by two). When the mantissa group is shifted one step to lower significance the virtual "1" is shifted into the mantissa part, which thus has the digital combination 1100 in its most significant precision group after the first alignment cycle.

HARDWARE EXECUTION OF THE ALIGNMENT

This operation is done in one cycle in the ALU in the operand unit r1, if the value a is provided on the bus $v_{1i}$. The exponent value is the highest possible for the representation of the original value a. The exponent sign is positive, which means all exponent bits being 1. When the exponent is incremented by the incrementer INC, all bits become 0 and the incrementer INC feeds a carry $gr_{i1}$ to the ALU control drive circuit 27, which changes the binary output part signals $c1_5$ such that it controls the processing unit 43A and 43B to make a shift to the left of the signals coming form the precision decoder PD1. The carry $gr_{1i}$ is also transferred into the code part as mentioned above.

The same kind of discussion is due for the decrementer DEC, in case a decrementation is to be made, but is a carry $gr_{dj}$, j being 1 or 2, is provided then the part signal $cj_5$ controls the processing unit 43A and 43B or 42A and 42B, respectively, to make a shift to the left (*2). It is to be noted that the incrementers and decrementers are providing their outputs during the first part of the first half period of the clock signal, and thus control signals can be provided to the processing units early in this half period. The control of the selectors of all the operand units is provide during the late part of this first half period of the clock signal. The outputs from the precision decoder are not changed during the later part of the clock cycle. They are stabilized as soon as the internal input buses $v_{0i}$, $v_{1i}$, $v_{2i}$ and $v_{3i}$ have stable values. As mentioned above, in the first half of the clock cycle the input buffers in the bus connection 20 let data from the external buses $v_0$, $v_1$, $v_2$ and $v_3$, respectively, come through, while the output buffers isolate the output data from the operand units from the external bus. In the second half of the clock cycle the input buffers holds the values on the internal input buses $v_{0i}$, $v_{1i}$, $v_{2i}$ and $v_{3i}$, while new output data is transferred to the external bus. This means that the precision decoders are influenced by new output data only in the next clock cycle.

The mantissa is shifted one precision group to the right by the shift right one precision group unit SH2 (i.e. dividing with 16) in the operand unit r1. The least significant exponent precision group is indicated by a bit vector signal $B_{lsb1}$ provided by the precision decoder PD1. The shift is performed by the processing unit 43A and 43B to the right of this group. In order to shift the mantissa one step further from a new position by the shift one unit SH5 (dividing by 2), the $B_{lsb1}$ vector signal is adjusted to the right by the unit 43A and 43B. The adjusted vector signal $B_{lsb\ adj1}$ is used to select the output from the mantissa part $OP_m$ and the exponent part $OP_e$. An extra group of four "0" from the circuit 40 is inserted in r1 as the new least significant precision group in the exponent part in order to complete it (see FIG. 8 cef m/cet_m).

The bit value "1", being the virtual bit in a normalized code, is shifted into the new most significant mantissa position, which corresponds to division of a normalized positive mantissa $((1.0+m)/2)$. The new mantissa is not normalized and the value a therefore gets an altered code (having a "0" as virtual bit between the exponent and mantissa areas).

In the second alignment cycle, shown in FIG. 12, there is no need to alter the precision, i.e. the number of bits in the exponent does not have to be changed. The exponent is just incremented with "1" and the code c remains unaltered. No carry signal is provided to change the code, because the exponent is not the highest possible in the precision state of the original value of this alignment cycle.

The mantissa is shifted one step to the right (SH5). Since the shift now is provided from an altered code, no virtual "1" is present between the exponent and the mantissa part, a virtual "0" is shifted in and the digital combination in the most significant precision group will be 0110. Thus, after alignment the value a has an altered code and is represented as $0.375*2^{33}$.

The second step of the continuous addition is to normalize the arguments, not the result of the addition, in order to get a normalized mantissa. The result of $a+b$ is $0.375*2^{33} - 1.125*2^{33} = -0.750*2^{33}$ which is not a normalized result. Thus, an argument normalization will follow after the addition which gives the normalized sum $-1.5*2^{32}(=2*(-0.750*2^{33}/2))$.

The multiplication of floating-point values is performed analogous to the multiplication of integers described above in connection with the description of FIG. 2. However, two bits are used in order to reduce the time delay instead of only one bit.

During the multiplication loop the equality for the mantissas is $sma*smb = smv_{1i} + smv_{2i}*smv_{3i}$, where sm indicates that it is the true signed mantissa value composed by the sign, a virtual bit and the mantissa bits.

The word $v_{1i}$ has no exponent sign, precision code or exponent value during the loop. Instead its mantissa is longer than the actual precision of the operation. Leading bits of the mantissa are coded in such a way that the entire word $v_{1i}$ is discrete value equal to the partial mantissa. The sign bit has the correct value of the product.

The word $v_{2i}$ is the multiplicand. It is not altered.

The word $v_{3i}$ has the original exponent sign, precision, and exponent value. However, the mantissa is appended to the sign-bit to form a precision which is one bit longer than the mantissa part of the word. The mantissa is in this case coded as a discrete value without sign-bit. The sign-bit could be derived from the sign of the word $v_{1i}$.

During the multiplication loop the word $v_{1i}$ is shifted right. The word $v_{3i}$ is also shifted right two bits each turn (SH13). When all bits in $v_{3i}$ have been consumed, the loop is final. The result is then normalized.

It is believed that a person skilled in the art could be handed by the ALU outgoing from the exemplifying descriptions of its operation given above.

FIG. 13, PRECISION DECODER

Figure 13:
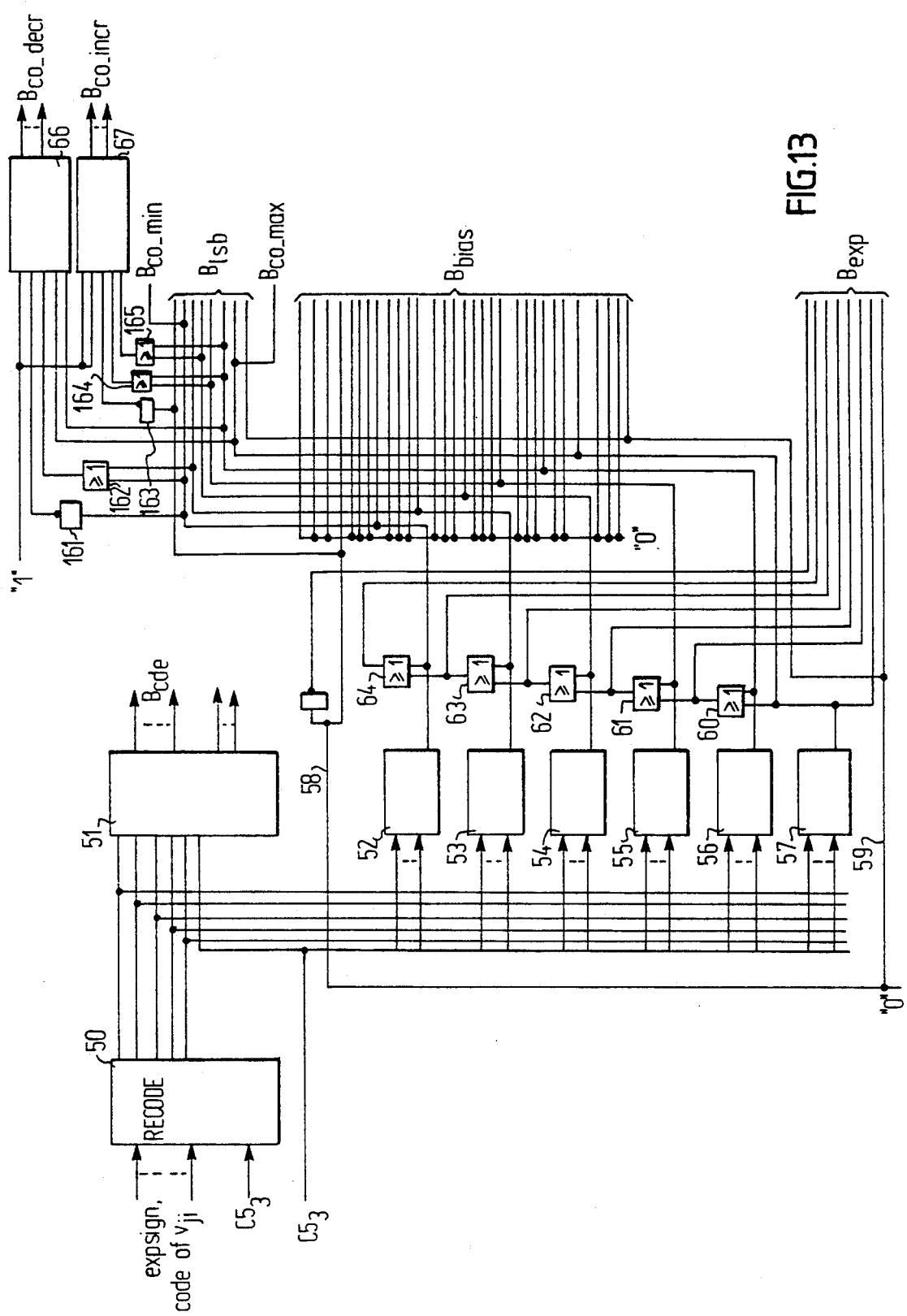
FIG. 13 is a circuit diagram of an embodiment of a precision decoder included in the circuit shown in FIG. 6.

The structure in principle of a precision decoder is shown in FIG. 13. It is to be noted that modifications could be made in the shown structure, for instance in order to speed up the calculation rate. These are just constructional features and are apparent for a man skilled in the art and will therefore not be described here. This means that the actual circuit could have quite another configuration than that shown in FIG. 13, but that it will have the principle function as apparent from that Figure.

The exponent sign and code part of the input signal $v_{ji}$, where j is either 1 or 2, is fed to a recode circuit 50, which in this principle type of embodiment of the precision decoder at its output provides one of the variants of the code including the leading exponent sign shown in the table above, for instance the left one, whatever of the variants is provided on its input. Alternatively, both variants could be provided on the output of the recode circuit 50, but always in the same order, for instance the left variant in the table above on lines alotted to it, and the right one on lines alotted to it. The output is fed to a bit sequence comparator circuit 51, which monitors the bit combination on its input and provides the digital signal $B_{msb}$ indicating the bit length of the code, see FIG. 8, i.e. whether it is one, two or three bits long in the chosen example. It also provides the signal $B_{cde}$.

Six bit sequence comparator circuits 52 to 57 are also connected to the output of the recode circuit 50 each one being adapted to react to its particular coding to provide a "1" in the output if the bit pattern on the output wires from the recode circuit 50 is the same what it is adapted to react upon to provide an output "1" instead of its normal output "0". As apparent from FIG. 8 only one of the circuits 52 to 57 at the time is providing a "1", i.e. a true-signal, the others are providing the output "0", i.e. a false-signal. The first and the last bit in the signal $B_{1sb}$ are always a "0". Therefore, two wires 58 and 59 are connected directly to a wire having the bit "0".

The wire 58, the outputs from the circuits 52 to 57 and the wire 59 are providing the bus $B_{1sb}$, which has one bit per precision group. The bus $B_{bias}$ has four bits per precision group. Each group includes three bits "0" and the bit of the signal $B_{1sb}$ for that particular group. Thus three of the wires of each group is connected to "0" and the fourth to the appropriate wire of the output $B_{1sb}$. The output $B_{co-min}$ is connected to the output of the circuit 52, and the output $B_{co\,max}$ is connected to the output of the circuit 57.

The bit pattern of the output $B_{exp}$ includes "0":s in the least significant positions up till the position wherein the output $B_{1sb}$ has a "1", and thereafter all bits are "1":s. The least significant bit which is on the wire 59 will always be a "0", but from the next least position there is a possibility for a bit "1". Therefore, an OR-gate 60 has one input connected to the output of the circuit 57 and the other to the output of the circuit 56. The output of the circuit 57 is connected to the next least position wire of the signal $B_{exp}$. The output of the OR-gate 60 is connected to the second next least position wire of the output $B_{exp}$. Thus, if the output of the circuit 57 should happen to be a "1", then this will provide an output bit "1" from the OR-gate 60 as well. The output from the OR-gate 60 will be "0" only if the outputs from both the circuits 57 and 56 are "0". The output of the OR-gate 60 is connected to a first input of another OR-gate 61 having its other input connected to the output of the circuit 55. The output of the OR-gate 61 is connected to the third least position wire of the output $B_{exp}$ and to a first input of an OR-gate 62 having its other input connected to the output of the circuit 54, etc. This kind of cascade coupling of OR-gates provides "1":s in all positions having the same or hither significance than the position giving a "1" in the output $B_{1sb}$.

The sign, exp sign and code part of the word $B_{co\,decr}$ has its first wire connected to a unit providing a "1", its second to an inverter 161 connected to the sixth wire of $B_{1sb}$, its third to an OR-gate 162 having its inputs connected to the fifth and sixth wires of $B_{1sb}$, and its fourth and fifth wires connected directly to the second and third, respectively, wires of $B_{1sb}$. These wires for the sign, exp sign and code part of the word $B_{co\,decr}$ are connected to the input of a bit completing circuit 66 adding "0":s to the incoming word in order to provide a 32-bits word on its output.

The sign, exp sign and code part of the word $B_{co\,incr}$ has its first and second wires connected to a unit providing a "1", its third to an inverter 163 connected to the seventh wire of $B_{1sb}$, its fourth to an OR-gate 164 having its inputs connected to the third and fourth wires of $B_{1sb}$, and its fifth wire connected directly to an OR-gate 165 having its inputs connected to the third and fifth wires of $B_{1sb}$. These wires for the sign, exp sign and code part of the word $B_{co\,incr}$ are connected to the input of a bit completing circuit 67 adding "0":s to the incoming word in order to provide a 32-bits word on its output.

FIGS. 14A TO 14C, ADDER

Figure 14A:
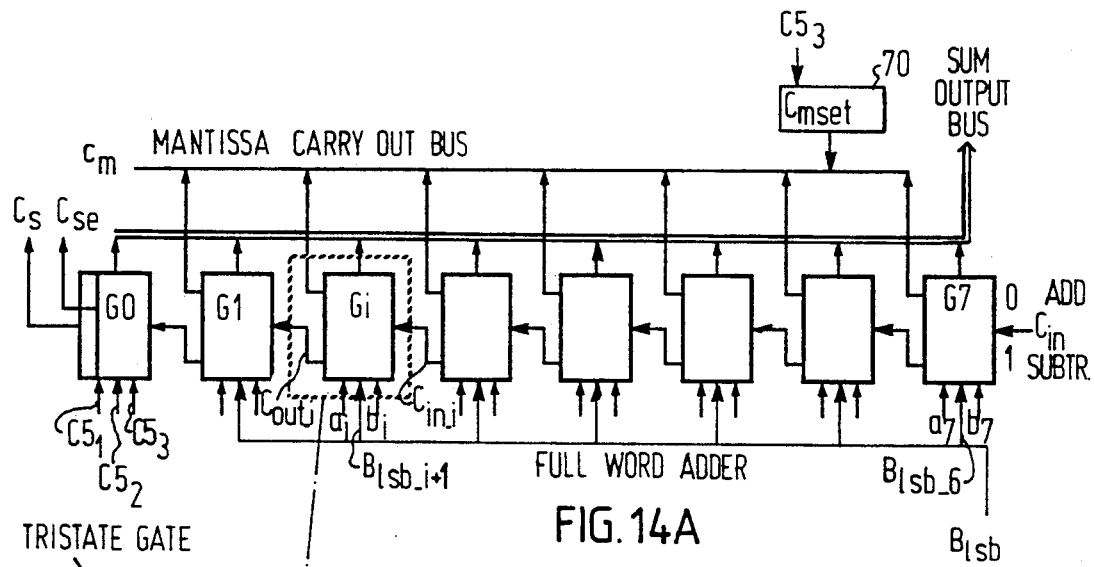
FIG. 14A shows a block diagram of an embodiment of a full word adder in the circuit shown in FIG. 6.
Figure 14B:
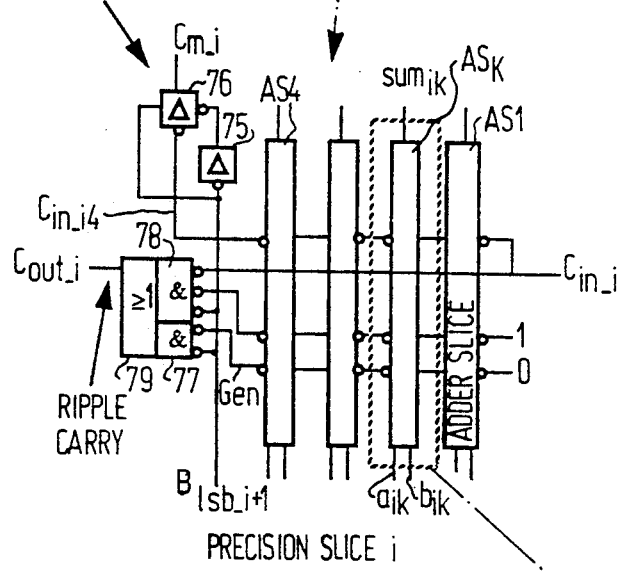
FIG. 14B shows a block diagram of a precision slice in the adder in FIG. 14A.
Figure 14C:
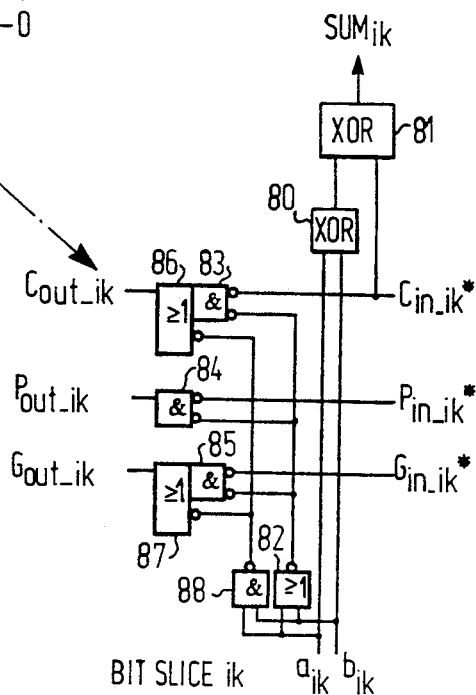
FIG. 14C shows a block diagram of a bit slice in the precision slice in FIG. 14B.

An embodiment of an adder, such as one of the circuits 28 to 30 in FIG. 6 is shown in FIGS. 14A to 14C. The adder has two arguments a and b. The argument a is provided on the bus $v_{1i}$ and the argument b on the bus $v_{2i}$. These arguments are coded either as floating-point values or as integers. The signal $c5_1$, being "0" for integer and "1" for floating-point value, of the output c5 from the circuit 27 in FIG. 6 and the buses $B_{1sb1}$ and $B_{1sb2}$, having all bits "0" for an integer and having one of the bits "1" for a floating-point value, indicate this fact. As shown in FIG. 14A the adder is a binary adder built in 8 cascade coupled sections G0, G1, . . . , Gi, . . . , G7, i.e. one section for each precision group.

As apparent from the description above of an addition operation it is essential to align the arguments a and b before they can be added in case of a and b being floating-point values. This means that $B_{1sb1}$ and $B_{1sb2}$ must be equal. $B_{1sb1}$ is fed as the signal $B_{1sb}$ to control the adder. The signal $B_{1sb}$ is displaced one step in the direction toward the mantissa when it is connected to the adders, increments, decrementers, etc., because then it could influence the carry propagation (block it) at the most significant mantissa group. Therefore, the least significant bit in the signal $B_{1sb}$ is not used in these cases.

The arguments a and b, each including 32 bits, are divided into eight groups each including 4 bits. Each group of four bits of a and b is provided as a separate input of an individual section Gi, i being an integer between 0 and 7. Each wire of the bus $B_{1sb}$ is connected to an individual of the sections Gi, except to G0. A wire $c_{in}$ to the section G7 indicates if the adder shall make an addition or a subtraction. $c_{in}$ is "0" for addition and "1" for subtraction. Each section provides a carry signal $c_{out\ i}$ to be fed to the next section and is fed with a carry signal $c_{in\ i}$ coming from the next preceding section, it will be described more in detail below.

The addition of the arguments a and b is made individually in each section G0 to G7 providing carry signals to the next section in the order G7 to G0, if necessary. For a floating-point value a mantissa carry out bus $c_m$ is provided to which a mantissa carry out is provided if necessary. This bus together with the wires $c_s$ having the sign bit and $c_{se}$ having the exponent sign bit form the input $gr_{a1}$ (or $gr_{a2}$ or $gr_{a3}$) to the circuit 27 in FIG. 6. The circuit 27 provides this information to the control unit CU on the bus $A_{STATE}$.

The signal $c5_1$ indicates if the arguments a and b are integers or a floating-point values, the signal $c5_2$ indicate if the code is normal or altered for the argument a, and the signal $c5_3$ indicate if the code is normal or altered for the argument b. These signals are fed to the section G0, which corresponds to the most significant precision group including the most significant bit slice (the sign slice). This is in particular dependent upon the format of the operands a and b (whether they both are integers or floating point values).

A tristate gate 70 is provided to set the bus $c_m$ to a defined value, for instance all "0" when the operands are integers, since then no mantissa carry is activated on the bus. The tristate driver 70 is controlled by the signal $c5_3$.

An embodiment of a configuration of a section G1 is shown in FIG. 14B. It is "sliced" into four adder slices AS1 to AS4. It also contains a carry generator for the section which evaluates the carry $c_{out\ i}$ for the next section. Each bit group $a_i$ and $b_i$ for the section Gi in question, has an individual of the bits $a_{ik}$ and $b_{ik}$, respectively connected to each individual adder slice ASk, k being an integer between 1 and 4. Each adder slice provides one bit $sum_{ik}$ of the sum output.

As will be described more in detail in describing FIG. 14C the carry generator is provided with a generate bit Gen indicating that the sum of the section is greater than or equal to 16, a propagate bit Pr indicating that the sum of the section is greater than or equal to 15, the carry bit from the next preceding section $c_{in\ i}$, a carry in bit $c_{in\ i4}$ from the adder slice AS4, and the bit $B_{isb-i+i}$. The bit $B_{1sb-i+1}$ is fed through an inverter 75 to an inverted input of a tristate gate, and directly to the control input of the tristate gate 76. The bit $c_{in\ i4}$ is connected to a second inverted input of the tristate gate 76. Thus, when the bit $B_{1sb-i+1}$ is "0" then the tristate gate 76 is controlled to transmit the bit $B_{1sb-i+1}$. However, when the bit $B_{1sb-i+1}$ is "1" then the tristate gate 76 is controlled to transmit the bit $c_{in\ i4}$ indicating that the mantissa has a carry out if it is a "1".

It is only necessary to provide a mantissa carry out for the precision group to the exponent part of the argument, and it is only this group having the bit $B_{1sb\ i+1}$ "1".

The carry propagation from section to section is blocked for the precision group next to the exponent part. Thus the bit $B_{1sb\ i+1}$ is connected to an inverted input of an AND gate 77 having the inverted signal Gen on its other inverted input and thus transmitting the signal Gen only when $B_{1sb\ i+1}$ is "0". The bit $B_{1sb\ i+1}$ is also connected to an inverted input of an AND gate 78 having the inverted signal Pr on a second inverted input and the bit $c_{in\ i}$ on a third inverted input and thus transmitting the signal Pr only when $B_{1sb\ i+1}$ is "0" and $c_{in\ i}$ is "0". An OR gate 79 has its inputs connected to the outputs of the AND gates 77 and 78 and is providing an output "1" when one of the AND gates has an output "1".

An embodiment of each adder slice ASk is shown in FIG. 14C. The inputs $a_{ik}$ and $b_{ik}$ are fed to an input each of the EXCLUSIVE OR gate 80 providing a "1" if the inputs are different from each other, otherwise a "0". The output of the EXCLUSIVE OR gate 80 is fed to a first input of a second EXCLUSIVE OR gate 81 and the bit $c_{in\ ik}$ to it other input. The output of the EXCLUSIVE OR gate 81 is a "1" only if its inputs are different, and provides the output $sum_{ik}$ taking care of the carry bit from the next preceding adder slice, or if the adder slice is first in the section, the carry bit from the next preceding section.

The bits $a_{ik}$ and $b_{ik}$ are fed to the inputs of an OR gate 82 having an inverted output, which in turn is connected to a first inverted input of each of three AND gates 83, 84, 85. The inverted bit $c_{in\ ik}*$ is fed to a second inverted input of the AND gate 83 transmitting the bit $c_{in\ ik}$ if any of the bits $a_{ik}$ and $b_{ik}$ is a "1". The inverted bit $P_{in\ ik}*$ from the next preceding adder slice is fed to a second inverted input of the AND gate 84 providing the bit $P_{out\ ik}$ being $P_{in\ ik}$ if any of the bits $a_{ik}$ and $b_{ik}$ is a "1". The inverted bit $G_{in\ ik}*$ is fed to a second inverted input of the AND gate 85 transmitting the bit $G_{in\ ik}$ is any of the bits $a_{ik}$ and $b_{ik}$ is a "1". The bit $P_{in\ ik}$ and the bit $G_{in\ ik}$ are "1" and "0", respectively for each first adder slice AS1 in each precision section, as apparent from FIG. 14B.

The bits Pr and Gen are needed in order to realize ripple carry, i.e. make the adder faster. By the fact that there are discrete values on the inputs of the carry chains all the precision groups are computed in parallel, i.e. simultaneously for all precision groups. The last carry $c_s$ from the addition will have only 4+8 gate delays to be compared to 32 gate delays without ripple carry.

The bits $a_{ik}$ and $b_{ik}$ are also fed to the inputs of an AND gate 88 having an inverted output, which in turn is connected to a first inverted input of each of two OR gates 86, 87. The output of the AND gate 83 is connected to a second input of the OR gate 86 providing the output $c_{out\ ik}$. The output of the AND gate 85 is connected to a second input of the OR gate 87 providing the output $G_{out\ ik}$.

In order to provide very fast carry chains it is possible to have only one delay in them if a bit slice is inverting the polarity of the rippling generate and propagation bits are inverted. Thus, in such a case every second precision group section has inverted inputs (not shown).

As apparent from the left side in FIG. 14A the most significant precision section G0 is slightly different from the other sections. It does not use an input argument $B_{1sb-0}$. It is assumed being "0" within the group. Instead it has the mantissa carry input $c_{in\ m}$. It is used to generate the carry input to the sign bit. The output has one extra bit indicating the carry out from the exponent. The normal carry out is generated as in the normal groups except that $B_{1sb\ 0}$ is assumed to be a "0", i.e. false.

The one bit signals $c5_1$, $c5_2$, $c5_3$ could have the following bit patterns: $(c5_1, c5_2, c5_3)=$(false,false,false) means integer: $(c5_1,c5_2,c5_3)=$(false,false,true) means both a and b having normalized code; $(c5_1,c5_2,c5_3)=$(true,false,false) means a having altered, be normalized code; $(c5_1,c5_2,c5_3)=$(true,true,true) means a having normal, b altered code;

FIG. 15

Figure 15:
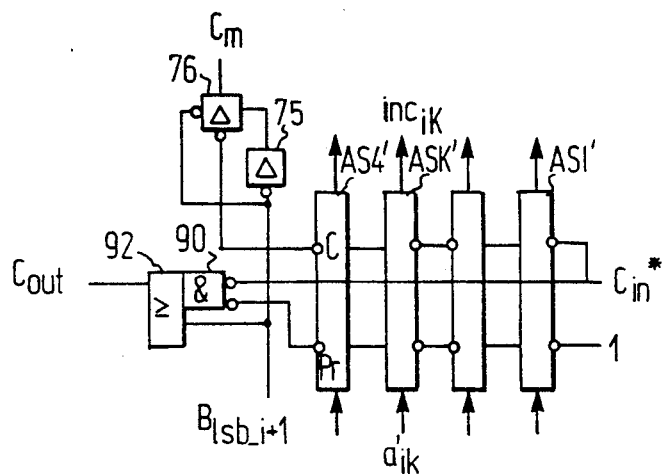
FIG. 15 shows an embodiment of a precision slice in an incrementer in the circuit shown in FIG. 6.

The configuration of the incrementer is very similar to the configuration of the adder. FIG. 15 shows an embodiment of a precision section in an incrementer. The incrementer has only one input a' (not shown). The increment bit slices AS1' to AS4' differs from the adder bit slices in that they have no generator bit Gen transferred from one to the other. The inverted output Pr from the slide AS4' and the inverted carry $c_{in}*$ from the next preceding section are fed to each one of two inverted inputs of an AND gate 90 with two inverted inputs. The carry in $c_{in}$ to the first section G7 on the line being an "1" is indicating that an increment is to be made. The output of the AND gate 90 and the bit $B_{1sbi+1}$ are fed to an input each of an OR gate 92 providing the output carry $c_{out}$ to the next section. The carry output of the incrementer is provided in the same way as for the adder. The ripple carry chain $c_{in}/c_{out}$ indicates if the sum is more than or equal to two. The ripple carry chain Pe' indicates if the sum is more than or equal to one.

As the adder the incrementer has a mantissa-carry-out bus $c_m$ controlled by the signal $B_{1sb\,i+i}$. The control bit c1g or c2g is indicating if the representation is an integer or a floating point value. The control bits c1g and c2g control a tristate gate which sets the mantissa-carry-out bus to a defined value when not used (not shown).

A decrementer has the same configuration as the incrementer, but the decrementer has an inverted input $a'_{in}*$ to its decrementer slices, corresponding to the incrementer slices AS1' to AS4'.

Figure 16:
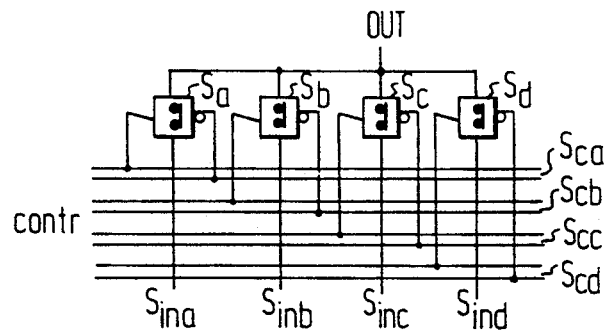
FIG. 16 shows a circuit diagram of an embodiment of a basic selector bit slice included in the selectors in the operand circuits in the circuit shown in FIG. 6.

The selectors in the operand units are generally built by a row of transmission gates. The selector has always a defined output. It has a list of control words and value inputs as arguments. All except one are off. The control of each input is a complementary signal. The entire selector is controlled by a list of such elements. They are controlled in the different state to take the input from a prescribed port. An embodiment of a basic selector bit slice is shown in FIG. 16. One of the bits of each input port to the selector $S_{ina}$, $S_{inb}$, $S_{inc}$ and $S_{ind}$ is connected to the input of a controllable switch $S_a$, $S_b$, $S_c$ and $S_d$, respectively. A pair of control wires $S_{ca}$, $S_{cb}$, $S_{cc}$, and $S_{cd}$, respectively, is provided for each switch. The control pair providing a transmit of the input to its belonging switch has the information "1,0", the others have the information "0,1".

It is to be noted that the majority of the circuits in the ALU are built in accordance with the principles described above in relation to the adder and that it therefore is believed that a person skilled in the art easily can construct the rest of the circuits using there principles. Therefore, it has not been deemed to be necessary to describe every single circuit in detail.

DESCRIPTION OF THE ALU DRIVE CIRCUIT

Appendix 1 shows the relation between inputs and outputs for alignment of exponents in addition of floating point values.

The appendix is divided into different "control cases". Each control case corresponds to one output, i.e. one micro instruction.

The output of the ALU drive circuit 27 which are listed under the heading "Micro instruction wires" are the signal levels on the buses C1–C5. The buses C1, C2 and C3 are divided into smaller buses $C1_1$, $C1_2$, $C1_3$ etc. connected to various points in the ALU.

Different sets of input can cause the same output. The alternative input signals that cause the same output are listed as condition 1, condition 2 etc. Thus, the inputs listed under the heading "control case 1" as "state, sense wires—condition 4" cause the outputs under the heading "micro instruction wires" below. The input listed as condition 1,2 and 3 cause the same outputs as Condition 4.

Each condition is defined by a certain combination of signal levels (0/1) on some state wires, while other state wires may have undefined values (X=do not care).

All the input signals listed in the appendices are also marked in FIG. 6, except for signals co_limit1 and co_limit2.

In FIG. 6 the signal co_limit1 is divided into its two components $B_{co-max1}$ and $B_{co-min1}$.

The signal co_limit2 is also divided into its two components $B_{co-max2}$ and $B_{co-min2}$.

The output $A_{STATE}$ is simply a copy of all the inputs to the circuit 27. The output $A_{STATE}$ is connected to the control unit CU.

Appendix 2 shows the relation between inputs to and outputs from the ALU drive circuit 27 when multiplication of integers is being executed.

The ALU drive circuit 27, shown in FIG. 6, is a boolean gate array of quite a complicated configuration. An embodiment of its can not be shown, because the configuration of its is calculated in a computer being provided with all the algorithms regarding the configuration of the control signals in relation to the informative signals. The boolean gate array is provided directly as chip mask patterns from the computer adapted to the configuration of the chip mask patterns for the whole ALU according to the invention. Thus this circuit is impossible to show in detail. A list on the relation between inputs to and for the cases integer multiplication and alignment of exponents in floating point addition.

While the invention has been described with reference to specific embodiments, it will be understood by those skilled in the art that various changes may be made and equivalents may be substituted for elements thereof without departing from the true spirit and scope of this invention. In addition, modifications may be made without departing from the essential teachings of the invention.

A value could be supplied by the goal register or G-register (not shown) or some of the ALU internal units as instructions operand/mul_quotient or polynome. The information regarding the kind of representation in the rest of the bit string on the bus could be given by the information in the instruction bus or could be given in the code field.

APPENDIX 1

Alignment of exponents in floating point addition control case 1
---------------- state, sense wires - condition 1

```
cmp_prec        0
cmp01           (X, X)
cmp12           (X, X)
cmp23           (X, X)
cmp_exp12       (X, 1)
insig1          ((X, X), (X, X), (X, X))
insig2          ((X, X), (X, X), (X, X))
insig3          ((X, X), (X, X), (X, X))
sign1           (0, 1, X, X)
sign2           (1, 0, X, X)
sign3           (X, X, X, X)
gr_i1           (X, X, X)
c_ei1           X
gr_d1           (X, X, X)
c_ed1           1
co_limit1       (X, 0)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 0; 0; 0; 1]
``` state, sense wires - condition 2

```
cmp_prec        0
cmp01           (X, X)
cmp12           (X, X)
cmp23           (X, X)
cmp_exp12       (X, 1)
insig1          ((X, X), (X, X), (X, X))
insig2          ((X, X), (X, X), (X, X))
insig3          ((X, X), (X, X), (X, X))
sign1           (0, 1, X, X)
sign2           (0, 1, X, X)
sign3           (X, X, X, X)
gr_i1           (X, X, X)
c_ei1           X
gr_d1           (X, X, X)
c_ed1           1
co_limit1       (X, 0)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)
``` ins                 [0; 0; 0; 0; 1; 0; 0; 0; 1]

state, sense wires - condition 3

| | |
|---|---|
| cmp_prec | X |
| cmp01 | (X, X) |
| cmp12 | (X, X) |
| cmp23 | (X, X) |
| cmp_exp12 | (X, X) |
| insig1 | ((X, X), (X, X), (X, X)) |
| insig2 | ((X, X), (X, X), (X, X)) |
| insig3 | ((X, X), (X, X), (X, X)) |
| sign1 | (0, 1, X, X) |
| sign2 | (1, 1, X, X) |
| sign3 | (X, X, X, X) |
| gr_i1 | (X, X, X) |
| c_ei1 | X |
| gr_d1 | (X, X, X) |
| c_ed1 | 1 |
| co_limit1 | (X, 0) |
| gr_i2 | (X, X, X) |
| c_ei2 | X |
| gr_d2 | (X, X, X) |
| c_ed2 | X |
| co_limit2 | (X, X) |
| gr_a1 | (X, X, X) |
| gr_a2 | (X, X, X) |
| gr_a3 | (X, X, X) | ins                 [0; 0; 0; 0; 1; 0; 0; 0; 1]

state, sense wires - condition 4

| | |
|---|---|
| cmp_prec | X |
| cmp01 | (X, X) |
| cmp12 | (X, X) |
| cmp23 | (X, X) |
| cmp_exp12 | (X, X) |
| insig1 | ((X, X), (X, X), (X, X)) |
| insig2 | ((X, X), (X, X), (X, X)) |
| insig3 | ((X, X), (X, X), (X, X)) |
| sign1 | (0, 1, X, X) |
| sign2 | (0, 0, X, X) |
| sign3 | (X, X, X, X) |
| gr_i1 | (X, X, X) |
| c_ei1 | X |
| gr_d1 | (X, X, X) |
| c_ed1 | 1 |
| co_limit1 | (X, 0) |
| gr_i2 | (X, X, X) |
| c_ei2 | X |
| gr_d2 | (X, X, X) |
| c_ed2 | X |
| co_limit2 | (X, X) |
| gr_a1 | (X, X, X) |
| gr_a2 | (X, X, X) |
| gr_a3 | (X, X, X) | ins                 [0; 0; 0; 0; 1; 0; 0; 0; 1]

micro instruction wires c1

```
c1_1            (0, 1, 0, 0, 0, 0)
c1_2            [(0, 1); (0, 1); (1, 0); (0, 1)]
c1_3            [(0, 1); (0, 1); (1, 0); (0, 1); (0, 1)]
c1_4            [(0, 1); (0, 1); (0, 1); (1, 0); (0, 1); (0, 1)]
c1_5            [(1, 0); (0, 1); (0, 1)]
c1_6            [(1, 0); (0, 1); (0, 1); (0, 1); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]

c2
c2_1            (0, 0, 0, 1, 0, 0)
c2_2            [(0, 1); (0, 1); (1, 0); (0, 1)]
c2_3            [(0, 1); (0, 1); (0, 1); (0, 1); (1, 0)]
c2_4            [(0, 1); (0, 1); (1, 0); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
c3_2            [(0, 1); (0, 1); (1, 0); (0, 1); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 1)

control case 2
---------------- state, sense wires - condition 1 cmp_prec        0
cmp01           (X, X)
cmp12           (X, X)
cmp23           (X, X)
cmp_exp12       (X, 1)
insig1          ((X, X), (X, X), (X, X))
insig2          ((X, X), (X, X), (X, X))
insig3          ((X, X), (X, X), (X, X))
sign1           (1, 0, X, X)
sign2           (1, 0, X, X)
sign3           (X, X, X, X)
gr_i1           (X, X, X)
c_ei1           1
gr_d1           (X, X, X)
c_ed1           X
co_limit1       (X, 0)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)
``` ins             [0; 0; 0; 0; 1; 0; 0; 0; 1]

state, sense wires - condition 2

| | |
|---|---|
| cmp_prec | 0 |
| cmp01 | (X, X) |
| cmp12 | (X, X) |
| cmp23 | (X, X) |
| cmp_exp12 | (X, 1) |
| insig1 | ((X, X), (X, X), (X, X)) |
| insig2 | ((X, X), (X, X), (X, X)) |
| insig3 | ((X, X), (X, X), (X, X)) |
| sign1 | (1, 0, X, X) |
| sign2 | (0, 1, X, X) |
| sign3 | (X, X, X, X) |
| gr_i1 | (X, X, X) |
| c_ei1 | 1 |
| gr_d1 | (X, X, X) |
| c_ed1 | X |
| co_limit1 | (X, 0) |
| gr_i2 | (X, X, X) |
| c_ei2 | X |
| gr_d2 | (X, X, X) |
| c_ed2 | X |
| co_limit2 | (X, X) |
| gr_a1 | (X, X, X) |
| gr_a2 | (X, X, X) |
| gr_a3 | (X, X, X) | ins             [0; 0; 0; 0; 1; 0; 0; 0; 1]

state, sense wires - condition 3

| | |
|---|---|
| cmp_prec | X |
| cmp01 | (X, X) |
| cmp12 | (X, X) |
| cmp23 | (X, X) |
| cmp_exp12 | (X, X) |
| insig1 | ((X, X), (X, X), (X, X)) |
| insig2 | ((X, X), (X, X), (X, X)) |
| insig3 | ((X, X), (X, X), (X, X)) |
| sign1 | (1, 0, X, X) |
| sign2 | (1, 1, X, X) |
| sign3 | (X, X, X, X) |
| gr_i1 | (X, X, X) |
| c_ei1 | 1 |
| gr_d1 | (X, X, X) |
| c_ed1 | X |
| co_limit1 | (X, 0) |
| gr_i2 | (X, X, X) |
| c_ei2 | X |
| gr_d2 | (X, X, X) |
| c_ed2 | X |
| co_limit2 | (X, X) |
| gr_a1 | (X, X, X) |
| gr_a2 | (X, X, X) |
| gr_a3 | (X, X, X) | ins             [0; 0; 0; 0; 1; 0; 0; 0; 1]

state, sense wires - condition 4

```
cmp_prec           X
cmp01              (X, X)
cmp12              (X, X)
cmp23              (X, X)
cmp_exp12          (X, X)
insig1             ((X, X), (X, X), (X, X))
insig2             ((X, X), (X, X), (X, X))
insig3             ((X, X), (X, X), (X, X))
sign1              (1, 0, X, X)
sign2              (0, 0, X, X)
sign3              (X, X, X, X)
gr_i1              (X, X, X)
c_ei1              1
gr_d1              (X, X, X)
c_ed1              X
co_limit1          (X, 0)
gr_i2              (X, X, X)
c_ei2              X
gr_d2              (X, X, X)
c_ed2              X
co_limit2          (X, X)
gr_a1              (X, X, X)
gr_a2              (X, X, X)
gr_a3              (X, X, X)

ins                [0; 0; 0; 0; 1; 0; 0; 0; 1]

micro instruction wires c1
c1_1               (0, 1, 0, 0, 0, 0)
c1_2               [(0, 1); (0, 1); (1, 0); (0, 1)]
c1_3               [(0, 1); (0, 1); (0, 1); (1, 0); (0, 1)]
c1_4               [(0, 1); (0, 1); (0, 1); (1, 0); (0, 1); (0, 1)]
c1_5               [(1, 0); (0, 1); (0, 1)]
c1_6               [(1, 0); (0, 1); (0, 1); (0, 1); (0, 1)]
c1_7               (0, [(0, 1); (1, 0)], [1; 1])
c1_8               (0, [(0, 1); (1, 0)], [0; 0; 0; 0])
c1_10              [0; 0; 0; 0; 1]

c2
c2_1               (0, 0, 0, 1, 0, 0)
c2_2               [(0, 1); (0, 1); (1, 0); (0, 1)]
c2_3               [(0, 1); (0, 1); (0, 1); (0, 1); (1, 0)]
c2_4               [(0, 1); (0, 1); (1, 0); (0, 1); (0, 1); (0, 1)]
c2_5               [(0, 1); (1, 0); (0, 1)]
c2_6               [(1, 0); (0, 1); (0, 1); (0, 1); (0, 1)]
c2_7               (0, [(0, 1); (1, 0)], [0; 0])
c2_8               (0, [(0, 1); (1, 0)], [0; 0; 0; 0])
c2_10              [0; 0; 0; 0; 1]

c3
c3_1               (1, 0)
c3_2               [(0, 1); (0, 1); (1, 0); (0, 1); (0, 1); (0, 1)]
c3_3               (0, [(0, 1); (1, 0)], [0; 0])
c3_4               [0; 0; 0; 0; 1]
c3_5               ([(1, 0); (0, 1)], 0)

c4                 (0, 1)

c5                 (0, 0, 1)
```

```
control case 3
---------------- state, sense wires - condition 1 cmp_prec            0
cmp01               (X, X)
cmp12               (X, X)
cmp23               (X, X)
cmp_exp12           (X, 1)
insig1              ((X, X), (X, X), (X, X))
insig2              ((X, X), (X, X), (X, X))
insig3              ((X, X), (X, X), (X, X))
sign1               (0, 1, X, X)
sign2               (1, 0, X, X)
sign3               (X, X, X, X)
gr_i1               (X, X, X)
c_ei1               X
gr_d1               (X, X, X)
c_ed1               1
co_limit1           (X, 0)
gr_i2               (X, X, X)
c_ei2               X
gr_d2               (X, X, X)
c_ed2               X
co_limit2           (X, X)
gr_a1               (X, X, X)
gr_a2               (X, X, X)
gr_a3               (X, X, X)

ins                 [0; 0; 0; 0; 1; 1; 0; 0; 1]

state, sense wires - condition 2 cmp_prec            0
cmp01               (X, X)
cmp12               (X, X)
cmp23               (X, X)
cmp_exp12           (X, 1)
insig1              ((X, X), (X, X), (X, X))
insig2              ((X, X), (X, X), (X, X))
insig3              ((X, X), (X, X), (X, X))
sign1               (0, 1, X, X)
sign2               (0, 1, X, X)
sign3               (X, X, X, X)
gr_i1               (X, X, X)
c_ei1               X
gr_d1               (X, X, X)
c_ed1               1
co_limit1           (X, 0)
gr_i2               (X, X, X)
c_ei2               X
gr_d2               (X, X, X)
c_ed2               X
co_limit2           (X, X)
gr_a1               (X, X, X)
gr_a2               (X, X, X)
gr_a3               (X, X, X)

ins                 [0; 0; 0; 0; 1; 1; 0; 0; 1]

state, sense wires - condition 3
```

```
cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, X), (X, X))
sign1           (0, 1, X, X)
sign2           (1, 1, X, X)
sign3           (X, X, X, X)
gr_i1           (X, X, X)
c_ei1           X
gr_d1           (X, X, X)
c_ed1           1
co_limit1       (X, 0)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 1; 0; 0; 1]
``` state, sense wires - condition 4

```
cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, X), (X, X))
sign1           (0, 1, X, X)
sign2           (0, 0, X, X)
sign3           (X, X, X, X)
gr_i1           (X, X, X)
c_ei1           X
gr_d1           (X, X, X)
c_ed1           1
co_limit1       (X, 0)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 1; 0; 0; 1]
``` micro instruction wires

```
c1
c1_1            (0, 1, 0, 0, 0, 0)
c1_2            [(0, 1); (0, 1); (1, 0); (0, 1)]
c1_3            [(0, 1); (0, 1); (1, 0); (0, 1); (0, 1)]
```

```
c1_4            [(0, 1); (0, 1); (0, 1); (1, 0); (0, 1); (0, 1)]
c1_5            [(1, 0); (0, 1); (0, 1)]
c1_6            [(1, 0); (0, 1); (0, 1); (0, 1); (0, 1)]
c1_7            (0, [(0, 1); (1, 0)], [1; 1])
c1_8            (0, [(0, 1); (1, 0)], [0; 0; 0; 0])
c1_10           [0; 0; 0; 0; 1]
c2
c2_1            (0, 0, 0, 1, 0, 0)
c2_2            [(0, 1); (0, 1); (1, 0); (0, 1)]
c2_3            [(0, 1); (0, 1); (0, 1); (0, 1); (1, 0)]
c2_4            [(0, 1); (0, 1); (1, 0); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
c3_2            [(0, 1); (0, 1); (1, 0); (0, 1); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 1)

control case 4
--------------- state, sense wires - condition 1 cmp_prec        0
cmp01           (X, X)
cmp12           (X, X)
cmp23           (X, X)
cmp_exp12       (X, 1)
insig1          ((X, X), (X, X), (X, X))
insig2          ((X, X), (X, X), (X, X))
insig3          ((X, X), (X, X), (X, X))
sign1           (1, 0, X, X)
sign2           (1, 0, X, X)
sign3           (X, X, X, X)
gr_i1           (X, X, X)
c_ei1           1
gr_d1           (X, X, X)
c_ed1           X
co_limit1       (X, 0)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 1; 0; 0; 1]

state, sense wires - condition 2
```

```
cmp_prec         0
cmp01            (X, X)
cmp12            (X, X)
cmp23            (X, X)
cmp_exp12        (X, 1)
insig1           ((X, X), (X, X), (X, X))
insig2           ((X, X), (X, X), (X, X))
insig3           ((X, X), (X, X), (X, X))
sign1            (1, 0, X, X)
sign2            (0, 1, X, X)
sign3            (X, X, X, X)
gr_i1            (X, X, X)
c_ei1            1
gr_d1            (X, X, X)
c_ed1            X
co_limit1        (X, 0)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [0; 0; 0; 0; 1; 1; 0; 0; 1]

state, sense wires - condition 3 cmp_prec         X
cmp01            (X, X)
cmp12            (X, X)
cmp23            (X, X)
cmp_exp12        (X, X)
insig1           ((X, X), (X, X), (X, X))
insig2           ((X, X), (X, X), (X, X))
insig3           ((X, X), (X, X), (X, X))
sign1            (1, 0, X, X)
sign2            (1, 1, X, X)
sign3            (X, X, X, X)
gr_i1            (X, X, X)
c_ei1            1
gr_d1            (X, X, X)
c_ed1            X
co_limit1        (X, 0)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [0; 0; 0; 0; 1; 1; 0; 0; 1]

state, sense wires - condition 4 cmp_prec         X
cmp01            (X, X)
cmp12            (X, X)
cmp23            (X, X)
```

```
cmp_exp12      (X, X)
insig1         ((X, X), (X, X), (X, X))
insig2         ((X, X), (X, X), (X, X))
insig3         ((X, X), (X, X), (X, X))
sign1          (1, 0, X, X)
sign2          (0, 0, X, X)
sign3          (X, X, X, X)
gr_i1          (X, X, X)
c_ei1          1
gr_d1          (X, X, X)
c_ed1          X
co_limit1      (X, 0)
gr_i2          (X, X, X)
c_ei2          X
gr_d2          (X, X, X)
c_ed2          X
co_limit2      (X, X)
gr_a1          (X, X, X)
gr_a2          (X, X, X)
gr_a3          (X, X, X)

ins            [0; 0; 0; 0; 1; 1; 0; 0; 1]

micro instruction wires c1
c1_1           (0, 1, 0, 0, 0, 0)
c1_2           [(0, 1); (0, 1); (1, 0); (0, 1)]
c1_3           [(0, 1); (0, 1); (0, 1); (1, 0); (0, -1)]
c1_4           [(0, 1); (0, 1); (0, 1); (1, 0); (0, 1); (0, 1)]
c1_5           [(1, 0); (0, 1); (0, 1)]
c1_6           [(1, 0); (0, 1); (0, 1); (0, 1); (0, 1)]
c1_7           (0, [(0, 1); (1, 0)], [0; 0])
c1_8           (0, [(0, 1); (1, 0)], [0; 0; 0; 0])
c1_10          [0; 0; 0; 0; 1]

c2
c2_1           (0, 0, 0, 1, 0, 0)
c2_2           [(0, 1); (0, 1); (1, 0); (0, 1)]
c2_3           [(0, 1); (0, 1); (0, 1); (0, 1); (1, 0)]
c2_4           [(0, 1); (0, 1); (1, 0); (0, 1); (0, 1); (0, 1)]
c2_5           [(0, 1); (1, 0); (0, 1)]
c2_6           [(1, 0); (0, 1); (0, 1); (0, 1); (0, 1)]
c2_7           (0, [(0, 1); (1, 0)], [0; 0])
c2_8           (0, [(0, 1); (1, 0)], [0; 0; 0; 0])
c2_10          [0; 0; 0; 0; 1]

c3
c3_1           (1, 0)
c3_2           [(0, 1); (0, 1); (1, 0); (0, 1); (0, 1); (0, 1)]
c3_3           (0, [(0, 1); (1, 0)], [0; 0])
c3_4           [0; 0; 0; 0; 1]
c3_5           ([(1, 0); (0, 1)], 0)

c4             (0, 1)

c5             (0, 0, 1)

control case 5
--------------- state, sense wires - condition 1
```

```
cmp_prec        0
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (0, 0, X, X)
sign2           (0, 0, X, X)
sign3           (X, X, X, X)
gr_i1           (X, X, X)
c_ei1           X
gr_d1           (X, X, X)
c_ed1           1
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 0; 0; 0; 1]
``` state, sense wires - condition 2

```
cmp_prec        0
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (0, 0, X, X)
sign2           (1, 1, X, X)
sign3           (X, X, X, X)
gr_i1           (X, X, X)
c_ei1           X
gr_d1           (X, X, X)
c_ed1           1
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 0; 0; 0; 1]
``` micro instruction wires

```
c1
c1_1            (0, 0, 1, 0, 0, 1)
c1_2            [(0, 1); (0, 1); (1, 0); (0, 1)]
c1_3            [(0, 1); (0, 1); (1, 0); (0, 1); (0, 1)]
c1_4            [(0, 1); (0, 1); (0, 1); (1, 0); (0, 1); (0, 1)]
```

```
c1_5            [(0, 1); (0, 1); (1, 0)]
c1_6            [(1, 0); (0, 1); (0, 1); (0, 1); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]

c2
c2_1            (0, 0, 0, 1, 0, 0)
c2_2            [(0, 1); (0, 1); (1, 0); (0, 1)]
c2_3            [(0, 1); (0, 1); (0, 1); (0, 1); (1, 0)]
c2_4            [(0, 1); (0, 1); (1, 0); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
c3_2            [(0, 1); (0, 1); (1, 0); (0, 1); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 1)
``` control case 6
---------------- state, sense wires - condition 1

```
cmp_prec        0
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (1, 1, X, X)
sign2           (0, 0, X, X)
sign3           (X, X, X, X)
gr_i1           (X, X, X)
c_ei1           1
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 0; 0; 0; 1]
``` state, sense wires - condition 2

```
cmp_prec        0
```

```
cmp01              (X, X)
cmp12              (X, X)
cmp23              (X, X)
cmp_exp12          (0, 0)
insig1             ((X, X), (X, X), (X, X))
insig2             ((X, X), (X, X), (X, X))
insig3             ((X, X), (X, X), (X, X))
sign1              (1, 1, X, X)
sign2              (1, 1, X, X)
sign3              (X, X, X, X)
gr_i1              (X, X, X)
c_ei1              1
gr_d1              (X, X, X)
c_ed1              X
co_limit1          (X, X)
gr_i2              (X, X, X)
c_ei2              X
gr_d2              (X, X, X)
c_ed2              X
co_limit2          (X, X)
gr_a1              (X, X, X)
gr_a2              (X, X, X)
gr_a3              (X, X, X)

ins                [0; 0; 0; 0; 1; 0; 0; 0; 1]

micro instruction wires c1
c1_1               (0, 0, 1, 0, 0, 0)
c1_2               [(0, 1); (0, 1); (1, 0); (0, 1)]
c1_3               [(0, 1); (0, 1); (0, 1); (1, 0); (0, 1)]
c1_4               [(0, 1); (0, 1); (0, 1); (1, 0); (0, 1); (0, 1)]
c1_5               [(0, 1); (0, 1); (1, 0)]
c1_6               [(1, 0); (0, 1); (0, 1); (0, 1); (0, 1)]
c1_7               (0, [(0, 1); (1, 0)], [1; 1])
c1_8               (0, [(0, 1); (1, 0)], [0; 0; 0; 0])
c1_10              [0; 0; 0; 0; 1]

c2
c2_1               (0, 0, 0, 1, 0, 0)
c2_2               [(0, 1); (0, 1); (1, 0); (0, 1)]
c2_3               [(0, 1); (0, 1); (0, 1); (0, 1); (1, 0)]
c2_4               [(0, 1); (0, 1); (1, 0); (0, 1); (0, 1); (0, 1)]
c2_5               [(0, 1); (1, 0); (0, 1)]
c2_6               [(1, 0); (0, 1); (0, 1); (0, 1); (0, 1)]
c2_7               (0, [(0, 1); (1, 0)], [0; 0])
c2_8               (0, [(0, 1); (1, 0)], [0; 0; 0; 0])
c2_10              [0; 0; 0; 0; 1]

c3
c3_1               (1, 0)
c3_2               [(0, 1); (0, 1); (1, 0); (0, 1); (0, 1); (0, 1)]
c3_3               (0, [(0, 1); (1, 0)], [0; 0])
c3_4               [0; 0; 0; 0; 1]
c3_5               ([(1, 0); (0, 1)], 0)

c4                 (0, 1)

c5                 (0, 0, 1)
``` control case 7
--------------- state, sense wires - condition 1

```
cmp_prec        0
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (0, 0, X, X)
sign2           (0, 0, X, X)
sign3           (X, X, X, X)
gr_i1           (X, X, X)
c_ei1           X
gr_d1           (X, X, X)
c_ed1           1
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 1; 0; 0; 1]
``` state, sense wires - condition 2

```
cmp_prec        0
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (0, 0, X, X)
sign2           (1, 1, X, X)
sign3           (X, X, X, X)
gr_i1           (X, X, X)
c_ei1           X
gr_d1           (X, X, X)
c_ed1           1
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 1; 0; 0; 1]
``` micro instruction wires

```
c1
c1_1            (0, 0, 1, 0, 0, 1)
c1_2            [(0, 1); (0, 1); (1, 0); (0, 1)]
c1_3            [(0, 1); (0, 1); (1, 0); (0, 1); (0, 1)]
c1_4            [(0, 1); (0, 1); (0, 1); (1, 0); (0, 1); (0, 1)]
c1_5            [(0, 1); (0, 1); (1, 0)]
c1_6            [(1, 0); (0, 1); (0, 1); (0, 1); (0, 1)]
c1_7            (0, [(0, 1); (1, 0)], [1; 1])
c1_8            (0, [(0, 1); (1, 0)], [0; 0; 0; 0])
c1_10           [0; 0; 0; 0; 1]

c2
c2_1            (0, 0, 0, 1, 0, 0)
c2_2            [(0, 1); (0, 1); (1, 0); (0, 1)]
c2_3            [(0, 1); (0, 1); (0, 1); (0, 1); (1, 0)]
c2_4            [(0, 1); (0, 1); (1, 0); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
c3_2            [(0, 1); (0, 1); (1, 0); (0, 1); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 1)

control case 8
---------------- state, sense wires - condition 1 cmp_prec        0
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (1, 1, X, X)
sign2           (0, 0, X, X)
sign3           (X, X, X, X)
gr_i1           (X, X, X)
c_ei1           1
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins            [0; 0; 0; 0; 1; 1; 0; 0; 1]
``` state, sense wires - condition 2

```
cmp_prec           0
cmp01              (X, X)
cmp12              (X, X)
cmp23              (X, X)
cmp_exp12          (0, 0)
insig1             ((X, X), (X, X), (X, X))
insig2             ((X, X), (X, X), (X, X))
insig3             ((X, X), (X, X), (X, X))
sign1              (1, 1, X, X)
sign2              (1, 1, X, X)
sign3              (X, X, X, X)
gr_i1              (X, X, X)
c_ei1              1
gr_d1              (X, X, X)
c_ed1              X
co_limit1          (X, X)
gr_i2              (X, X, X)
c_ei2              X
gr_d2              (X, X, X)
c_ed2              X
co_limit2          (X, X)
gr_a1              (X, X, X)
gr_a2              (X, X, X)
gr_a3              (X, X, X)

ins                [0; 0; 0; 0; 1; 1; 0; 0; 1]
``` micro instruction wires

```
c1
c1_1               (0, 0, 1, 0, 0, 0)
c1_2               [(0, 1); (0, 1); (1, 0); (0, 1)]
c1_3               [(0, 1); (0, 1); (0, 1); (1, 0); (0, 1)]
c1_4               [(0, 1); (0, 1); (0, 1); (1, 0); (0, 1); (0, 1)]
c1_5               [(0, 1); (0, 1); (1, 0)]
c1_6               [(1, 0); (0, 1); (0, 1); (0, 1); (0, 1)]
c1_7               (0, [(0, 1); (1, 0)], [0; 0])
c1_8               (0, [(0, 1); (1, 0)], [0; 0; 0; 0])
c1_10              [0; 0; 0; 0; 1]

c2
c2_1               (0, 0, 0, 1, 0, 0)
c2_2               [(0, 1); (0, 1); (1, 0); (0, 1)]
c2_3               [(0, 1); (0, 1); (0, 1); (0, 1); (1, 0)]
c2_4               [(0, 1); (0, 1); (1, 0); (0, 1); (0, 1); (0, 1)]
c2_5               [(0, 1); (1, 0); (0, 1)]
c2_6               [(1, 0); (0, 1); (0, 1); (0, 1); (0, 1)]
c2_7               (0, [(0, 1); (1, 0)], [0; 0])
c2_8               (0, [(0, 1); (1, 0)], [0; 0; 0; 0])
c2_10              [0; 0; 0; 0; 1]

c3
c3_1               (1, 0)
c3_2               [(0, 1); (0, 1); (1, 0); (0, 1); (0, 1); (0, 1)]
c3_3               (0, [(0, 1); (1, 0)], [0; 0])
c3_4               [0; 0; 0; 0; 1]
c3_5               ([(1, 0); (0, 1)], 0)

c4                 (0, 1)

c5                 (0, 0, 1)
``` control case 9
--------------- state, sense wires - condition 1

```
cmp_prec        1
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (0, 0, X, X)
sign2           (0, 0, X, X)
sign3           (X, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 0; 0; 0; 1]
``` state, sense wires - condition 2

```
cmp_prec        1
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (0, 0, X, X)
sign2           (1, 1, X, X)
sign3           (X, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 0; 0; 0; 1]
``` state, sense wires - condition 3

```
cmp_prec        1
```

```
cmp01            (X, X)
cmp12            (X, X)
cmp23            (X, X)
cmp_exp12        (0, 0)
insig1           ((X, X), (X, X), (X, X))
insig2           ((X, X), (X, X), (X, X))
insig3           ((X, X), (X, X), (X, X))
sign1            (0, 1, X, X)
sign2            (0, 1, X, X)
sign3            (X, X, X, X)
gr_i1            (X, X, X)
c_ei1            X
gr_d1            (X, X, X)
c_ed1            X
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [0; 0; 0; 0; 1; 0; 0; 0; 1]

state, sense wires - condition 4 cmp_prec         1
cmp01            (X, X)
cmp12            (X, X)
cmp23            (X, X)
cmp_exp12        (0, 0)
insig1           ((X, X), (X, X), (X, X))
insig2           ((X, X), (X, X), (X, X))
insig3           ((X, X), (X, X), (X, X))
sign1            (0, 1, X, X)
sign2            (1, 0, X, X)
sign3            (X, X, X, X)
gr_i1            (X, X, X)
c_ei1            X
gr_d1            (X, X, X)
c_ed1            X
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [0; 0; 0; 0; 1; 0; 0; 0; 1]

micro instruction wires c1
c1_1             (0, 1, 0, 0, 0, 0)
c1_2             [(0, 1); (0, 1); (1, 0); (0, 1)]
c1_3             [(0, 1); (0, 1); (1, 0); (0, 1); (0, 1)]
c1_4             [(0, 1); (0, 1); (0, 1); (1, 0); (0, 1); (0, 1)]
c1_5             [(0, 1); (1, 0); (0, 1)]
c1_6             [(1, 0); (0, 1); (0, 1); (0, 1); (0, 1)]
```

```
c1_7              (0, [(0, 1); (1, 0)], [0; 0])
c1_8              (0, [(0, 1); (1, 0)], [0; 0; 0; 0])
c1_10             [0; 0; 0; 0; 1]
c2
c2_1              (0, 0, 0, 1, 0, 0)
c2_2              [(0, 1); (0, 1); (1, 0); (0, 1)]
c2_3              [(0, 1); (0, 1); (0, 1); (0, 1); (1, 0)]
c2_4              [(0, 1); (0, 1); (1, 0); (0, 1); (0, 1); (0, 1)]
c2_5              [(0, 1); (1, 0); (0, 1)]
c2_6              [(1, 0); (0, -1); (0, 1); (0, 1); (0, 1)]
c2_7              (0, [(0, 1); (1, 0)], [0; 0])
c2_8              (0, [(0, 1); (1, 0)], [0; 0; 0; 0])
c2_10             [0; 0; 0; 0; 1]

c3
c3_1              (1, 0)
c3_2              [(0, 1); (0, 1); (1, 0); (0, 1); (0, 1); (0, 1)]
c3_3              (0, [(0, 1); (1, 0)], [0; 0])
c3_4              [0; 0; 0; 0; 1]
c3_5              ([(1, 0); (0, 1)], 0)

c4                (0, 1)

c5                (0, 0, 1)

control case 10
--------------- state, sense wires - condition 1 cmp_prec          1
cmp01             (X, X)
cmp12             (X, X)
cmp23             (X, X)
cmp_exp12         (0, 0)
insig1            ((X, X), (X, X), (X, X))
insig2            ((X, X), (X, X), (X, X))
insig3            ((X, X), (X, X), (X, X))
sign1             (1, 0, X, X)
sign2             (0, 1, X, X)
sign3             (X, X, X, X)
gr_i1             (X, X, X)
c_ei1             X
gr_d1             (X, X, X)
c_ed1             X
co_limit1         (X, X)
gr_i2             (X, X, X)
c_ei2             X
gr_d2             (X, X, X)
c_ed2             X
co_limit2         (X, X)
gr_a1             (X, X, X)
gr_a2             (X, X, X)
gr_a3             (X, X, X)

ins               [0; 0; 0; 0; 1; 0; 0; 0; 1]

state, sense wires - condition 2 cmp_prec          1
cmp01             (X, X)
cmp12             (X, X)
cmp23             (X, X)
cmp_exp12         (0, 0)
```

```
insig1           ((X, X), (X, X), (X, X))
insig2           ((X, X), (X, X), (X, X))
insig3           ((X, X), (X, X), (X, X))
sign1            (1, 0, X, X)
sign2            (1, 1, X, X)
sign3            (X, X, X, X)
gr_i1            (X, X, X)
c_ei1            X
gr_d1            (X, X, X)
c_ed1            X
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [0; 0; 0; 0; 1; 0; 0; 0; 1]

state, sense wires - condition 3 cmp_prec         1
cmp01            (X, X)
cmp12            (X, X)
cmp23            (X, X)
cmp_exp12        (0, 0)
insig1           ((X, X), (X, X), (X, X))
insig2           ((X, X), (X, X), (X, X))
insig3           ((X, X), (X, X), (X, X))
sign1            (1, 1, X, X)
sign2            (0, 0, X, X)
sign3            (X, X, X, X)
gr_i1            (X, X, X)
c_ei1            X
gr_d1            (X, X, X)
c_ed1            X
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [0; 0; 0; 0; 1; 0; 0; 0; 1]

state, sense wires - condition 4 cmp_prec         1
cmp01            (X, X)
cmp12            (X, X)
cmp23            (X, X)
cmp_exp12        (0, 0)
insig1           ((X, X), (X, X), (X, X))
insig2           ((X, X), (X, X), (X, X))
insig3           ((X, X), (X, X), (X, X))
sign1            (1, 1, X, X)
sign2            (1, 1, X, X)
sign3            (X, X, X, X)
```

```
gr_i1              (X, X, X)
c_ei1              X
gr_d1              (X, X, X)
c_ed1              X
co_limit1          (X, X)
gr_i2              (X, X, X)
c_ei2              X
gr_d2              (X, X, X)
c_ed2              X
co_limit2          (X, X)
gr_a1              (X, X, X)
gr_a2              (X, X, X)
gr_a3              (X, X, X)

ins                [0; 0; 0; 0; 1; 0; 0; 0; 1]

micro instruction wires c1
c1_1               (0, 1, 0, 0, 0, 0)
c1_2               [(0, 1); (0, 1); (1, 0); (0, 1)]
c1_3               [(0, 1); (0, 1); (0, 1); (1, 0); (0, 1)]
c1_4               [(0, 1); (0, 1); (0, 1); (1, 0); (0, 1); (0, 1)]
c1_5               [(0, 1); (1, 0); (0, 1)]
c1_6               [(1, 0); (0, 1); (0, 1); (0, 1); (0, 1)]
c1_7               (0, [(0, 1); (1, 0)], [1; 1])
c1_8               (0, [(0, 1); (1, 0)], [0; 0; 0; 0])
c1_10              [0; 0; 0; 0; 1]
c2
c2_1               (0, 0, 0, 1, 0, 0)
c2_2               [(0, 1); (0, 1); (1, 0); (0, 1)]
c2_3               [(0, 1); (0, 1); (0, 1); (0, 1); (1, 0)]
c2_4               [(0, 1); (0, 1); (1, 0); (0, 1); (0, 1); (0, 1)]
c2_5               [(0, 1); (1, 0); (0, 1)]
c2_6               [(1, 0); (0, 1); (0, 1); (0, 1); (0, 1)]
c2_7               (0, [(0, 1); (1, 0)], [0; 0])
c2_8               (0, [(0, 1); (1, 0)], [0; 0; 0; 0])
c2_10              [0; 0; 0; 0; 1]

c3
c3_1               (1, 0)
c3_2               [(0, 1); (0, 1); (1, 0); (0, 1); (0, 1); (0, 1)]
c3_3               (0, [(0, 1); (1, 0)], [0; 0])
c3_4               [0; 0; 0; 0; 1]
c3_5               ([(1, 0); (0, 1)], 0)

c4                 (0, 1)

c5                 (0, 0, 1)

control case 11
--------------- state, sense wires - condition 1 cmp_prec           1
cmp01              (X, X)
cmp12              (X, X)
cmp23              (X, X)
cmp_exp12          (0, 0)
insig1             ((X, X), (X, X), (X, X))
insig2             ((X, X), (X, X), (X, X))
insig3             ((X, X), (X, X), (X, X))
```

```
sign1           (0, 0, X, X)
sign2           (0, 0, X, X)
sign3           (X, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 1; 0; 0; 1]
``` state, sense wires - condition 2

```
cmp_prec        1
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (0, 0, X, X)
sign2           (1, 1, X, X)
sign3           (X, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 1; 0; 0; 1]
``` state, sense wires - condition 3

```
cmp_prec        1
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (0, 1, X, X)
sign2           (0, 1, X, X)
sign3           (X, X, X, X)
gr_i1           (X, X, X)
c_ei1           X
```

```
gr_d1            (X, X, X)
c_ed1            X
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [0; 0; 0; 0; 1; 1; 0; 0; 1]

state, sense wires - condition 4 cmp_prec         1
cmp01            (X, X)
cmp12            (X, X)
cmp23            (X, X)
cmp_exp12        (0, 0)
insig1           ((X, X), (X, X), (X, X))
insig2           ((X, X), (X, X), (X, X))
insig3           ((X, X), (X, X), (X, X))
sign1            (0, 1, X, X)
sign2            (1, 0, X, X)
sign3            (X, X, X, X)
gr_i1            (X, X, X)
c_ei1            X
gr_d1            (X, X, X)
c_ed1            X
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [0; 0; 0; 0; 1; 1; 0; 0; 1]

micro instruction wires c1
c1_1             (0, 1, 0, 0, 0, 0)
c1_2             [(0, 1); (0, 1); (1, 0); (0, 1)]
c1_3             [(0, 1); (0, 1); (1, 0); (0, 1); (0, 1)]
c1_4             [(0, 1); (0, 1); (0, 1); (1, 0); (0, 1); (0, 1)]
c1_5             [(0, 1); (1, 0); (0, 1)]
c1_6             [(1, 0); (0, 1); (0, 1); (0, 1); (0, 1)]
c1_7             (0, [(0, 1); (1, 0)], [1; 1])
c1_8             (0, [(0, 1); (1, 0)], [0; 0; 0; 0])
c1_10            [0; 0; 0; 0; 1]
c2
c2_1             (0, 0, 0, 1, 0, 0)
c2_2             [(0, 1); (0, 1); (1, 0); (0, 1)]
c2_3             [(0, 1); (0, 1); (0, 1); (0, 1); (1, 0)]
c2_4             [(0, 1); (0, 1); (1, 0); (0, 1); (0, 1); (0, 1)]
c2_5             [(0, 1); (1, 0); (0, 1)]
c2_6             [(1, 0); (0, 1); (0, 1); (0, 1); (0, 1)]
c2_7             (0, [(0, 1); (1, 0)], [0; 0])
c2_8             (0, [(0, 1); (1, 0)], [0; 0; 0; 0])
c2_10            [0; 0; 0; 0; 1]
```

```
c3
c3_1            (1, 0)
c3_2            [(0, 1); (0, 1); (1, 0); (0, 1); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 1)

control case 12
--------------- state, sense wires - condition 1 cmp_prec        1
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (1, 0, X, X)
sign2           (0, 1, X, X)
sign3           (X, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [0; 0; 0; 0; 1; 1; 0; 0; 1]

state, sense wires - condition 2 cmp_prec        1
cmp01           (X, X)
cmp12           (X, X)
cmp23           (X, X)
cmp_exp12       (0, 0)
insig1          ((X, X), (X, X), (X, X))
insig2          ((X, X), (X, X), (X, X))
insig3          ((X, X), (X, X), (X, X))
sign1           (1, 0, X, X)
sign2           (1, 1, X, X)
sign3           (X, X, X, X)
gr_i1           (X, X, X)
c_ei1           X
gr_d1           (X, X, X)
c_ed1           X
co_limit1       (X, X)
gr_i2           (X, X, X)
c_ei2           X
```

```
gr_d2            (X, X, X)
c_ed2            X
co_limit2        (X, X)
gr_a1            (X, X, X)
gr_a2            (X, X, X)
gr_a3            (X, X, X)

ins              [0; 0; 0; 0; 1; 1; 0; 0; 1]
``` state, sense wires - condition 3

```
cmp_prec         1
cmp01            (X, X)
cmp12            (X, X)
cmp23            (X, X)
cmp_exp12        (0, 0)
insig1           ((X, X), (X, X), (X, X))
insig2           ((X, X), (X, X), (X, X))
insig3           ((X, X), (X, X), (X, X))
sign1            (1, 1, X, X)
sign2            (0, 0, X, X)
sign3            (X, X, X, X)
gr_i1            (X, X, X)
c_ei1            X
gr_d1            (X, X, X)
c_ed1            X
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [0; 0; 0; 0; 1; 1; 0; 0; 1]
``` state, sense wires - condition 4

```
cmp_prec         1
cmp01            (X, X)
cmp12            (X, X)
cmp23            (X, X)
cmp_exp12        (0, 0)
insig1           ((X, X), (X, X), (X, X))
insig2           ((X, X), (X, X), (X, X))
insig3           ((X, X), (X, X), (X, X))
sign1            (1, 1, X, X)
sign2            (1, 1, X, X)
sign3            (X, X, X, X)
gr_i1            (X, X, X)
c_ei1            X
gr_d1            (X, X, X)
c_ed1            X
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)
``` ins                 [0; 0; 0; 0; 1; 1; 0; 0; 1]

micro instruction wires c1
c1_1                (0, 1, 0, 0, 0, 0)
c1_2                [(0, 1); (0, 1); (1, 0); (0, 1)]
c1_3                [(0, 1); (0, 1); (0, 1); (1, 0); (0, 1)]
c1_4                [(0, 1); (0, 1); (0, 1); (1, 0); (0, 1); (0, 1)]
c1_5                [(0, 1); (1, 0); (0, 1)]
c1_6                [(1, 0); (0, 1); (0, 1); (0, 1); (0, 1)]
c1_7                (0, [(0, 1); (1, 0)], [0; 0])
c1_8                (0, [(0, 1); (1, 0)], [0; 0; 0; 0])
c1_10               [0; 0; 0; 0; 1]
c2
c2_1                (0, 0, 0, 1, 0, 0)
c2_2                [(0, 1); (0, 1); (1, 0); (0, 1)]
c2_3                [(0, 1); (0, 1); (0, 1); (0, 1); (1, 0)]
c2_4                [(0, 1); (0, 1); (1, 0); (0, 1); (0, 1); (0, 1)]
c2_5                [(0, 1); (1, 0); (0, 1)]
c2_6                [(1, 0); (0, 1); (0, 1); (0, 1); (0, 1)]
c2_7                (0, [(0, 1); (1, 0)], [0; 0])
c2_8                (0, [(0, 1); (1, 0)], [0; 0; 0; 0])
c2_10               [0; 0; 0; 0; 1]

c3
c3_1                (1, 0)
c3_2                [(0, 1); (0, 1); (1, 0); (0, 1); (0, 1); (0, 1)]
c3_3                (0, [(0, 1); (1, 0)], [0; 0])
c3_4                [0; 0; 0; 0; 1]
c3_5                ([(1, 0); (0, 1)], 0)

c4                  (0, 1)

c5                  (0, 0, 1)

APPENDIX 2

Integer multiplication control case 1
---------------- state, sense wires - condition 1 cmp_prec            X
cmp01               (X, X)
cmp12               (X, X)
cmp23               (X, X)
cmp_exp12           (X, X)
insig1              ((X, X), (1, X), (X, X))
insig2              ((X, X), (X, X), (X, X))
insig3              ((X, X), (X, X), (X, X))
sign1               (1, X, X, X)
sign2               (X, X, X, X)
sign3               (X, X, X, X)
gr_i1               (X, X, X)
c_ei1               X
gr_d1               (X, X, X)
c_ed1               X

```
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [1; 0; 0; 0; 0; 0; 0; 0; 1]
``` state, sense wires - condition 2

```
cmp_prec         X
cmp01            (X, X)
cmp12            (X, X)
cmp23            (X, X)
cmp_exp12        (X, X)
insig1           ((X, X), (X, X), (X, X))
insig2           ((X, X), (1, X), (X, X))
insig3           ((X, X), (X, X), (X, X))
sign1            (X, X, X, X)
sign2            (1, X, X, X)
sign3            (X, X, X, X)
gr_i1            (X, X, X)
c_ei1            X
gr_d1            (X, X, X)
c_ed1            X
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [1; 0; 0; 0; 0; 0; 0; 0; 1]
``` micro instruction wires

```
c1
c1_1             (0, 0, 0, 0, 1, 0)
c1_2             [(0, 1); (0, 1); (1, 0); (0, 1)]
c1_3             [(0, 1); (0, 1); (0, 1); (0, 1); (1, 0)]
c1_4             [(0, 1); (0, 1); (0, 1); (0, 1); (0, 1); (1, 0)]
c1_5             [(0, 1); (1, 0); (0, 1)]
c1_6             [(1, 0); (0, 1); (0, 1); (0, 1); (0, 1)]
c1_7             (0, [(0, 1); (1, 0)], [0; 0])
c1_8             (0, [(0, 1); (1, 0)], [0; 0; 0; 0])
c1_10            [0; 0; 0; 0; 1]

c2
c2_1             (0, 0, 0, 1, 0, 0)
c2_2             [(0, 1); (0, 1); (1, 0); (0, 1)]
c2_3             [(0, 1); (0, 1); (0, 1); (0, 1); (1, 0)]
c2_4             [(0, 1); (0, 1); (1, 0); (0, 1); (0, 1); (0, 1)]
c2_5             [(0, 1); (1, 0); (0, 1)]
c2_6             [(1, 0); (0, 1); (0, 1); (0, 1); (0, 1)]
c2_7             (0, [(0, 1); (1, 0)], [0; 0])
```

```
c2_8              (0, [(0, 1); (1, 0)], [0; 0; 0; 0])
c2_10             [0; 0; 0; 0; 1]

c3
c3_1              (1, 0)
c3_2              [(0, 1); (0, 1); (1, 0); (0, 1); (0, 1); (0, 1)]
c3_3              (0, [(0, 1); (1, 0)], [0; 0])
c3_4              [0; 0; 0; 0; 1]
c3_5              ([(1, 0); (0, 1)], 0)

c4                (0, 1)

c5                (0, 0, 0)

control case 2
--------------- state, sense wires - condition 1 cmp_prec          X
cmp01             (X, X)
cmp12             (X, X)
cmp23             (X, X)
cmp_exp12         (X, X)
insig1            ((X, X), (X, X), (X, X))
insig2            ((X, X), (X, X), (X, X))
insig3            ((X, X), (X, X), (X, X))
sign1             (0, X, X, X)
sign2             (0, X, X, X)
sign3             (X, X, X, X)
gr_i1             (X, X, X)
c_ei1             X
gr_d1             (X, X, X)
c_ed1             X
co_limit1         (X, X)
gr_i2             (X, X, X)
c_ei2             X
gr_d2             (X, X, X)
c_ed2             X
co_limit2         (X, X)
gr_a1             (X, X, X)
gr_a2             (X, X, X)
gr_a3             (X, X, X)

ins               [1; 0; 0; 0; 0; 0; 0; 0; 1]

state, sense wires - condition 2 cmp_prec          X
cmp01             (X, X)
cmp12             (X, X)
cmp23             (X, X)
cmp_exp12         (X, X)
insig1            ((X, X), (X, X), (X, X))
insig2            ((X, X), (0, X), (X, X))
insig3            ((X, X), (X, X), (X, X))
sign1             (0, X, X, X)
sign2             (X, X, X, X)
sign3             (X, X, X, X)
gr_i1             (X, X, X)
c_ei1             X
gr_d1             (X, X, X)
c_ed1             X
```

```
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [1; 0; 0; 0; 0; 0; 0; 0; 1]
``` state, sense wires - condition 3

```
cmp_prec         X
cmp01            (X, X)
cmp12            (X, X)
cmp23            (X, X)
cmp_exp12        (X, X)
insig1           ((X, X), (0, X), (X, X))
insig2           ((X, X), (X, X), (X, X))
insig3           ((X, X), (X, X), (X, X))
sign1            (X, X, X, X)
sign2            (0, X, X, X)
sign3            (X, X, X, X)
gr_i1            (X, X, X)
c_ei1            X
gr_d1            (X, X, X)
c_ed1            X
co_limit1        (X, X)
gr_i2            (X, X, X)
c_ei2            X
gr_d2            (X, X, X)
c_ed2            X
co_limit2        (X, X)
gr_a1            (X, X, X)
gr_a2            (X, X, X)
gr_a3            (X, X, X)

ins              [1; 0; 0; 0; 0; 0; 0; 0; 1]
``` state, sense wires - condition 4

```
cmp_prec         X
cmp01            (X, X)
cmp12            (X, X)
cmp23            (X, X)
cmp_exp12        (X, X)
insig1           ((X, X), (0, X), (X, X))
insig2           ((X, X), (0, X), (X, X))
insig3           ((X, X), (X, X), (X, X))
sign1            (X, X, X, X)
sign2            (X, X, X, X)
sign3            (X, X, X, X)
gr_i1            (X, X, X)
c_ei1            X
gr_d1            (X, X, X)
c_ed1            X
co_limit1        (X, X)
gr_i2            (X, X, X)
c_ei2            X
gr_d2            (X, X, X)
c_ed2            X
```

```
co_limit2       (X, X)
gr_a1           (X, X, X)
gr_a2           (X, X, X)
gr_a3           (X, X, X)

ins             [1; 0; 0; 0; 0; 0; 0; 0; 1]
``` micro instruction wires

```
c1
c1_1            (0, 0, 0, 0, 1, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (0, 1); (0, 1); (0, 1); (1, 0)]
c1_5            [(0, 1); (1, 0); (0, 1)]
c1_6            [(1, 0); (0, 1); (0, 1); (0, 1); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]
c2
c2_1            (0, 0, 0, 0, 1, 0)
c2_2            [(0, 1); (0, 1); (1, 0); (0, 1)]
c2_3            [(0, 1); (0, 1); (0, 1); (0, 1); (1, 0)]
c2_4            [(0, 1); (0, 1); (1, 0); (0, 1); (0, 1); (0, 1)]
c2_5            [(0, 1); (1, 0); (0, 1)]
c2_6            [(0, 1); (1, 0); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
c3_2            [(1, 0); (0, 1); (0, 1); (0, 1); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 0)
``` control case 3
---------------- state, sense wires - condition 1

```
cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (1, X), (X, X))
sign1           (X, X, X, X)
sign2           (X, X, X, X)
sign3           (1, X, X, X)
gr_i1           (X, X, X)
c_ei1           X
gr_d1           (X, X, X)
c_ed1           X
co_limit1       (X, X)
```

```
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 1; 0; 0; 0; 0; 0; 0; 1]
``` state, sense wires - condition 2

```
cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (1, X), (X, X))
sign1           (X, X, X, X)
sign2           (X, X, X, X)
sign3           (1, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 0; 1; 0; 0; 0; 0; 0; 1]
``` micro instruction wires

```
c1
c1_1            (0, 0, 0, 1, 0, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (1, 0); (0, 1); (0, 1); (0, 1)]
c1_5            [(0, 1); (1, 0); (0, 1)]
c1_6            [(1, 0); (0, 1); (0, 1); (0, 1); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]

c2
c2_1            (0, 0, 0, 1, 0, 0)
c2_2            [(0, 1); (0, 1); (1, 0); (0, 1)]
c2_3            [(0, 1); (0, 1); (0, 1); (0, 1); (1, 0)]
c2_4            [(0, 1); (0, 1); (1, 0); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]
```

```
c3
c3_1            (1, 0)
c3_2            [(0, 1); (0, 1); (1, 0); (0, 1); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 0)

control case 4
--------------- state, sense wires cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (0, X), (X, X))
sign1           (X, X, X, X)
sign2           (X, X, X, X)
sign3           (1, X, X, 0)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 1; 0; 0; 0; 0; 0; 0; 1]

micro instruction wires c1
c1_1            (0, 0, 0, 1, 0, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (1, 0); (0, 1); (0, 1); (0, 1)]
c1_5            [(0, 1); (1, 0); (0, 1)]
c1_6            [(1, 0); (0, 1); (0, 1); (0, 1); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]

c2
c2_1            (0, 0, 0, 0, 1, 0)
c2_2            [(0, 1); (0, 1); (1, 0); (0, 1)]
c2_3            [(0, 1); (0, 1); (0, 1); (0, 1); (1, 0)]
c2_4            [(0, 1); (1, 0); (0, 1); (0, 1); (0, 1); (0, 1)]
c2_5            [(0, 1); (1, 0); (0, 1)]
```

```
c2_6              [(1, 0); (0, 1); (0, 1); (0, 1); (0, 1)]
c2_7              (0, [(0, 1); (1, 0)], [0; 0])
c2_8              (0, [(0, 1); (1, 0)], [0; 0; 0; 0])
c2_10             [0; 0; 0; 0; 1]

c3
c3_1              (1, 0)
c3_2              [(0, 1); (0, 1); (0, 1); (1, 0); (0, 1); (0, 1)]
c3_3              (0, [(0, 1); (1, 0)], [0; 0])
c3_4              [0; 0; 0; 0; 1]
c3_5              ([(1, 0); (0, 1)], 0)

c4                (0, 1)

c5                (0, 0, 0)

control case 5
--------------- state, sense wires - condition 1 cmp_prec          X
cmp01             (X, X)
cmp12             (X, X)
cmp23             (X, X)
cmp_exp12         (X, X)
insig1            ((X, X), (X, X), (X, X))
insig2            ((X, X), (X, X), (X, X))
insig3            ((X, X), (0, X), (X, X))
sign1             (X, X, X, X)
sign2             (1, X, X, X)
sign3             (1, X, X, 1)
gr_i1             (X, X, X)
c_ei1             X
gr_d1             (X, X, X)
c_ed1             X
co_limit1         (X, X)
gr_i2             (X, X, X)
c_ei2             X
gr_d2             (X, X, X)
c_ed2             X
co_limit2         (X, X)
gr_a1             (X, 1, X)
gr_a2             (X, X, X)
gr_a3             (X, X, X)

ins               [1; 1; 0; 0; 0; 0; 0; 0; 1]

state, sense wires - condition 2 cmp_prec          X
cmp01             (X, X)
cmp12             (X, X)
cmp23             (X, X)
cmp_exp12         (X, X)
insig1            ((X, X), (X, X), (X, X))
insig2            ((X, X), (X, X), (X, X))
insig3            ((X, X), (X, 1), (X, X))
sign1             (X, X, X, X)
sign2             (0, X, X, X)
sign3             (0, X, X, X)
```

```
gr_i1          (X, X, X)
c_ei1          X
gr_d1          (X, X, X)
c_ed1          X
co_limit1      (X, X)
gr_i2          (X, X, X)
c_ei2          X
gr_d2          (X, X, X)
c_ed2          X
co_limit2      (X, X)
gr_a1          (X, X, X)
gr_a2          (X, 1, X)
gr_a3          (X, X, X)

ins            [1; 1; 0; 0; 0; 0; 0; 0; 1]
``` state, sense wires - condition 3

```
cmp_prec       X
cmp01          (X, X)
cmp12          (X, X)
cmp23          (X, X)
cmp_exp12      (X, X)
insig1         ((X, X), (X, X), (X, X))
insig2         ((X, X), (X, X), (X, X))
insig3         ((X, X), (X, 0), (X, X))
sign1          (X, X, X, X)
sign2          (0, X, X, X)
sign3          (0, X, X, 0)
gr_i1          (X, X, X)
c_ei1          X
gr_d1          (X, X, X)
c_ed1          X
co_limit1      (X, X)
gr_i2          (X, X, X)
c_ei2          X
gr_d2          (X, X, X)
c_ed2          X
co_limit2      (X, X)
gr_a1          (X, X, X)
gr_a2          (X, 1, X)
gr_a3          (X, X, X)

ins            [1; 1; 0; 0; 0; 0; 0; 0; 1]
``` state, sense wires - condition 4

```
cmp_prec       X
cmp01          (X, X)
cmp12          (X, X)
cmp23          (X, X)
cmp_exp12      (X, X)
insig1         ((X, X), (X, X), (X, X))
insig2         ((X, X), (X, X), (X, X))
insig3         ((X, X), (0, X), (X, X))
sign1          (X, X, X, X)
sign2          (1, X, X, X)
sign3          (1, X, X, X)
gr_i1          (X, X, X)
c_ei1          X
gr_d1          (X, X, X)
c_ed1          X
co_limit1      (X, X)
```

```
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 0; 1; 0; 0; 0; 0; 0; 1]
``` state, sense wires - condition 5

```
cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, X), (X, X))
sign1           (X, X, X, X)
sign2           (0, X, X, X)
sign3           (0, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 0; 1; 0; 0; 0; 0; 0; 1]
``` micro instruction wires

```
c1
c1_1            (0, 0, 0, 0, 1, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (0, 1); (0, 1); (0, 1); (1, 0)]
c1_5            [(0, 1); (1, 0); (0, 1)]
c1_6            [(1, 0); (0, 1); (0, 1); (0, 1); (0, 1)]
c1_7            (0, [(0, 1); (1, 0)], [0; 0])
c1_8            (0, [(0, 1); (1, 0)], [0; 0; 0; 0])
c1_10           [1; 1; 1; 1; 1]

c2
c2_1            (0, 0, 0, 1, 0, 0)
c2_2            [(0, 1); (0, 1); (1, 0); (0, 1)]
c2_3            [(0, 1); (0, 1); (0, 1); (0, 1); (1, 0)]
c2_4            [(0, 1); (0, 1); (1, 0); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]
```

```
c3
c3_1              (1, 0)
c3_2              [(0, 1); (0, 1); (1, 0); (0, 1); (0, 1); (0, 1)]
c3_3              (0, [(0, 1); (1, 0)], [0; 0])
c3_4              [0; 0; 0; 0; 1]
c3_5              ([(1, 0); (0, 1)], 0)

c4                (0, 1)

c5                (0, 0, 0)

control case 6
---------------- state, sense wires - condition 1 cmp_prec          X
cmp01             (X, X)
cmp12             (X, X)
cmp23             (X, X)
cmp_exp12         (X, X)
insig1            ((X, X), (X, X), (X, X))
insig2            ((X, X), (X, X), (X, X))
insig3            ((X, X), (0, X), (X, X))
sign1             (X, X, X, X)
sign2             (0, X, X, X)
sign3             (1, X, X, 1)
gr_i1             (X, X, X)
c_ei1             X
gr_d1             (X, X, X)
c_ed1             X
co_limit1         (X, X)
gr_i2             (X, X, X)
c_ei2             X
gr_d2             (X, X, X)
c_ed2             X
co_limit2         (X, X)
gr_a1             (X, 0, X)
gr_a2             (X, X, X)
gr_a3             (X, X, X)

ins               [1; 1; 0; 0; 0; 0; 0; 0; 1]

state, sense wires - condition 2 cmp_prec          X
cmp01             (X, X)
cmp12             (X, X)
cmp23             (X, X)
cmp_exp12         (X, X)
insig1            ((X, X), (X, X), (X, X))
insig2            ((X, X), (X, X), (X, X))
insig3            ((X, X), (X, 1), (X, X))
sign1             (X, X, X, X)
sign2             (1, X, X, X)
sign3             (0, X, X, X)
gr_i1             (X, X, X)
c_ei1             X
gr_d1             (X, X, X)
c_ed1             X
co_limit1         (X, X)
gr_i2             (X, X, X)
```

```
c_ei2          X
gr_d2          (X, X, X)
c_ed2          X
co_limit2      (X, X)
gr_a1          (X, X, X)
gr_a2          (X, 0, X)
gr_a3          (X, X, X)

ins            [1; 1; 0; 0; 0; 0; 0; 0; 1]
``` state, sense wires - condition 3

```
cmp_prec       X
cmp01          (X, X)
cmp12          (X, X)
cmp23          (X, X)
cmp_exp12      (X, X)
insig1         ((X, X), (X, X), (X, X))
insig2         ((X, X), (X, X), (X, X))
insig3         ((X, X), (X, 0), (X, X))
sign1          (X, X, X, X)
sign2          (1, X, X, X)
sign3          (0, X, X, 0)
gr_i1          (X, X, X)
c_ei1          X
gr_d1          (X, X, X)
c_ed1          X
co_limit1      (X, X)
gr_i2          (X, X, X)
c_ei2          X
gr_d2          (X, X, X)
c_ed2          X
co_limit2      (X, X)
gr_a1          (X, X, X)
gr_a2          (X, 0, X)
gr_a3          (X, X, X)

ins            [1; 1; 0; 0; 0; 0; 0; 0; 1]
``` state, sense wires - condition 4

```
cmp_prec       X
cmp01          (X, X)
cmp12          (X, X)
cmp23          (X, X)
cmp_exp12      (X, X)
insig1         ((X, X), (X, X), (X, X))
insig2         ((X, X), (X, X), (X, X))
insig3         ((X, X), (0, X), (X, X))
sign1          (X, X, X, X)
sign2          (0, X, X, X)
sign3          (1, X, X, X)
gr_i1          (X, X, X)
c_ei1          X
gr_d1          (X, X, X)
c_ed1          X
co_limit1      (X, X)
gr_i2          (X, X, X)
c_ei2          X
gr_d2          (X, X, X)
c_ed2          X
co_limit2      (X, X)
gr_a1          (X, X, X)
```

```
gr_a2                  (X, X, X)
gr_a3                  (X, X, X)

ins                    [1; 0; 1; 0; 0; 0; 0; 0; 1]
``` state, sense wires - condition 5

```
cmp_prec               X
cmp01                  (X, X)
cmp12                  (X, X)
cmp23                  (X, X)
cmp_exp12              (X, X)
insig1                 ((X, X), (X, X), (X, X))
insig2                 ((X, X), (X, X), (X, X))
insig3                 ((X, X), (X, X), (X, X))
sign1                  (X, X, X, X)
sign2                  (1, X, X, X)
sign3                  (0, X, X, X)
gr_i1                  (X, X, X)
c_ei1                  X
gr_d1                  (X, X, X)
c_ed1                  X
co_limit1              (X, X)
gr_i2                  (X, X, X)
c_ei2                  X
gr_d2                  (X, X, X)
c_ed2                  X
co_limit2              (X, X)
gr_a1                  (X, X, X)
gr_a2                  (X, X, X)
gr_a3                  (X, X, X)

ins                    [1; 0; 1; 0; 0; 0; 0; 0; 1]
``` micro instruction wires

```
c1
c1_1                   (0, 0, 0, 0, 1, 0)
c1_2                   [(0, 1); (0, 1); (1, 0); (0, 1)]
c1_3                   [(0, 1); (0, 1); (0, 1); (0, 1); (1, 0)]
c1_4                   [(0, 1); (0, 1); (0, 1); (0, 1); (0, 1); (1, 0)]
c1_5                   [(0, 1); (1, 0); (0, 1)]
c1_6                   [(1, 0); (0, 1); (0, 1); (0, 1); (0, 1)]
c1_7                   (0, [(0, 1); (1, 0)], [0; 0])
c1_8                   (0, [(0, 1); (1, 0)], [0; 0; 0; 0])
c1_10                  [0; 0; 0; 0; 0]

c2
c2_1                   (0, 0, 0, 1, 0, 0)
c2_2                   [(0, 1); (0, 1); (1, 0); (0, 1)]
c2_3                   [(0, 1); (0, 1); (0, 1); (0, 1); (1, 0)]
c2_4                   [(0, 1); (0, 1); (1, 0); (0, 1); (0, 1); (0, 1)]
c2_5                   [(0, 1); (1, 0); (0, 1)]
c2_6                   [(1, 0); (0, 1); (0, 1); (0, 1); (0, 1)]
c2_7                   (0, [(0, 1); (1, 0)], [0; 0])
c2_8                   (0, [(0, 1); (1, 0)], [0; 0; 0; 0])
c2_10                  [0; 0; 0; 0; 1]

c3
c3_1                   (1, 0)
c3_2                   [(0, 1); (0, 1); (1, 0); (0, 1); (0, 1); (0, 1)]
c3_3                   (0, [(0, 1); (1, 0)], [0; 0])
```

```
c3_4            [0; 0; 0; 0; 1]
c3_5            ([(1, 0); (0, 1)], 0)

c4              (0, 1)

c5              (0, 0, 0)

control case 7
--------------- state, sense wires - condition 1 cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (0, X), (X, X))
sign1           (X, X, X, X)
sign2           (0, X, X, X)
sign3           (1, X, X, 1)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, 1, X)
gr_a2           (X, X, X)
gr_a3           (X, X, X)

ins             [1; 1; 0; 0; 0; 0; 0; 0; 1]

state, sense wires - condition 2 cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (0, X), (X, X))
sign1           (X, X, X, X)
sign2           (1, X, X, X)
sign3           (1, X, X, 1)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
```

```
gr_a1            (X, 0, X)
gr_a2            (X, X, X)
gr_a3            (X, X, X)

ins              [1; 1; 0; 0; 0; 0; 0; 0; 1]

micro instruction wires c1
c1_1             (0, 0, 0, 0, 1, 0)
c1_2             [(0, 1); (0, 1); (1, 0); (0, 1)]
c1_3             [(0, 1); (0, 1); (0, 1); (0, 1); (1, 0)]
c1_4             [(0, 1); (0, 1); (1, 0); (0, 1); (0, 1); (0, 1)]
c1_5             [(0, 1); (1, 0); (0, 1)]
c1_6             [(0, 1); (0, 1); (1, 0); (0, 1); (0, 1)]
c1_7             (0, [(0, 1); (1, 0)], [0; 0])
c1_8             (0, [(0, 1); (1, 0)], [0; 0; 0; 0])
c1_10            [0; 0; 0; 0; 1]

c2
c2_1             (0, 0, 0, 0, 1, 0)
c2_2             [(0, 1); (0, 1); (1, 0); (0, 1)]
c2_3             [(0, 1); (0, 1); (0, 1); (0, 1); (1, 0)]
c2_4             [(0, 1); (1, 0); (0, 1); (0, 1); (0, 1); (0, 1)]
c2_5             [(0, 1); (1, 0); (0, 1)]
c2_6             [(1, 0); (0, 1); (0, 1); (0, 1); (0, 1)]
c2_7             (0, [(0, 1); (1, 0)], [0; 0])
c2_8             (0, [(0, 1); (1, 0)], [0; 0; 0; 0]).
c2_10            [0; 0; 0; 0; 1]

c3
c3_1             (1, 0)
c3_2             [(0, 1); (0, 1); (0, 1); (1, 0); (0, 1); (0, 1)]
c3_3             (0, [(0, 1); (1, 0)], [0; 0])
c3_4             [0; 0; 0; 0; 1]
c3_5             ([(1, 0); (0, 1)], 0)

c4               (0, 1)

c5               (0, 0, 0)

control case 8
--------------- state, sense wires - condition 1 cmp_prec         X
cmp01            (X, X)
cmp12            (X, X)
cmp23            (X, X)
cmp_exp12        (X, X)
insig1           ((X, X), (X, X), (X, X))
insig2           ((X, X), (X, X), (X, X))
insig3           ((X, X), (X, 1), (X, X))
sign1            (X, X, X, X)
sign2            (0, X, X, X)
sign3            (0, X, X, X)
gr_i1            (X, X, X)
c_ei1            X
gr_d1            (X, X, X)
c_ed1            X
co_limit1        (X, X)
```

```
gr_i2           (X, X, X)
c_ei2           X
gr_d2           (X, X, X)
c_ed2           X
co_limit2       (X, X)
gr_a1           (X, X, X)
gr_a2           (X, 0, X)
gr_a3           (X, X, X)

ins             [1; 1; 0; 0; 0; 0; 0; 0; 1]
``` state, sense wires - condition 2

```
cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, 1), (X, X))
sign1           (X, X, X, X)
sign2           (1, X, X, X)
sign3           (0, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, 1, X)
gr_a3           (X, X, X)

ins             [1; 1; 0; 0; 0; 0; 0; 0; 1]
``` micro instruction wires

```
c1
c1_1            (0, 0, 0, 0, 1, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (1, 0); (0, 1); (0, 1); (0, 1)]
c1_5            [(0, 1); (1, 0); (0, 1)]
c1_6            [(0, 1); (0, 1); (0, 1); (1, 0); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]

c2
c2_1            (0, 0, 0, 1, 0, 0)
c2_2            [(0, 1); (0, 1); (1, 0); (0, 1)]
c2_3            [(0, 1); (0, 1); (0, 1); (0, 1); (1, 0)]
c2_4            [(0, 1); (0, 1); (1, 0); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]
```

```
c3
c3_1           (1, 0)
c3_2           [(0, 1); (0, 1); (1, 0); (0, 1); (0, 1); (0, 1)]
c3_3           (0, [(0, 1); (1, 0)], [0; 0])
c3_4           [0; 0; 0; 0; 1]
c3_5           ([(1, 0); (0, 1)], 0)

c4             (0, 1)

c5             (0, 0, 0)
``` control case 9
--------------- state, sense wires

```
cmp_prec       X
cmp01          (X, X)
cmp12          (X, X)
cmp23          (X, X)
cmp_exp12      (X, X)
insig1         ((X, X), (X, X), (X, X))
insig2         ((X, X), (X, X), (X, X))
insig3         ((X, X), (X, 0), (X, X))
sign1          (X, X, X, X)
sign2          (X, X, X, X)
sign3          (0, X, X, 1)
gr_i1          (X, X, X)
c_ei1          X
gr_d1          (X, X, X)
c_ed1          X
co_limit1      (X, X)
gr_i2          (X, X, X)
c_ei2          X
gr_d2          (X, X, X)
c_ed2          X
co_limit2      (X, X)
gr_a1          (X, X, X)
gr_a2          (X, X, X)
gr_a3          (X, X, X)

ins            [1; 1; 0; 0; 0; 0; 0; 0; 1]
``` micro instruction wires

```
c1
c1_1           (0, 0, 0, 1, 0, 0)
c1_2           [(0, 1); (0, 1); (1, 0); (0, 1)]
c1_3           [(0, 1); (0, 1); (0, 1); (0, 1); (1, 0)]
c1_4           [(0, 1); (0, 1); (1, 0); (0, 1); (0, 1); (0, 1)]
c1_5           [(0, 1); (1, 0); (0, 1)]
c1_6           [(1, 0); (0, 1); (0, 1); (0, 1); (0, 1)]
c1_7           (0, [(0, 1); (1, 0)], [0; 0])
c1_8           (0, [(0, 1); (1, 0)], [0; 0; 0; 0])
c1_10          [0; 0; 0; 0; 1]

c2
c2_1           (0, 0, 0, 0, 1, 0)
c2_2           [(0, 1); (0, 1); (1, 0); (0, 1)]
c2_3           [(0, 1); (0, 1); (0, 1); (0, 1); (1, 0)]
c2_4           [(0, 1); (1, 0); (0, 1); (0, 1); (0, 1); (0, 1)]
```

```
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
c3_2            [(0, 1); (0, 1); (0, 1); (1, 0); (0, 1); (0, 1)]
c3_3            (0, [(0, 1); (1, 0)], [1; 1])
c3_4            [0; 0; 0; 0; 1]
c3_5            ([(1, 0); (0, 1)], 0)

c4              (0, 1)

c5              (0, 0, 0)

control case 10
--------------- state, sense wires - condition 1 cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, 0), (X, X))
sign1           (X, X, X, X)
sign2           (0, X, X, X)
sign3           (0, X, X, 0)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, 0, X)
gr_a3           (X, X, X)

ins             [1; 1; 0; 0; 0; 0; 0; 0; 1]

state, sense wires - condition 2 cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, 0), (X, X))
sign1           (X, X, X, X)
sign2           (1, X, X, X)
```

| | |
|---|---|
| sign3 | (0, X, X, 0) |
| gr_i1 | (X, X, X) |
| c_ei1 | X |
| gr_d1 | (X, X, X) |
| c_ed1 | X |
| co_limit1 | (X, X) |
| gr_i2 | (X, X, X) |
| c_ei2 | X |
| gr_d2 | (X, X, X) |
| c_ed2 | X |
| co_limit2 | (X, X) |
| gr_a1 | (X, X, X) |
| gr_a2 | (X, 1, X) |
| gr_a3 | (X, X, X) |
| | |
| ins | [1; 1; 0; 0; 0; 0; 0; 0; 1] | micro instruction wires

| | |
|---|---|
| c1 | |
| c1_1 | (0, 0, 0, 0, 1, 0) |
| c1_2 | [(0, 1); (0, 1); (1, 0); (0, 1)] |
| c1_3 | [(0, 1); (0, 1); (0, 1); (0, 1); (1, 0)] |
| c1_4 | [(0, 1); (0, 1); (1, 0); (0, 1); (0, 1); (0, 1)] |
| c1_5 | [(0, 1); (1, 0); (0, 1)] |
| c1_6 | [(0, 1); (0, 1); (0, 1); (1, 0); (0, 1)] |
| c1_7 | (0, [(0, 1); (1, 0)], [0; 0]) |
| c1_8 | (0, [(0, 1); (1, 0)], [0; 0; 0; 0]) |
| c1_10 | [0; 0; 0; 0; 1] |
| | |
| c2 | |
| c2_1 | (0, 0, 0, 0, 1, 0) |
| c2_2 | [(0, 1); (0, 1); (1, 0); (0, 1)] |
| c2_3 | [(0, 1); (0, 1); (0, 1); (0, 1); (1, 0)] |
| c2_4 | [(0, 1); (1, 0); (0, 1); (0, 1); (0, 1); (0, 1)] |
| c2_5 | [(0, 1); (1, 0); (0, 1)] |
| c2_6 | [(1, 0); (0, 1); (0, 1); (0, 1); (0, 1)] |
| c2_7 | (0, [(0, 1); (1, 0)], [0; 0]) |
| c2_8 | (0, [(0, 1); (1, 0)], [0; 0; 0; 0]) |
| c2_10 | [0; 0; 0; 0; 1] |
| | |
| c3 | |
| c3_1 | (1, 0) |
| c3_2 | [(0, 1); (0, 1); (0, 1); (1, 0); (0, 1); (0, 1)] |
| c3_3 | (0, [(0, 1); (1, 0)], [1; 1]) |
| c3_4 | [0; 0; 0; 0; 1] |
| c3_5 | ([(1, 0); (0, 1)], 0) |
| | |
| c4 | (0, 1) |
| | |
| c5 | (0, 0, 0) |

We claim:

1. A method to perform arithmetical, logical and related operations on numerical value elements on a numerical arithmetic logic unit, comprising the following steps:
   a) providing an input list as a predetermined number of digital words of a predetermined bit length on a predetermined number of input/output buses, said input list comprising said numerical value elements to be processed, and instruction information indicating the kind of said operation to be made,
   b) clocking at least said digital words in said list comprising numerical value elements to be processed through at least one buffer onto a predetermined number of input buses and then through a network of controllable arithmetical, logical and related circuits to which said input buses are connected,
   c) controlling said circuits through an arithmetic logic unit control drive and performing an operation on said numerical value elements on said input list making use of said operation information, all operations on said numerical values being performed without temporarily storing of any of said numerical values, thus performing operations by rewriting and combinating at least said digital words to be processed,
   d) presenting the result as an output list on a predetermined number of output buses, said output list having the same format as said input list, said predetermined number of output buses being connected, through said buffer, to said predetermined number of input/output buses, and
   e) recycling, if needed, said result output list to said input list until an eventual result is obtained, each cycle of a multicycle operation being influenced only by the output of a result of a next preceding cycle presented on said output buses, which output result then becomes, by clocking said output list on said input/output buses through said buffer and onto said connected input buses, the input list to be further processed.

2. A method according to claim 1, wherein said lists comprises a function application in which one of its elements is an instruction code and the rest are arguments to said instruction, and an instruction is performed by rewriting and recycling said instruction code from said result output list to said input list until and eventual result is reached.

3. A method according to claim 1, wherein at each rewriting said list is rewritten to include a revised instruction code word, if appropriate for the actual calculation, followed by value words.

4. A method according to claim 1, wherein at a rewriting directly to the result the value is placed on the output list without any instruction code.

5. A method according to claim 1 wherein the maximum number of elements in said input list and output list are four.

6. A method according to claim 1, wherein said numerical value words are provided in a coded form before actual processing.

7. A method according to claim 1, wherein said words representing numerical values are provided with a coding achieving a dense representation of said numerical values, i.e. every coded representation of a value corresponds to only one numerical value.

8. A method according to claim 7, wherein said dense representation is provided by including a virtual "1", i.e. a "1" not provided physically in the representation, in front of a field of the word for the mantissa part of the floating-point value representation.

9. A method according to claim 7, wherein said values are coded in the following way:
   a) the representation of the value includes a bit string, in which every bit is either "0" or "1" and is binary coded starting with the numerical value zero,
   b) a floating-point value having a higher representation than another floating-point value has a value higher than the said other value,
   c) said representation of a floating-point value includes a sign bit for the total of said floating-point value, a sign bit of the exponent of the floating-point value, a code stating the length of said exponent, said exponent having a variable length, and a mantissa having a variable length, the combined length of said representation being a constant.

10. A method according to claim 9, wherein said representation having a "1" as its most significant bit followed by "0":s represents a particular floating-point value "0".

11. A method according to claim 10, wherein all representations not representing the particular floating-point value "0" have a value corresponding to $2^{e+bias*}$·mantissa, where e is the value of said exponent in said representation for positive floating-point values being higher or equal to 1.0, for negative floating-point values being lower than $-1.0$ and where the exponent for floating-point values between 1.0 and $-1.0$ is inverted, and wherein, for representations not representing the particular floating-point value "0", said mantissas vary between $-1$ and $-2$ for representations having a negative sign, i.e. representing a negative number, and between $+1$ and $+2$ for representations having positive sign, i.e. representing a positive number.

12. A method according to claim 9, wherein the following operations are provided for addition/subtraction of a first floating-point value A and a second floating-point value B: alignment of said value A to said value B and increase/decrease a precision of its mantissa, if said value A has a smaller exponent than said value B, alignment of said value B to said value A and increase/decrease a precision of its mantissa, if said value B has a smaller exponent than said value A, addition/subtraction of said values being aligned to each other, normalizing the result of said addition/subtraction.

13. A method according to claim 12, wherein said operations at addition/subtraction are parallely computed at each addition/subtraction operation stage and that the operation is chosen among said parallely computed operations which is due for the actual addition/subtraction operation stage.

14. A method according to claim 7, wherein at addition/subtraction of a first floating-point value A and a second floating-point value B, the following operations are provided: alignment of said value A to said value B, if said value A has a smaller exponent than said value B, alignment of said value B to said value A, if said value B has a smaller exponent than said value A, addition/subtraction of said values being aligned to each other, normalizing the result of said addition/subtraction.

15. A method according to claim 14, wherein said operations at addition/subtraction are parallely computed at each addition/subtraction operation stage and that the operation is chosen among said parallely computed operations which is due for the actual addition/- subtraction operation stage.

16. A method according to claim 6, wherein a multiplication between two floating-point values B and C is made by rewriting the multiplication to $0.0 + B^*C = V$, where V is a constant value, which is rewritten during several stages having an intermediate value $A + B_1^*C_1 = V$, where A being the next preceding value V, and the exponent for said value $C_1$ is adjusted by additions/subtractions such that the exponent of said value $B_1$ eventually becomes "0", the exponent in the eventual result will be the eventual exponent of the value $C_1$.

17. A method according to claim 1, wherein a first coding is provided on a binary word representing an integer value.

18. A method according to claim 1, wherein a second coding is provided on a binary word representing a floating-point value.

19. A method according to claim 1, wherein a first coding is provided on a binary word representing an integer value and a second coding on a binary word representing a floating-point value, and wherein said codings being such that after coding the numerical value of the floating-point value representations increases in the same order as the numerical value of the integer value representations.

20. A method according to claim 1, wherein a binary coded floating-point value representation includes a code field, an exponent field and a mantissa field, said code field having an indication of a division position between said exponent field and said mantissa field, such that the exponent and mantissa fields have variable lengths.

21. A method according to claim 1, wherein an instruction is performed by a parallel computation of a number of possible combinations of said values to be used as intermediate stages in the eventual computed value, chosing one of said computed intermediate stages to be further processed, if needed, to provide an eventual result.

22. A numerical arithmetic unit to perform arithmetical, logical and related operations on numerical value elements, comprising:
  a) an input comprising a set of buses, each bus being operative to be provided with a list element in an input list, said list including said numerical value elements to be processed, and instruction information indicating the kind of said operation to be made, each numerical value element representing a digital word having a predetermined bit length, at least part of said instruction information being represented as a digital word,
  b) a processing device comprising a network of controllable rearranging, monitoring, decoding and computing circuits, to which processing device said set of buses are connected, adapted to perform said operation indicated by said instruction information in said list by directly controlling, through a control drive means, said circuits and performing said operation on said numerical value elements on said input list making use of said instruction information, said computing circuits being adapted to perform a specific operation on said numerical value representations on said input buses, thereby providing the results of said operations in parallel, thus performing said operation by rewriting and combining at least said digital words to be operated,
  c) an output comprising a set output buses, onto which output buses said rewritten result is clocked, said output buses being of the same number and configuration as said input buses, and
  d) checking means in said processing device checking if a final result has been reached and providing a transfer, if needed, of the list on said output buses to said input buses for recycling said list through said processing device as long as a final result has not been reached, said transfer and final result being achieved without resorting to any storage in memory of intermediate results.

23. A numerical arithmetic unit according to claim 22, wherein a control drive means provided with said instruction information is adapted to choose at least one of the performed results among all the performed results adequate for the execution of the actual instruction to execute.

24. A numerical arithmetic unit according to claim 23, wherein said list is adapted to include a function application in which one of its elements is an instruction code and the rest are arguments to said instruction, said processing means performing an instruction by rewriting and recycling said instruction code from said output to said input until and eventual result is reached, wherein at each rewriting said processing means is adapted to rewrite said list to include a revised instruction code word, if appropriate for the actual calculation, followed by value words if appropriate.

25. A numerical arithmetic unit according to claim 23, further comprising means to provide said representations of numerical value words to said arithmetic unit in a coded form before actual processing, and means to provide said control drive means with information regarding the actual kind of coding of said representations.

26. A numerical arithmetic unit according to claim 25, wherein said processing device is adapted to use codings presenting said numerical values into a dense representation, i.e. every coded representation of a value corresponds to only one interpreted value.

27. A numerical arithmetic unit according to claim 25, wherein said processing device is adapted to use a first kind of coding on a binary word representing an integer representation.

28. A numerical arithmetic unit according to claim 25, wherein said processing device is adapted to use a second kind of coding on a binary word representing a floating-point representation.

29. A numerical arithmetic unit according to claim 28, wherein a binary coded floating-point value representation includes a sign, exponent sign and code field, an exponent field and a mantissa field, said exponent sign and code field having an indication on a division position between said exponent field and said mantissa field, such that the exponent and mantissa fields have variable lengths.

30. A numerical arithmetic unit according to claim 29, wherein said representations of numerical values are divided into bit groups, called precision groups, each having a predetermined number of bits, a partition between an exponent part and a mantissa part of said representation, when said representation is representing a floating-point value, being made between two precision groups.

31. A numerical arithmetic unit according to claim 29, wherein information of said representation of said floating-point value is given in a code field of variable code length.

32. A numerical arithmetic unit according to claim 25, wherein said processing device is adapted to use a first coding on a binary word representing an integer representation and a second coding on a binary word representing a floating-point representation, and wherein said codings being such that after coding floating-point representations are provided in the same order as integer representations.

33. A numerical arithmetic unit according to claim 32, wherein said words representing numerical value words are provided with a coding providing said numerical values into a dense representation, i.e. every coded representation of a value corresponds to only one interpreted value.

34. A numerical arithmetic unit according to claim 33, wherein said dense representation is provided by including a virtual "1", i.e. a "1" not provided physically in the representation, in front of a field of the word for the mantissa part of the floating-point value.

35. A numerical arithmetic unit according to claim 23, wherein at least one operand unit is provided having inputs, to which at least two of said numerical value words and numerical value word results from among said operation performing circuits having outputs adapted for further prosecution to a resultant output value of the unit are provided, said operand unit being controlled by said control drive means to further processing of data on said operand unit inputs to rewrite said numerical value words.

36. A numerical arithmetic unit according to claim 35, wherein said control drive means provides at least a first operation phase interval and an output operation phase interval during one data transfer internal in said unit from said input to said output, and wherein possible carry signals from elements in said operand circuit being controlled during said first operation phase interval is fed to said control drive means, which control outputs are changed by said possible carry signals before said output phase interval, during which internal elements in said operand circuit having access to outputs from said elements are controlled.

37. A numerical arithmetic unit according to claim 23, wherein outputs of said operation performing circuits are fed to inputs of said control drive means to be processed in said control drive means together with said instruction information to form digital control signals for controlling at least one operand unit.

38. A numerical arithmetic unit according to claim 23, wherein said control drive means is a Boolean gate array.

39. A numerical arithmetic unit according to claim 23, wherein the maximum length of said input list and output list are four elements provided on a bus each.

40. A numerical arithmetic unit according to claim 23, wherein said representations of numerical values are divided into bit groups, called precision groups, each having a predetermined number of bits, a partition between an exponent part and a mantissa part of said representation, when it is representing a floating-point value being made between two precision groups; and wherein at least one precision decoder is adapted to have at least a part of said representation on its input providing information of said exponent/mantissa partition and providing control outputs due to said partition to elements making operations on floating-point values.

41. A numerical arithmetic unit according to claim 40, wherein the number of precision decoders are two.

42. A numerical arithmetic unit according to claim 40, wherein the number of said precision groups are eight for a representation having thirty-two bits.

* * * * *

UNITED STATES PATENT AND TRADEMARK OFFICE
CERTIFICATE OF CORRECTION

PATENT NO. : 5,241,491
DATED : August 31, 1993
INVENTOR(S) : Lars Gunnar Carlstedt It is certified that error appears in the above-indentified patent and that said Letters Patent is hereby corrected as shown below:

On the Title page, item [75], change the name of the inventor from "Lars C. Carlstedt" to --Lars G. Carlstedt--.

Signed and Sealed this

Twenty-eighth Day of June, 1994

Attest:

BRUCE LEHMAN

*Attesting Officer*  *Commissioner of Patents and Trademarks*